(12) United States Patent
Or-Bach et al.

(10) Patent No.: US 10,515,935 B2
(45) Date of Patent: Dec. 24, 2019

(54) 3D SEMICONDUCTOR DEVICE AND STRUCTURE

(71) Applicant: Monolithic 3D Inc., San Jose, CA (US)

(72) Inventors: Zvi Or-Bach, San Jose, CA (US); Brian Cronquist, Klamath Falls, OR (US)

(73) Assignee: MONOLITHIC 3D INC., San Jose, CA (US)

( * ) Notice: Subject to any disclaimer, the term of this patent is extended or adjusted under 35 U.S.C. 154(b) by 0 days.

(21) Appl. No.: 16/409,840

(22) Filed: May 12, 2019

(65) Prior Publication Data

US 2019/0273069 A1    Sep. 5, 2019

Related U.S. Application Data

(63) Continuation-in-part of application No. 15/990,684, filed on May 28, 2018, now Pat. No. 10,297,580, (Continued)

(51) Int. Cl.
*H01L 25/065* (2006.01)
*H01L 23/00* (2006.01)
(Continued)

(52) U.S. Cl.
CPC ........ *H01L 25/0657* (2013.01); *H01L 21/743* (2013.01); *H01L 21/76898* (2013.01); *H01L 23/481* (2013.01); *H01L 23/485* (2013.01); *H01L 23/522* (2013.01); *H01L 24/25* (2013.01); *H01L 25/50* (2013.01); *H01L 27/0688* (2013.01); *H01L 27/088* (2013.01); *H01L 29/66621* (2013.01); *H01L 27/092* (2013.01); *H01L 29/4236* (2013.01); *H01L 29/78* (2013.01); *H01L 2224/24146* (2013.01); *H01L 2225/06544* (2013.01); *H01L 2225/06589* (2013.01); *H01L 2924/0002* (2013.01);
(Continued)

(58) Field of Classification Search
CPC .................................................. H01L 25/0657
See application file for complete search history.

(56) References Cited

U.S. PATENT DOCUMENTS 5,835,396 A * 11/1998 Zhang .................... G11C 17/12
365/51
5,986,299 A * 11/1999 Nakamura ............ H01L 21/768
257/296
(Continued)

*Primary Examiner* — William A Harriston
(74) *Attorney, Agent, or Firm* — Tran & Associates

(57) ABSTRACT

A 3D semiconductor device, the device including: a first single crystal layer; at least one first metal layer above the first single crystal layer; a second metal layer above the first metal layer; a plurality of first transistors atop the second metal layer; a plurality of second transistors atop the second transistors; a plurality of third transistors atop the second transistors; a third metal layer above the plurality of third transistors: a fourth metal layer above the third metal layer; and a second single crystal layer above the fourth metal layer; and a plurality of connecting metal paths from the fourth metal layer to the second metal layer, where at least one of the plurality of third transistors is aligned to at least one of the plurality of first transistors with less than 40 nm alignment error, where the fourth metal layer is providing global power distribution to the device.

20 Claims, 57 Drawing Sheets

Related U.S. Application Data which is a continuation-in-part of application No. 15/721,955, filed on Oct. 1, 2017, now Pat. No. 10,014,282, which is a continuation-in-part of application No. 15/008,444, filed on Jan. 28, 2016, now Pat. No. 9,786,636, which is a continuation-in-part of application No. 14/541,452, filed on Nov. 14, 2014, now Pat. No. 9,252,134, which is a continuation of application No. 14/198,041, filed on Mar. 5, 2014, now Pat. No. 8,921,970, which is a continuation of application No. 13/726,091, filed on Dec. 22, 2012, now Pat. No. 8,674,470.

(51) Int. Cl.

| | | |
|---|---|---|
| *H01L 27/088* | (2006.01) | |
| *H01L 21/768* | (2006.01) | |
| *H01L 23/48* | (2006.01) | |
| *H01L 23/485* | (2006.01) | |
| *H01L 23/522* | (2006.01) | |
| *H01L 27/06* | (2006.01) | |
| *H01L 29/66* | (2006.01) | |
| *H01L 21/74* | (2006.01) | |
| *H01L 25/00* | (2006.01) | |
| *H01L 27/092* | (2006.01) | |
| *H01L 29/423* | (2006.01) | |
| *H01L 29/78* | (2006.01) | |

(52) U.S. Cl.
CPC ......... *H01L 2924/01104* (2013.01); *H01L 2924/12032* (2013.01); *H01L 2924/12042* (2013.01); *H01L 2924/13091* (2013.01); *H01L 2924/2064* (2013.01); *H01L 2924/351* (2013.01)

(56) References Cited

U.S. PATENT DOCUMENTS

| | | | |
|---|---|---|---|
| 6,190,957 B1 * | 2/2001 | Mochizuki | H01L 21/76895 257/E21.009 |
| 6,429,484 B1 * | 8/2002 | Yu | H01L 21/8221 257/347 |
| 8,563,403 B1 * | 10/2013 | Farooq | H01L 21/76898 438/459 |
| 9,559,040 B2 * | 1/2017 | Batra | H01L 24/24 |
| 9,729,148 B2 * | 8/2017 | Tamura | H03K 19/0008 |
| 2002/0025604 A1 * | 2/2002 | Tiwari | H01L 21/76254 438/118 |
| 2003/0067043 A1 * | 4/2003 | Zhang | G11C 7/18 257/390 |
| 2007/0076509 A1 * | 4/2007 | Zhang | G11C 5/063 365/230.03 |
| 2008/0191247 A1 * | 8/2008 | Yin | H01L 21/8221 257/204 |
| 2009/0079000 A1 * | 3/2009 | Yamazaki | H01L 27/1229 257/351 |
| 2011/0227158 A1 * | 9/2011 | Zhu | H01L 23/481 257/347 |

\* cited by examiner

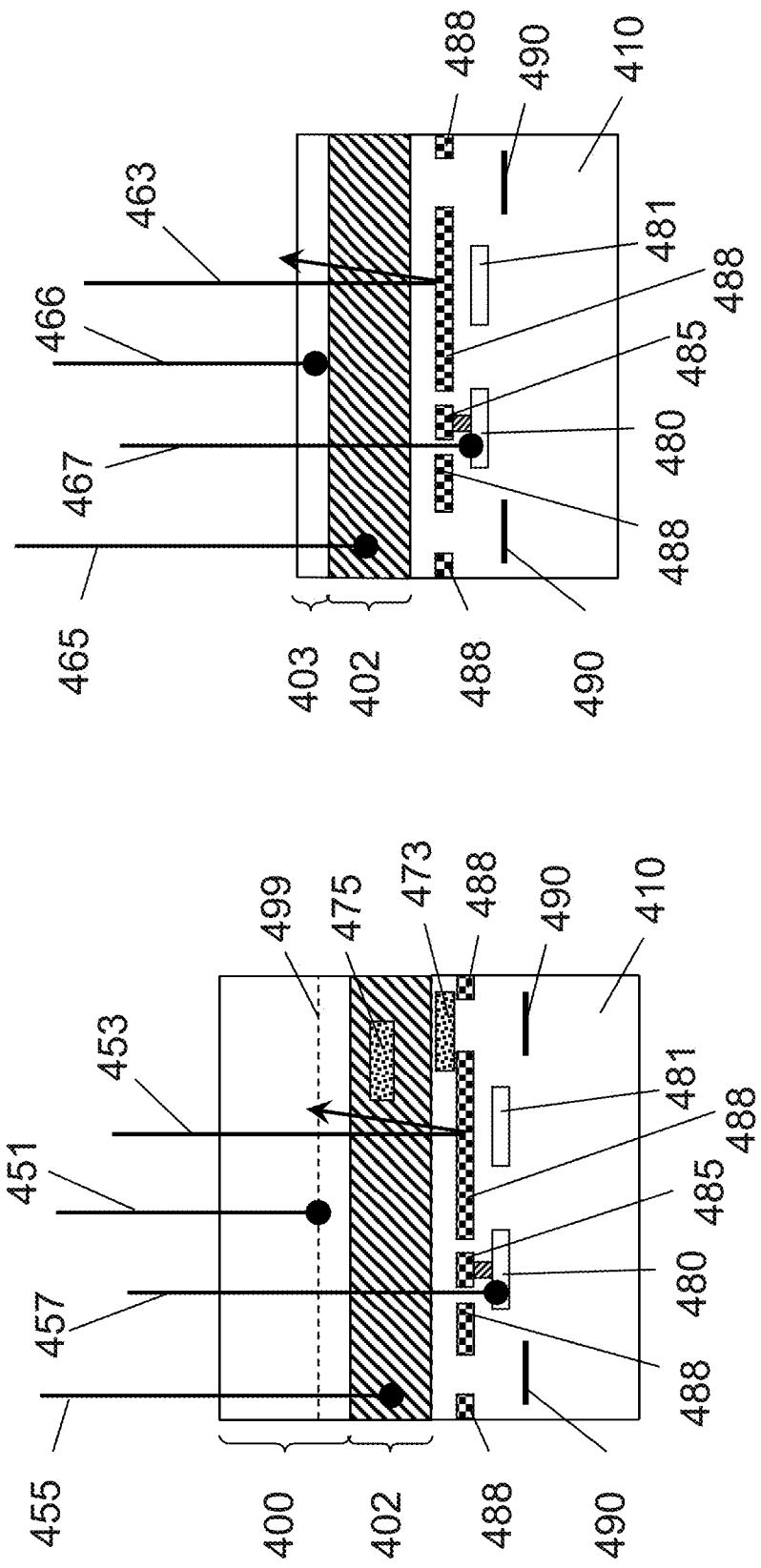

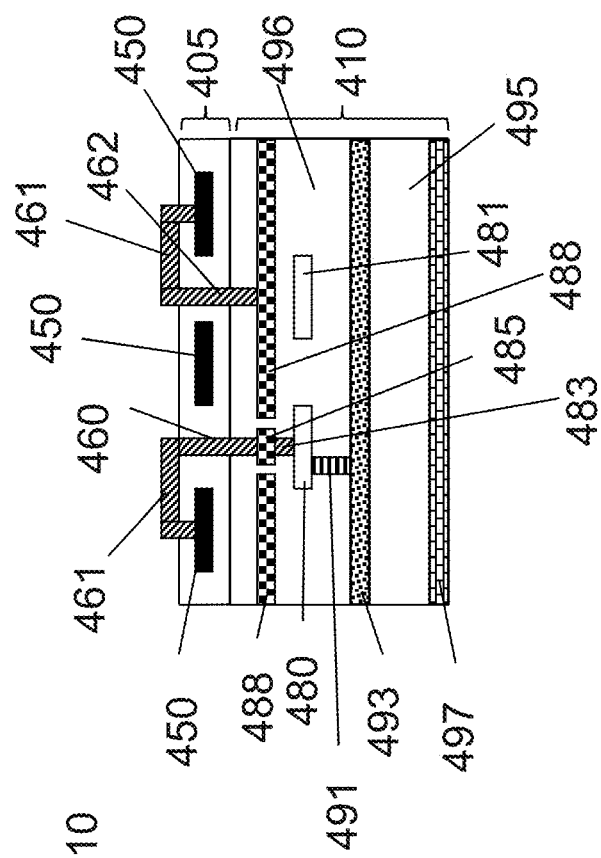
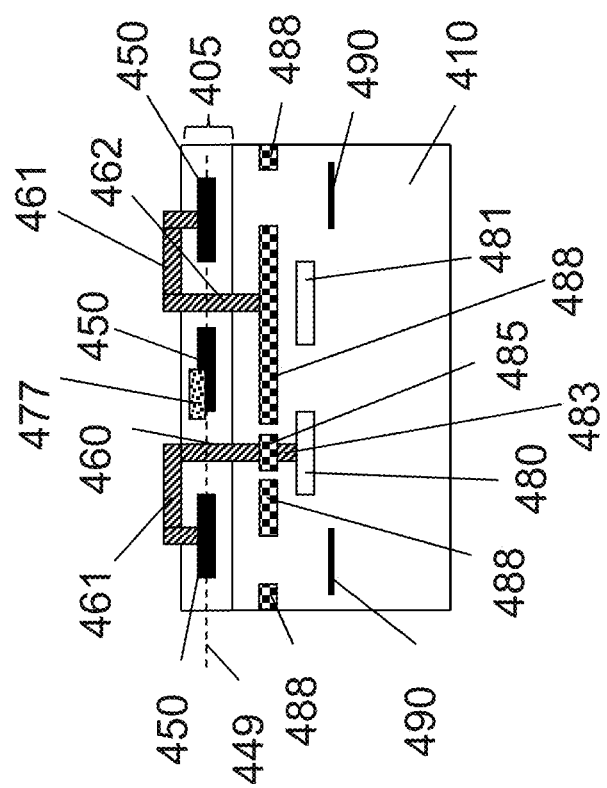
FIG. 4E
FIG. 4F

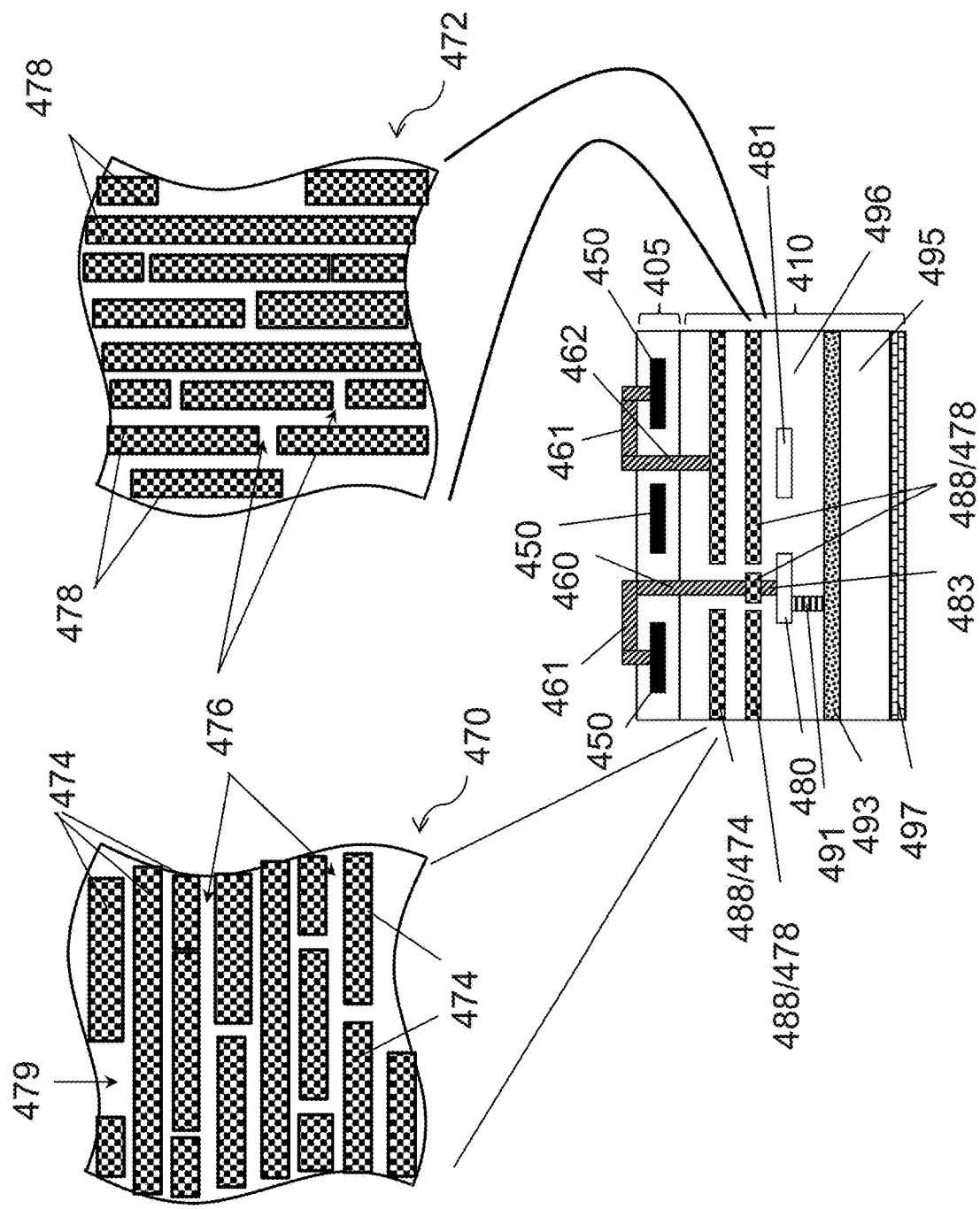

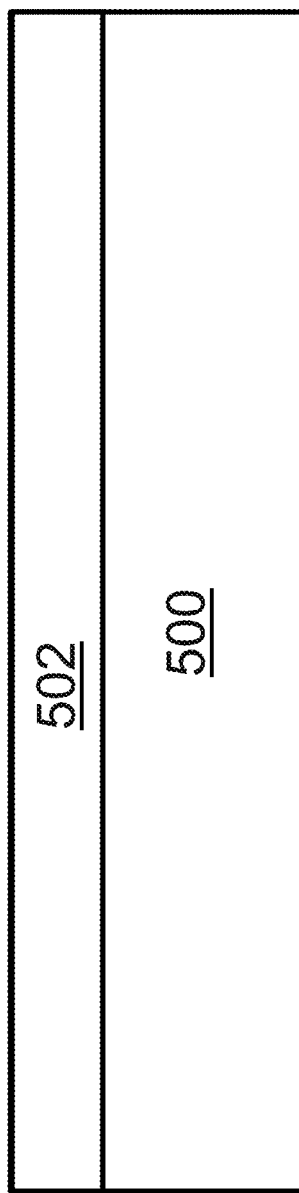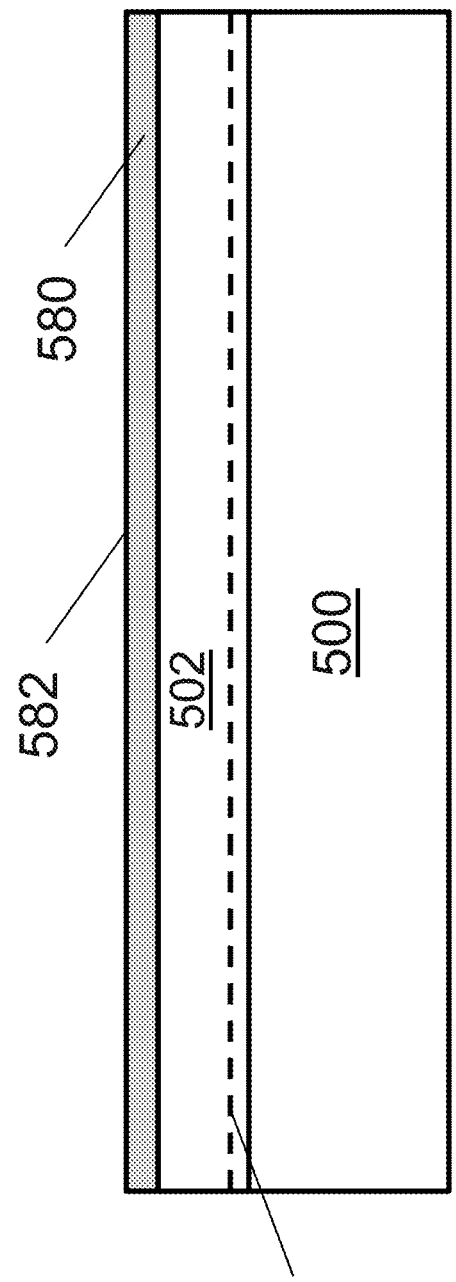

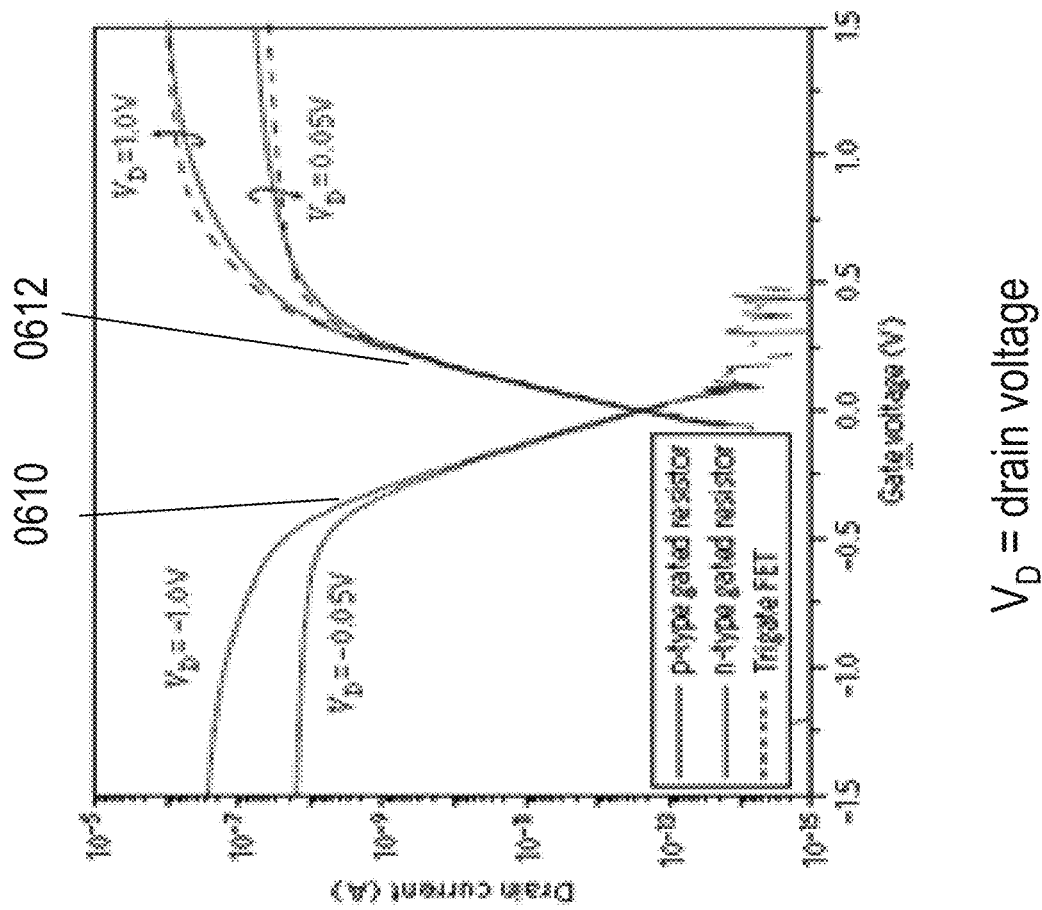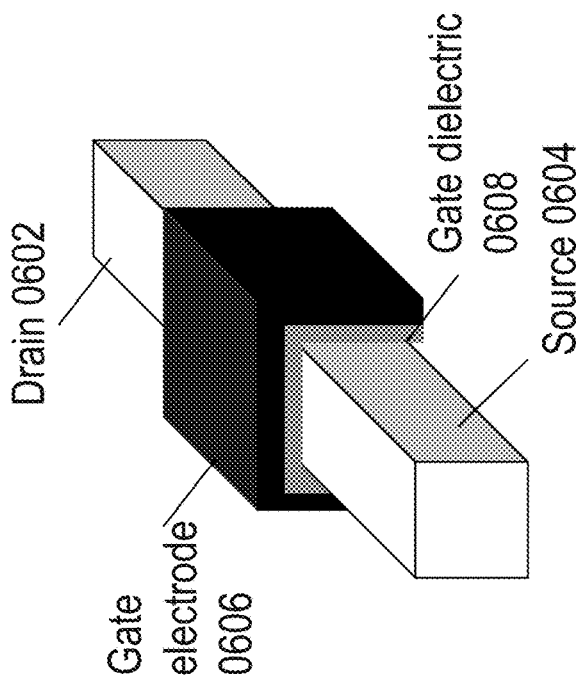
$V_D$ = drain voltage
Fig. 6
Doping does not change between silicon region forming source, drain and region under gate. Every region contains heavily doped silicon.

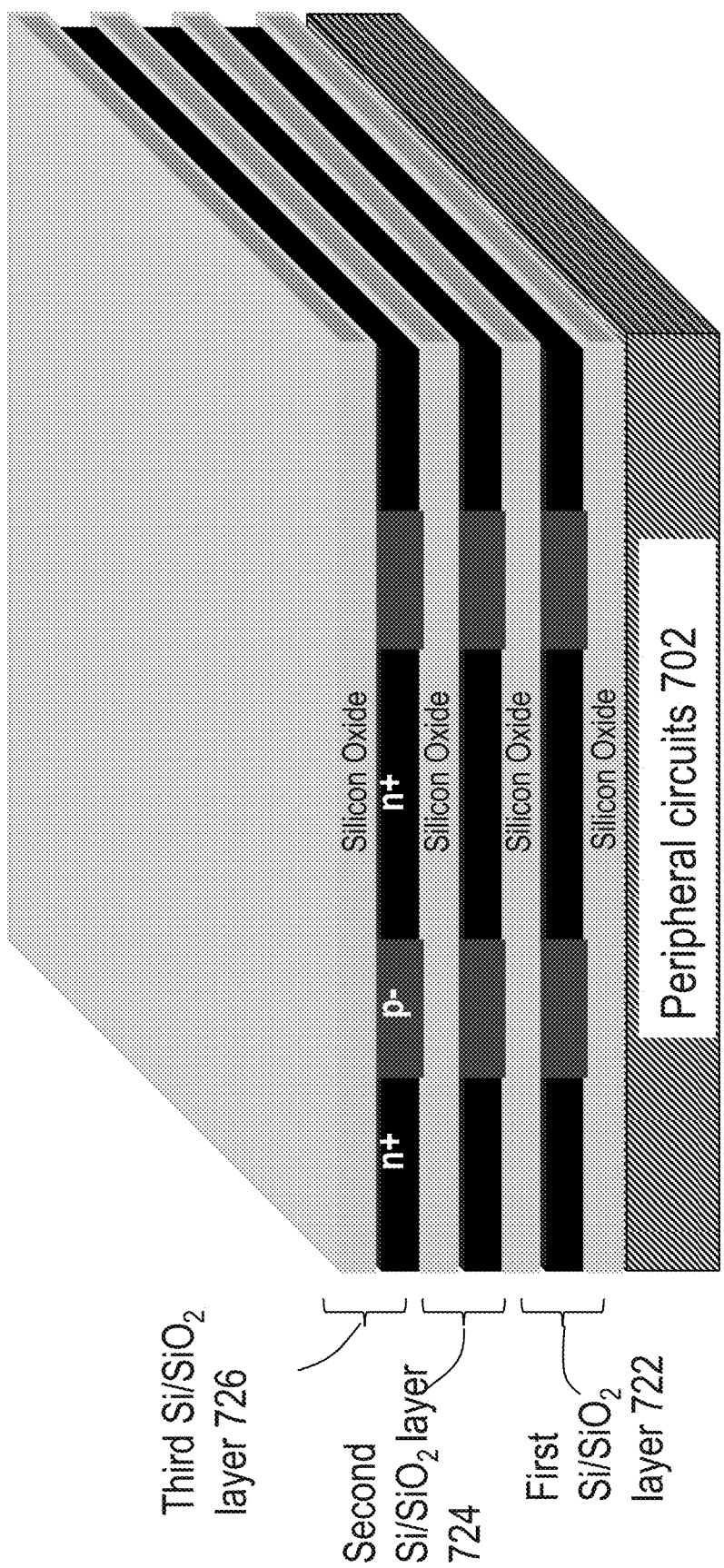

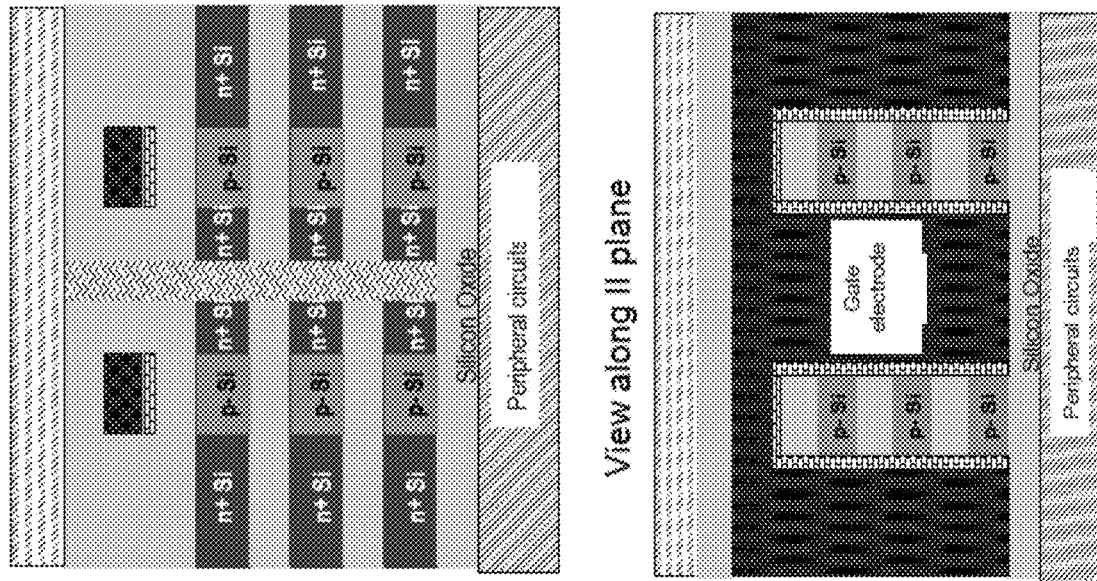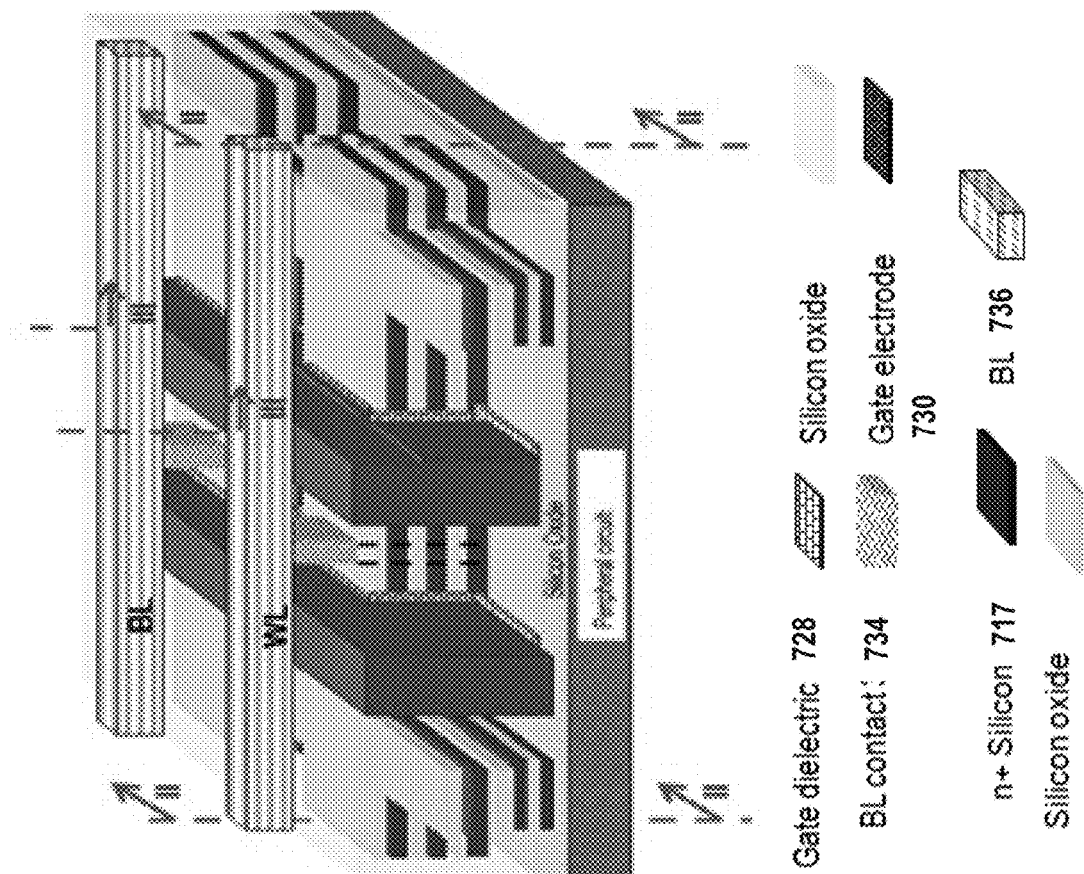
Fig. 7L

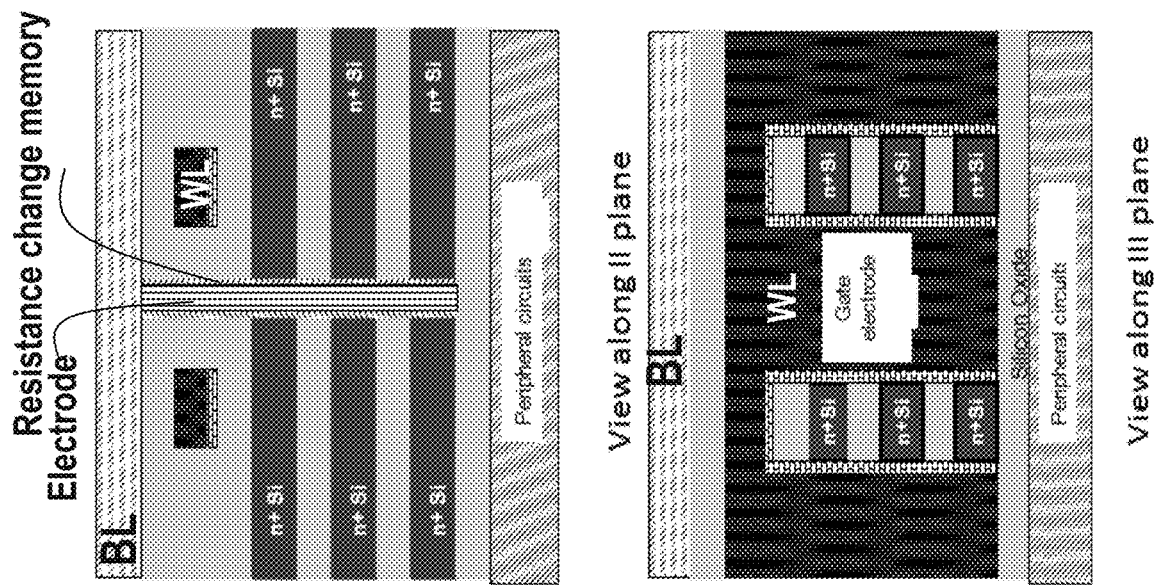
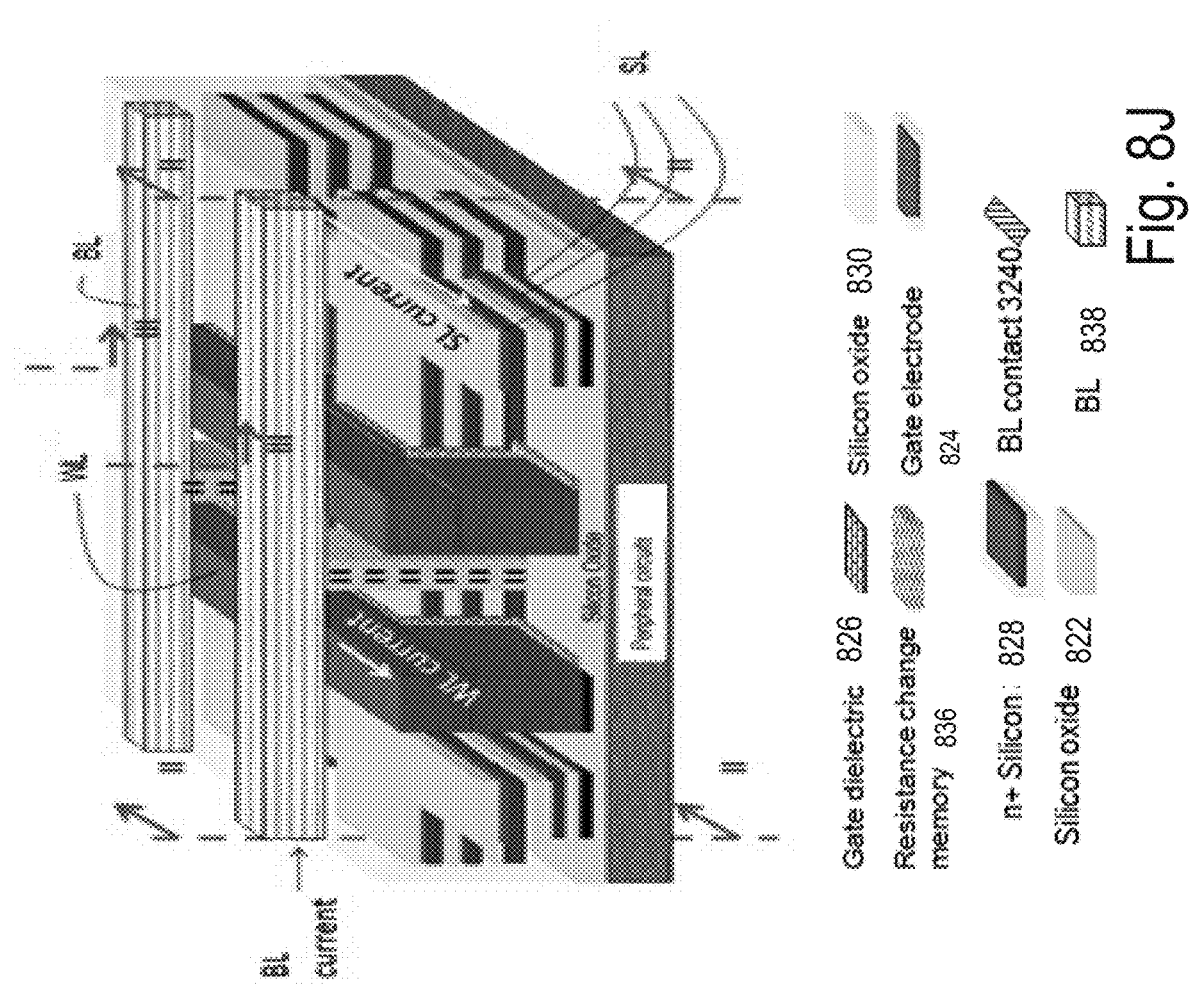
Fig. 8J

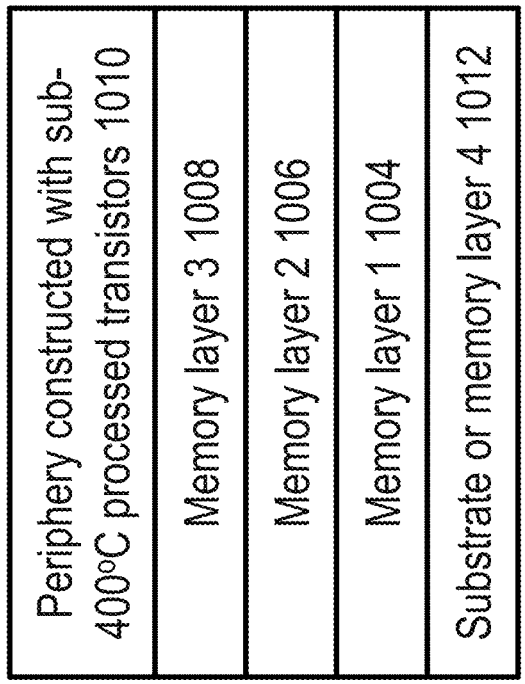
Fig. 10B: Periphery-on-top architecture
An alternative
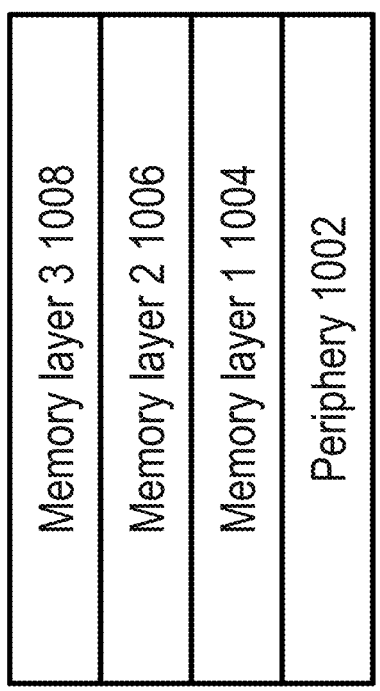
Fig. 10A: Periphery-on-bottom architecture
Used for Fig. 7-9

3D SEMICONDUCTOR DEVICE AND STRUCTURE

This application is a continuation-in-part of U.S. patent application Ser. No. 15/990,684, filed on Jan. 28, 2016, which is a continuation-in-part of U.S. patent application Ser. No. 15/721,955, filed on Oct. 1, 2017, now U.S. Pat. No. 10,014,282 issued on Jul. 3, 2018, which is a continuation-in-part of U.S. patent application Ser. No. 15/008,444, filed on Jan. 28, 2016, now U.S. Pat. No. 9,786,636 issued on Oct. 10, 2017, which is a continuation-in-part of U.S. patent application Ser. No. 14/541,452, filed on Nov. 14, 2014, now U.S. Pat. No. 9,252,134 issued on Feb. 2, 2016, which is a continuation of U.S. patent application Ser. No. 14/198,041, filed on Mar. 5, 2014, now U.S. Pat. No. 8,921,970 issued on Dec. 30, 2014, which is a continuation of U.S. patent application Ser. No. 13/726,091, filed on Dec. 22, 2012, now U.S. Pat. No. 8,674,470 issued on Mar. 18, 2014. The contents of the foregoing applications are incorporated herein by reference.

BACKGROUND OF THE INVENTION

1. Field of the Invention

This application relates to the general field of Integrated Circuit (IC) devices and fabrication methods, and more particularly to multilayer or Three Dimensional Integrated Circuit (3D-IC) devices and fabrication methods.

2. Discussion of Background Art

Over the past 40 years, there has been a dramatic increase in functionality and performance of Integrated Circuits (ICs). This has largely been due to the phenomenon of "scaling"; i.e., component sizes within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate the performance, functionality and power consumption of ICs.

3D stacking of semiconductor devices or chips is one avenue to tackle the wire issues. By arranging transistors in 3 dimensions instead of 2 dimensions (as was the case in the 1990s), the transistors in ICs can be placed closer to each other. This reduces wire lengths and keeps wiring delay low.

There are many techniques to construct 3D stacked integrated circuits or chips including:

Monolithic 3D technology: With this approach, multiple layers of transistors and wires can be monolithically constructed. Some monolithic 3D and 3DIC approaches are described in U.S. Pat. Nos. 8,273,610, 8,298,875, 8,362,482, 8,378,715, 8,379,458, 8,450, 804, 8,557,632, 8,574,929, 8,581,349, 8,642,416, 8,669,778, 8,674,470, 8,687,399, 8,742,476, 8,803, 206, 8,836,073, 8,902,663, 8,994,404, 9,023,688, 9,029,173, 9,030,858, 9,117,749, 9,142,553, 9,219, 005, 9,385,058, 9,406,670, 9,460,978, 9,509,313, 9,640,531, 9,691,760, 9,711,407, 9,721,927, 9,799, 761, 9,871,034, 9,953,870, 9,953,994, 10,014,292, 10,014,318; and pending U.S. Patent Application Publications and applications, Ser. Nos. 14/642,724, 15/150,395, 15/173,686, 62/651,722; 62/681,249, 62/713,345, 62/770,751; and PCT Applications (and Publications): PCT/US2010/052093, PCT/US2011/ 042071 (WO2012/015550), PCT/U52016/52726 (WO2017053329), PCT/U52017/052359 (WO2018/ 071143), PCT/US2018/016759 (WO2018144957), and PCT/US2018/52332(WO 2019/060798). The entire contents of the foregoing patents, publications, and applications are incorporated herein by reference.

Electro-Optics: There is also work done for integrated monolithic 3D including layers of different crystals, such as U.S. Pat. Nos. 8,283,215, 8,163,581, 8,753,913, 8,823,122, 9,197,804, 9,419,031 and 9,941,319. The entire contents of the foregoing patents, publications, and applications are incorporated herein by reference.

An early work on monolithic 3D was presented in U.S. Pat. No. 7,052,941 and follow-on work in related patents includes U.S. Pat. No. 7,470,598. A technique which has been used over the last 20 years to build SOI wafers, called "Smart-Cut" or "Ion-Cut", was presented in U.S. Pat. No. 7,470,598 as one of the options to perform layer transfer for the formation of a monolithic 3D device. Yet in a related patent disclosure, by the same inventor of U.S. Pat. No. 7,470,598, U.S. application Ser. No. 12/618,542 it states: "In one embodiment of the previous art, exfoliating implant method in which ion-implanting Hydrogen into the wafer surface is known. But this exfoliating implant method can destroy lattice structure of the doped layer 400 by heavy ion-implanting In this case, to recover the destroyed lattice structure, a long time thermal treatment in very high temperature is required. This long time/high temperature thermal treatment can severely deform the cell devices of the lower region." Moreover, in U.S. application Ser. No. 12/635,496 by the same inventor is stated: [0034] Among the technologies to form the detaching layer, one of the well-known technologies is Hydrogen Exfoliating Implant. This method has a critical disadvantage which can destroy lattice structures of the substrate because it uses high amount of ion implantation. In order to recover the destroyed lattice structures, the substrate should be cured by heat treatment in very high temperature long time. This kind of high temperature heat treatment can damage cell devices in the lower regions. "Furthermore, in U.S. application Ser. No. 13/175, 652 it is stated: "Among the technologies to form the detaching layer 207, one technology is called as exfoliating implant in which gas phase ions such as hydrogen is implanted to form the detaching layer, but in this technology, the crystal lattice structure of the multiple doped layers 201, 203, 205 can be damaged. In order to recover the crystal lattice damage, a thermal treatment under very high temperature and longtime should be performed, and this can strongly damage the cell devices underneath" In fact the Inventor had posted a video infomercial on his corporate website, and was up-loaded on YouTube on Jun. 1, 2011, clearly stating in reference to the Smart Cut process: "The wafer bonding and detaching method is well-known SOI or Semiconductor-On-Insulator technology. Compared to conventional bulk semiconductor substrates, SOI has been introduced to increase transistor performance. However, it is not designed for 3D IC either. Let me explain the reasons . . . . The dose of hydrogen is too high and, therefore, semiconductor crystalline lattices are demolished by the hydrogen ion bombardment during the hydrogen ion implantation. Therefore, typically annealing at more than 1,100 Celsius is required for curing the lattice damage after wafer detaching. Such high temperature processing certainly destroys underlying devices and interconnect layers. Without high temperature annealing, the transferred layer should be the same as a highly defective amorphous layer. It seems that there is no way to cure the lattice damage at low temperatures. BeSang has disruptive 3D layer formation technology and it enables formation of defect-free single crystalline semiconductor layer at low temperatures . . . "

In at least one embodiment presented herein, an innovative method to repair the crystal lattice damage caused by the hydrogen implant is described.

Regardless of the technique used to construct 3D stacked integrated circuits or chips, heat removal is a serious issue for this technology. For example, when a layer of circuits with power density P is stacked atop another layer with power density P, the net power density is 2P. Removing the heat produced due to this power density is a significant challenge. In addition, many heat producing regions in 3D stacked integrated circuits or chips have a high thermal resistance to the heat sink, and this makes heat removal even more difficult.

Several solutions have been proposed to tackle this issue of heat removal in 3D stacked integrated circuits and chips. These are described in the following paragraphs.

Publications have suggested passing liquid coolant through multiple device layers of a 3D-IC to remove heat. This is described in "Microchannel Cooled 3D Integrated Systems", Proc. Intl. Interconnect Technology Conference, 2008 by D. C. Sekar, et al., and "Forced Convective Interlayer Cooling in Vertically Integrated Packages," Proc. Intersoc. Conference on Thermal Management (ITHERM), 2008 by T. Brunschweiler, et al.

Thermal vias have been suggested as techniques to transfer heat from stacked device layers to the heat sink. Use of power and ground vias for thermal conduction in 3D-ICs has also been suggested. These techniques are described in "Allocating Power Ground Vias in 3D ICs for Simultaneous Power and Thermal Integrity" ACM Transactions on Design Automation of Electronic Systems (TODAES), May 2009 by Hao Yu, Joanna Ho and Lei He.

Other techniques to remove heat from 3D Integrated Circuits and Chips will be beneficial.

Additionally the 3D technology according to some embodiments of the invention may enable some very innovative IC alternatives with reduced development costs, increased yield, and other illustrative benefits.

SUMMARY

The invention may be directed to multilayer or Three Dimensional Integrated Circuit (3D IC) devices and fabrication methods.

In one aspect, a 3D semiconductor device, the device comprising: a first single crystal layer; at least one first metal layer above said first single crystal layer; a second metal layer above said first metal layer; a plurality of first transistors atop said second metal layer; a plurality of second transistors atop said second transistors; a plurality of third transistors atop said second transistors; a third metal layer above said plurality of third transistors; a fourth metal layer above said third metal layer; and a second single crystal layer above said fourth metal layer; and a plurality of connecting metal paths from said fourth metal layer to said second metal layer, wherein at least one of said plurality of third transistors is aligned to at least one of said plurality of first transistors with less than 40 nm alignment error, wherein said fourth metal layer is providing global power distribution to said device and said fourth metal layer is at least twice as thick as said third metal layer, wherein said second metal layer provides local power distribution to said device and said second metal layer is substantially thicker than said first metal layer and said third metal layer, wherein at least one of said connecting metal paths comprises a through layer via, wherein said through layer via comprises a material and a majority of said material comprises tungsten, wherein at least one of said plurality of second transistors comprises a first source, a first channel and a first drain, wherein said first source, said first channel and said first drain have the same dopant type, wherein said device comprises an array of memory cells, and wherein at least one of said memory cells comprises one of said third transistors.

In another aspect, a 3D semiconductor device, the device comprising: a first single crystal layer comprising a plurality of first transistors; at least one first metal layer interconnecting said plurality of first transistors, wherein said interconnecting comprises forming a plurality of logic gates; a second metal layer above said first metal layer; a plurality of second transistors atop said second metal layer; a third metal layer above said plurality of second transistors; a plurality of third transistors atop said second transistors; a fourth metal layer above said third metal layer; and a plurality of connecting metal paths from said fourth metal layer to said second metal layer, wherein at least one of said plurality of third transistors is aligned to at least one of said plurality of first transistors with less than 40 nm alignment error, wherein said fourth metal layer is providing global power distribution to said device and said fourth metal layer is at least twice as thick as said third metal layer, wherein said second metal layer provides local power distribution to said device and is substantially thicker than said first metal layer and said third metal layer, wherein at least one of said connecting metal paths comprises a through layer via, wherein said through layer via comprises a material and a majority of said material comprises tungsten, wherein at least one of said second transistors comprises a first source, a first channel and a first drain, wherein said first source, said first channel and said first drain have the same dopant type, wherein said device comprises an array of memory cells, and wherein at least one of said memory cells comprises one of said third transistors.

In another aspect, a 3D semiconductor device, the device comprising: a first single crystal layer comprising a plurality of first transistors; at least one first metal layer interconnecting said plurality of first transistors, wherein said interconnecting comprises forming a plurality of logic gates; a second metal layer above said first metal layer; a plurality of second transistors atop said second metal layer; a third metal layer above said plurality of second transistors; a plurality of third transistors atop said second transistors; a fourth metal layer above said third metal layer; and a plurality of connecting metal paths from said fourth metal layer to said second metal layer, wherein at least one of said plurality of third transistors is aligned to at least one of said plurality of first transistors with less than 40 nm alignment error, wherein said fourth metal layer is providing global power distribution to said device and said fourth metal layer is at least twice as thick as said third metal layer, wherein said second metal layer provides local power distribution to said device and is substantially thicker than said first metal layer and said third metal layer, wherein at least one of said connecting metal paths comprises a through layer via, and wherein said through layer via comprises a material and a majority of said material comprises tungsten.

BRIEF DESCRIPTION OF THE DRAWINGS

Various embodiments of the invention will be understood and appreciated more fully from the following detailed description, taken in conjunction with the drawings in which:

FIGS. 4A-4G are exemplary drawing illustrations of the integration of a shield/heat sink layer in a 3D-IC;

FIGS. 5A-5H are exemplary drawing illustrations of a process flow for manufacturing fully depleted MOSFET (FD-MOSFET) with an integrated shield/heat sink layer;

FIG. 6 shows a junction-less transistor as a switch for logic applications (prior art);

FIGS. 7A-7M show a one-mask per layer 3D floating body DRAM;

FIGS. 8A-8J show a zero-mask per layer 3D resistive memory with a junction-less transistor;

FIGS. 10A-10B show periphery on top of memory layers;

DETAILED DESCRIPTION

Figure 1:
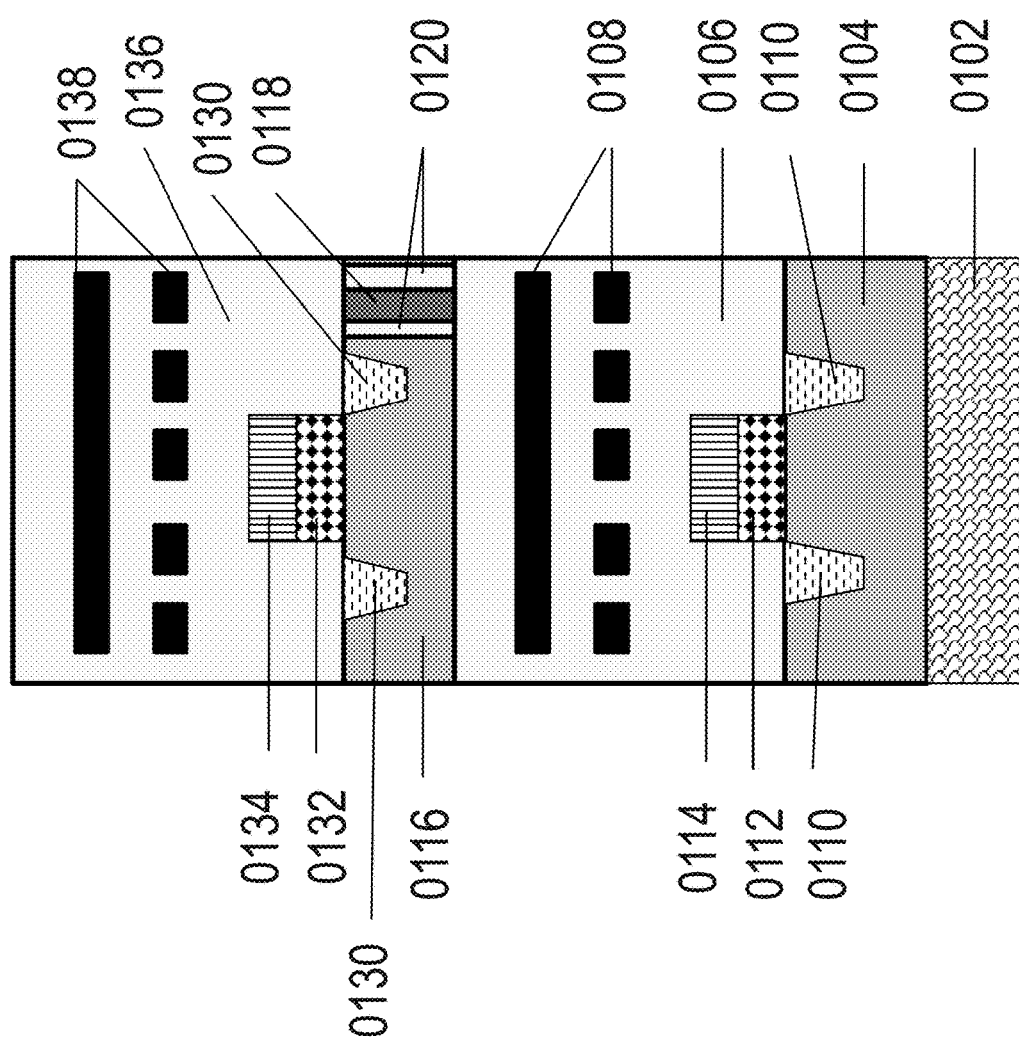
FIG. 1 is an exemplary drawing illustration of a 3D integrated circuit.

An embodiment of the invention is now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the appended claims.

Some drawing figures may describe process flows for building devices. The process flows, which may be a sequence of steps for building a device, may have many structures, numerals and labels that may be common between two or more adjacent steps. In such cases, some labels, numerals and structures used for a certain step's figure may have been described in the previous steps' figures.

FIG. 1 illustrates a 3D integrated circuit. Two crystalline layers, 0104 and 0116, which may include semiconductor materials such as, for example, mono-crystalline silicon, germanium, GaAs, InP, and graphene, are shown. For this illustration, mono-crystalline (single crystal) silicon may be used. Silicon layer 0116 could be thinned down from its original thickness, and its final thickness could be in the range of about 0.01 um to about 50 um, for example, 10 nm, 100 nm, 200 nm, 0.4 um, 1 um, 2 um or 5 um. Silicon layer 0104 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 0104 may also be of thicknesses greater than 100 um, depending on, for example, the strength of bonding to heat removal apparatus 0102. Silicon layer 0104 may include transistors such as, for example, MOSFETS, FinFets, BJTs, HEMTs, HBTs, which may include gate electrode region 0114, gate dielectric region 0112, source and drain junction regions (not shown), and shallow trench isolation (STI) regions 0110. Silicon layer 0116 may include transistors such as, for example, MOSFETS, FinFets, HEMTs, HBTs, which may include gate electrode region 0134, gate dielectric region 0132, source and drain junction regions (not shown), and shallow trench isolation (STI) regions 0130. A through-silicon via (TSV) 0118 could be present and may have an associated surrounding dielectric region 0120. Wiring layers 0108 for silicon layer 0104 and wiring dielectric regions 0106 may be present and may form an associated interconnect layer or layers. Wiring layers 0138 for silicon layer 0116 and wiring dielectric 0136 may be present and may form an associated interconnect layer or layers. Through-silicon via (TSV) 0118 may connect to wiring layers 0108 and wiring layers 0138 (not shown). The heat removal apparatus 0102 may include a heat spreader and/or a heat sink. The heat removal problem for the 3D integrated circuit shown in FIG. 1 is immediately apparent. The silicon layer 0116 is far away from the heat removal apparatus 0102, and it may be difficult to transfer heat among silicon layer 0116 and heat removal apparatus 0102. Furthermore, wiring dielectric regions 0106 may not conduct heat well, and this increases the thermal resistance among silicon layer 0116 and heat removal apparatus 0102. Silicon layer 0104 and silicon layer 0116 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus 0102 may include an external surface from which heat transfer may take place by methods such as air cooling, liquid cooling, or attachment to another heat sink or heat spreader structure.

Figure 2:
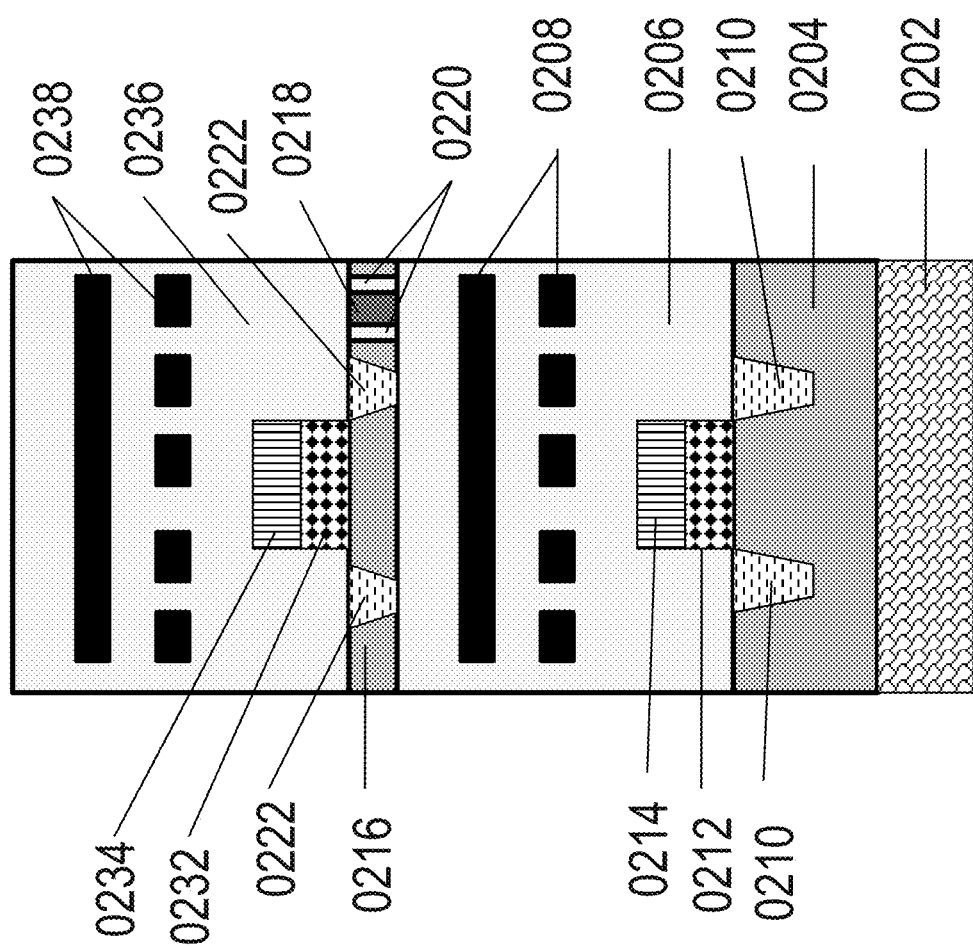
FIG. 2 is an exemplary drawing illustration of another 3D integrated circuit.

FIG. 2 illustrates an exemplary 3D integrated circuit that could be constructed, for example, using techniques described in U.S. Pat. Nos. 8,273,610, 8,557,632, and 8,581,349. The contents of the foregoing patent and applications are incorporated herein by reference. Two crystalline layers, 0204 and 0216, which may include semiconductor materials such as, for example, mono-crystalline silicon, germanium, GaAs, InP, and graphene, are shown. For this illustration, mono-crystalline (single crystal) silicon may be used. Silicon layer 0216 could be thinned down from its original thickness, and its final thickness could be in the range of about 0.01 um to about 50 um, for example, 10 nm, 100 nm, 200 nm, 0.4 um, 1 um, 2 um or 5 um. Silicon layer 0204 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 0204 may also be of thicknesses greater than 100 um, depending on, for example, the strength of bonding to heat removal apparatus 0202. Silicon layer 0204 may include transistors such as, for example, MOSFETS, FinFets, BJTs, HEMTs, HBTs, which may include gate electrode region 0214, gate dielectric region 0212, source and drain junction regions (not shown for clarity) and shallow trench isolation (STI) regions 0210. Silicon layer 0216 may include transistors such as, for example, MOSFETS, FinFets, BJTs, HEMTs, HBTs, which may include gate electrode region 0234, gate dielectric region 0232, source and drain junction regions (not shown for clarity), and shallow trench isolation (STI) regions 0222. It can be observed that the STI regions 0222 can go right through to the bottom of silicon layer 0216 and provide good electrical isolation. This, however, may cause challenges for heat removal from the STI surrounded transistors since STI regions 0222 are typically composed of insulators that do not conduct heat well. Therefore, the heat spreading capabilities of silicon layer 0216 with STI regions 0222 are low. A through-layer via (TLV) 0218 may be present and may include an associated surrounding dielectric region 0220. Wiring layers 0208 for silicon layer 0204 and wiring dielectric regions 0206 may be present and may form an associated interconnect layer or layers. Wiring layers 0238 for silicon layer 0216 and wiring dielectric 0236 may be present and may form an associated interconnect layer or layers. Through-layer via (TLV) 0218 may connect to wiring layers 0208 and wiring layers 0238 (not shown). The heat removal apparatus 0202 may include a heat spreader and/or a heat sink. The heat removal problem for the 3D integrated circuit shown in FIG. 2 is immediately apparent. The silicon layer 0216 may be far away from the heat removal apparatus 0202, and it may be difficult to transfer heat among silicon layer 0216 and heat removal apparatus 0202. Furthermore, wiring dielectric regions 0206 may not conduct heat well, and this increases the thermal resistance among silicon layer 0216 and heat removal apparatus 0202. The heat removal challenge is further exacerbated by the poor heat spreading properties of silicon layer 0216 with STI regions 0222. Silicon layer 0204 and silicon layer 0216 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus 0202 may include an external surface from which heat transfer may take place by methods such as air cooling, liquid cooling, or attachment to another heat sink or heat spreader structure.

Figure 3:
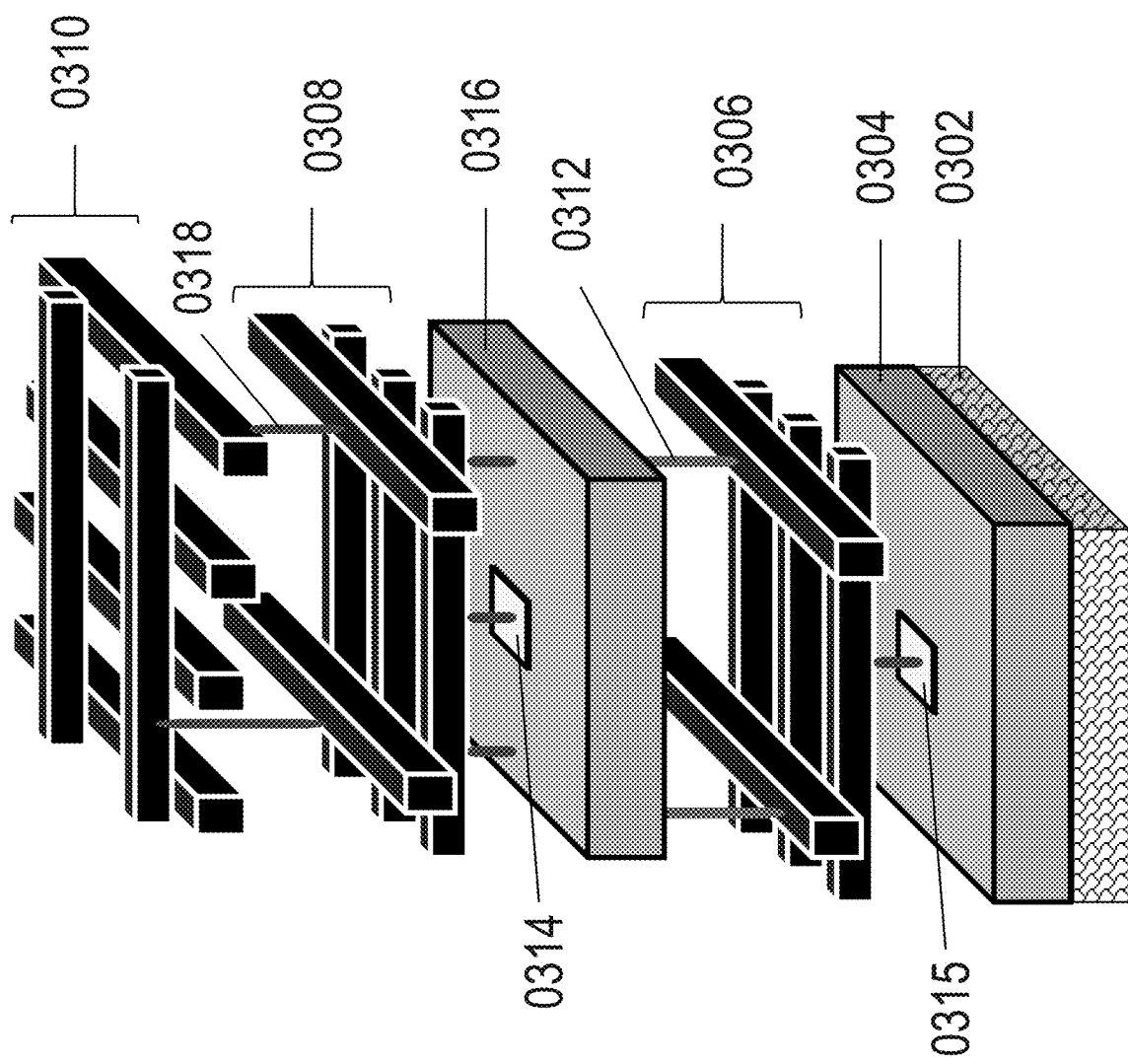
FIG. 3 is an exemplary drawing illustration of the power distribution network of a 3D integrated circuit.

FIG. 3 illustrates how the power or ground distribution network of a 3D integrated circuit could assist heat removal. FIG. 3 illustrates an exemplary power distribution network or structure of the 3D integrated circuit. As shown in FIGS. 1 and 2, a 3D integrated circuit, could, for example, be constructed with two silicon layers, first silicon layer 0304 and second silicon layer 0316. The heat removal apparatus 0302 could include, for example, a heat spreader and/or a heat sink. The power distribution network or structure could consist of a global power grid 0310 that takes the supply voltage (denoted as $V_{DD}$) from the chip/circuit power pads and transfers $V_{DD}$ to second local power grid 0308 and first local power grid 0306, which transfers the supply voltage to logic/memory cells, transistors, and/or gates such as second transistor 0314 and first transistor 0315. Second layer vias 0318 and first layer vias 0312, such as the previously described TSV or TLV, could be used to transfer the supply voltage from the global power grid 0310 to second local power grid 0308 and first local power grid 0306. The global power grid 0310 may also be present among first silicon layer 0304 and second silicon layer 0316. The 3D integrated circuit could have a similarly designed and laid-out distribution networks, such as for ground and other supply voltages, as well. The power grid may be designed and constructed such that each layer or strata of transistors and devices may be supplied with a different value Vdd. For example, first silicon layer 0304 may be supplied by its power grid to have a Vdd value of 1.0 volts and second silicon layer 0316 a Vdd value of 0.8 volts. Furthermore, the global power grid 0310 wires may be constructed with substantially higher conductivity, for example 30% higher, 50% higher, 2× higher, than local power grids, for example, such as first local power grid 0306 wires and second local power grid 0308 wires. The thickness, linewidth, and material composition for the global power grid 0310 wires may provide for the higher conductivity, for example, the thickness of the global power grid 0310 wires may be twice that of the local power grid wires and/or the linewidth of the global power grid 0310 wires may be 2× that of the local power grid wires. Moreover, the global power grid 0310 may be optimally located in the top strata or layer of transistors and devices.

Typically, many contacts may be made among the supply and ground distribution networks and first silicon layer 0304. Due to this, there could exist a low thermal resistance among the power/ground distribution network and the heat removal apparatus 0302. Since power/ground distribution networks may be typically constructed of conductive metals and could have low effective electrical resistance, the power/ground distribution networks could have a low thermal resistance as well. Each logic/memory cell or gate on the 3D integrated circuit (such as, for example, second transistor 0314) is typically connected to $V_{DD}$ and ground, and therefore could have contacts to the power and ground distribution network. The contacts could help transfer heat efficiently (for example, with low thermal resistance) from each logic/memory cell or gate on the 3D integrated circuit (such as, for example, second transistor 0314) to the heat removal apparatus 0302 through the power/ground distribution network and the silicon layer 0304. Silicon layer 0304 and silicon layer 0316 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus 0302 may include an external surface from which heat transfer may take place by methods such as air cooling, liquid cooling, or attachment to another heat sink or heat spreader structure.

Defect annealing, such as furnace thermal or optical annealing, of thin layers of the crystalline materials generally included in 3D-ICs to the temperatures that may lead to substantial dopant activation or defect anneal, for example above 600° C., may damage or melt the underlying metal interconnect layers of the stacked 3D-IC, such as copper or aluminum interconnect layers. An embodiment of the invention is to form 3D-IC structures and devices wherein a heat spreading, heat conducting and/or optically reflecting or absorbent material layer or layers (which may be called a shield) is incorporated between the sensitive metal interconnect layers and the layer or regions being optically irradiated and annealed, or annealed from the top of the 3D-IC stack using other methods. An exemplary generalized process flow is shown in FIGS. 4A-F. An exemplary process flow for a FD-MOSFET with an optional integrated heat shield/spreader is shown in FIGS. 5A-5H. The 3D-ICs may be constructed in a 3D stacked layer using procedures outlined herein (such as, for example, FIGS. 39, 40, 41 of parent now U.S. Pat. No. 8,674,470) and in U.S. Pat. Nos. 8,273,610 and 8,557,632 and 8,581,349. The contents of the foregoing applications are incorporated herein by reference. The topside defect anneal may include optical annealing to repair defects in the crystalline 3D-IC layers and regions (which may be caused by the ion-cut implantation process), and may be utilized to activate semiconductor dopants in the crystalline layers or regions of a 3D-IC, such as, for example, LDD, halo, source/drain implants. The 3D-IC may include, for example, stacks formed in a monolithic manner with thin layers or stacks and vertical connection such as TLVs, and stacks formed in an assembly manner with thick (>2 um) layers or stacks and vertical connections such as TSVs. Optical annealing beams or systems, such as, for example, a laser-spike anneal beam from a commercial semiconductor material oriented single or dual-beam continuous wave (CW) laser spike anneal DB-LSA system of Ultratech Inc., San Jose, Calif., USA (10.6 um laser wavelength), or a short pulse laser (such as 160 ns), with 308 nm wavelength, and large area (die or step-field sized, including 1 $cm^2$) irradiation such as offered by Excico of Gennevilliers, France, may be utilized (for example, see Huet, K., "Ultra Low Thermal Budget Laser Thermal Annealing for 3D Semiconductor and Photovoltaic Applications," NCCAVS 2012 Junction Technology Group, Semicon West, San Francisco, Jul. 12, 2012). Additionally, the defect anneal may include, for example, laser anneals (such as suggested in Rajendran, B., "Sequential 3D IC Fabrication: Challenges and Prospects", Proceedings of VLSI Multi Level Interconnect Conference 2006, pp. 57-64), Ultrasound Treatments (UST), megasonic treatments, and/or microwave treatments. The topside defect anneal ambient may include, for example, vacuum, high pressure (greater than about 760 torr), oxidizing atmospheres (such as oxygen or partial pressure oxygen), and/or reducing atmospheres (such as nitrogen or argon). The topside defect anneal may include temperatures of the layer being annealed above about 400° C. (a high temperature thermal anneal), including, for example, 600° C., 800° C., 900° C., 1000° C., 1050° C., 1100° C. and/or 1120° C., and the sensitive metal interconnect (for example, may be copper or aluminum containing) and/or device layers below may not be damaged by the annealing process, for example, which may include sustained temperatures that do not exceed 200° C., exceed 300° C., exceed 370° C., or exceed 400° C. As understood by those of ordinary skill in the art, short-timescale (nanosceonds to miliseconds) temperatures above 400° C. may also be acceptable for damage avoidance, depending on the acceptor layer interconnect metal systems used. The topside defect anneal may include activation of semiconductor dopants, such as, for example, ion implanted dopants or PLAD applied dopants. It will also be understood by one of ordinary skill in the art that the methods, such as the heat sink/shield layer and/or use of short pulse and short wavelength optical anneals, may allow almost any type of transistor, for example, such as FinFets, bipolar, nanowire transistors, to be constructed in a monolithic 3D fashion as the thermal limit of damage to the underlying metal interconnect systems is overcome. Moreover, multiple pulses of the laser, other optical annealing techniques, or other anneal treatments such as microwave, may be utilized to improve the anneal, activation, and yield of the process. The transistors formed as described herein may include many types of materials; for example, the channel and/or source and drain may include single crystal materials such as silicon, germanium, or compound semiconductors such as GaAs, InP, GaN, SiGe, and although the structures may be doped with the tailored dopants and concentrations, they may still be substantially crystalline or mono-crystalline.

Figure 4A:
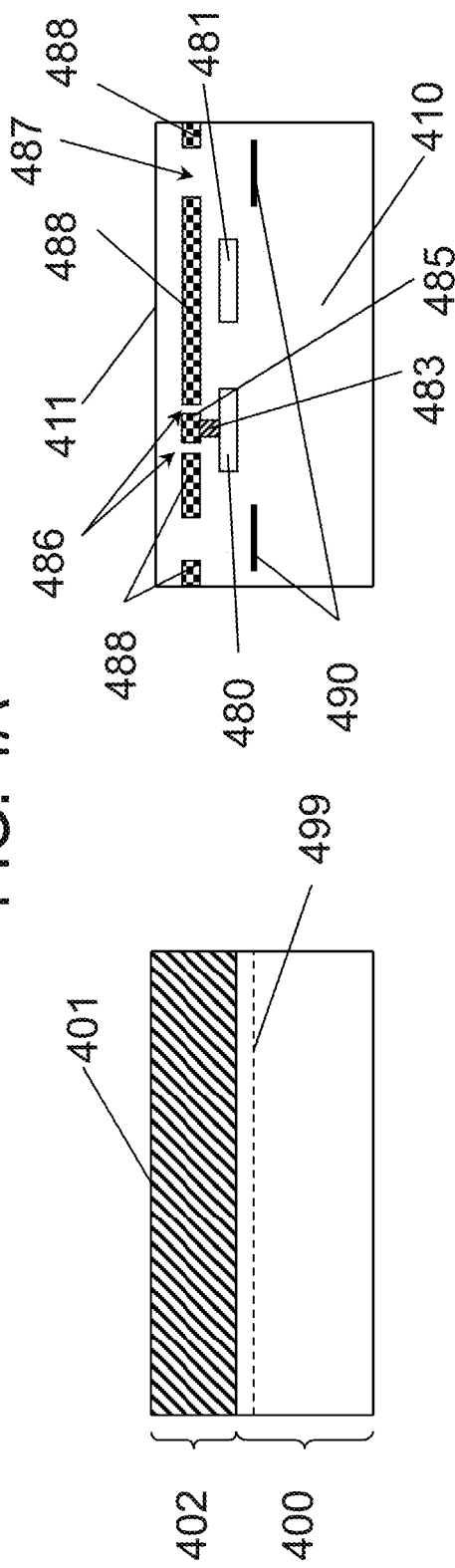

As illustrated in FIG. 4A, a generalized process flow may begin with a donor wafer 400 that may be preprocessed with wafer sized layers 402 of conducting, semi-conducting or insulating materials that may be formed by deposition, ion implantation and anneal, oxidation, epitaxial growth, combinations of above, or other semiconductor processing steps and methods. For example, donor wafer 400 and wafer sized layers 402 may include semiconductor materials such as, for example, mono-crystalline silicon, germanium, GaAs, InP, and graphene. For this illustration, mono-crystalline (single crystal) silicon and associated silicon oriented processing may be used. The donor wafer 400 may be preprocessed with a layer transfer demarcation plane (shown as dashed line) 499, such as, for example, a hydrogen implant cleave plane, before or after (typical) wafer sized layers 402 are formed. Layer transfer demarcation plane 499 may alternatively be formed within wafer sized layers 402. Other layer transfer processes, some described in the referenced patent documents, may alternatively be utilized. Damage/defects to the crystalline structure of donor wafer 400 may be annealed by some of the annealing methods described, for example the short wavelength pulsed laser techniques, wherein the donor wafer 400 wafer sized layers 402 and portions of donor wafer 400 may be heated to defect annealing temperatures, but the layer transfer demarcation plane 499 may be kept below the temperate for cleaving and/or significant hydrogen diffusion. Dopants in at least a portion of wafer sized layers 402 may also be electrically activated. Thru the processing, donor wafer 400 and/or wafer sized layers 402 could be thinned from its original thickness, and their/its final thickness could be in the range of about 0.01 um to about 50 um, for example, 10 nm, 100 nm, 200 nm, 0.4 um, 1 um, 2 um or 5 um. Donor wafer 400 and wafer sized layers 402 may include preparatory layers for the formation of horizontally or vertically oriented types of transistors such as, for example, MOSFETS, FinFets, FD-RCATs, BJTs, HEMTs, HBTs, JFETs, JLTs, or partially processed transistors (for example, the replacement gate HKMG process described in the referenced patent documents). Donor wafer 400 and wafer sized layers 402 may include the layer transfer devices and/or layer or layers contained herein this document or referenced patent documents, for example, DRAM $Si/SiO_2$ layers, RCAT doped layers, multi-layer doped structures, or starting material doped or undoped monocrystalline silicon, or polycrystalline silicon. Donor wafer 400 and wafer sized layers 402 may have alignment marks (not shown). Acceptor wafer 410 may be a preprocessed wafer, for example, including monocrystalline bulk silicon or SOI, that may have fully functional circuitry including metal layers (including aluminum or copper metal interconnect layers that may connect acceptor wafer 410 transistors and metal structures, such as TLV landing strips and pads, prepared to connect to the transferred layer devices) or may be a wafer with previously transferred layers, or may be a blank carrier or holder wafer, or other kinds of substrates suitable for layer transfer processing. Acceptor wafer 410 may have alignment marks 490 and metal connect pads or strips 480 and ray blocked metal interconnect 481. Acceptor wafer 410 may include transistors such as, for example, MOSFETS, FinFets, FD-RCATs, BJTs, JFETs, JLTs, HEMTs, and/or HBTs. Acceptor wafer 410 may include shield/heat sink layer 488, which may include materials such as, for example, Aluminum, Tungsten (a refractory metal), Copper, silicon or cobalt based silicides, or forms of carbon such as carbon nanotubes or DLC (Diamond Like Carbon). Shield/heat sink layer 488 may have a thickness range of about 50 nm to about 1 mm, for example, 50 nm, 100 nm, 200 nm, 300 nm, 500 nm, 0.1 um, 1 um, 2 um, and 10 um. Shield/heat sink layer 488 may include isolation openings 486, and alignment mark openings 487, which may be utilized for short wavelength alignment of top layer (donor) processing to the acceptor wafer alignment marks 490. Shield/heat sink layer 488 may include shield path connect 485 and shield path via 483.

Shield path via 483 may thermally and/or electrically couple and connect shield path connect 485 to acceptor wafer 410 interconnect metallization layers such as, for example, metal connect pads or strips 480 (shown). If two shield/heat sink layers 488 are utilized, one on top of the other and separated by an isolation layer common in semiconductor BEOL, such as carbon doped silicon oxide, shield path connect 485 may also thermally and/or electrically couple and connect each shield/heat sink layer 488 to the other and to acceptor wafer 410 interconnect metallization layers such as, for example, metal connect pads or strips 480, thereby creating a heat conduction path from the shield/heat sink layer 488 to the acceptor wafer substrate, and a heat sink (shown in FIG. 4F). The topmost shield/heat sink layer may include a higher melting point material, for example a refractory metal such as Tungsten, and the lower heat shield layer may include a lower melting point material such as copper.

Figure 4B:
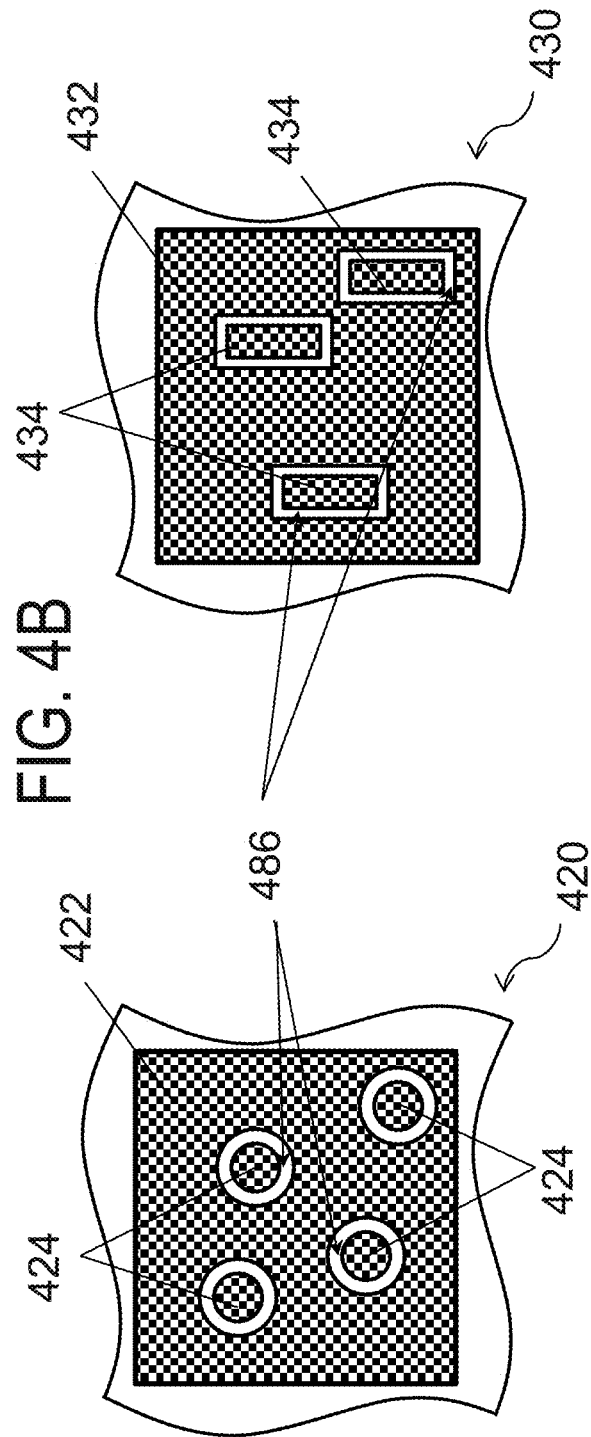

As illustrated in FIG. 4B, two exemplary top views of shield/heat sink layer 488 are shown. In shield/heat sink portion 420 a shield area 422 of the shield/heat sink layer 488 materials described above and in the incorporated references may include TLV/TSV connects 424 and isolation openings 486. Isolation openings 486 may be the absence of the material of shield area 422. TLV/TSV connects 424 are an example of a shield path connect 485. TLV/TSV connects 424 and isolation openings 486 may be drawn in the database of the 3D-IC stack and may formed during the acceptor wafer 410 processing. In shield/heat sink portion 430 a shield area 432 of the shield/heat sink layer 488 materials described above and in the incorporated references may have metal interconnect strips 434 and isolation openings 486. Metal interconnect strips 434 may be surrounded by regions, such as isolation openings 486, where the material of shield area 432 may be etched away, thereby stopping electrical conduction from metal interconnect strips 434 to shield area 432 and to other metal interconnect strips. Metal interconnect strips 434 may be utilized to connect/couple the transistors formed in the donor wafer layers, such as 402, to themselves from the 'backside' or 'underside' and/or to transistors in the acceptor wafer level/layer. Metal interconnect strips 434 and shield/heat sink layer 488 regions such as shield area 422 and shield area 432 may be utilized as a ground plane for the transistors above it residing in the donor wafer layer or layers and/or may be utilized as power supply or back-bias, such as Vdd or Vsb, for the transistors above it residing in the transferred donor wafer layer or layers. The strips and/or regions of shield/heat sink layer 488 may be controlled by second layer transistors when supplying power or other signals such as data or control. For example, as illustrated in FIG. 4G, the topmost shield/heat sink layer 488 may include a topmost shield/heat sink portion 470, which may be configured as fingers or stripes of conductive material, such as top strips 474 and strip isolation spaces 476, which may be utilized, for example, to provide back-bias, power, or ground to the second layer transistors above it residing in the donor wafer layer or layers (for example donor wafer device structures 450). A second shield/heat sink layer 488, below the topmost shield/heat sink layer, may include a second shield/heat sink portion 472, which may be configured as fingers or stripes of conductive material, such as second strips 478 and strip isolation spaces 476, may be oriented in a different direction (although not necessarily so) than the topmost strips, and may be utilized, for example, to provide back-bias, power, or ground to the second layer transistors above it residing in the donor wafer layer or layers (for example donor wafer device structures 450). Openings, such as opening 479, in the topmost shield/heat sink layer may be designed to allow connection from the second layer of transistors to the second shield/heat sink layer, such as from donor wafer device structures 450 to second strips 478. The strips or fingers may be illustrated as orthogonally oriented layer to layer, but may also take other drawn shapes and forms; for example, such as diagonal running shapes as in the X-architecture, overlapping parallel strips, and so on. The portions of the shield/heat sink layer 488 or layers may include a combination of the strip/finger shapes of FIG. 4G and the illustrated via connects and fill-in regions of FIG. 4B.

Bonding surfaces, donor bonding surface 401 and acceptor bonding surface 411, may be prepared for wafer bonding by depositions (such as silicon oxide), polishes, plasma, or wet chemistry treatments to facilitate successful wafer to wafer bonding. The insulation layer, such as deposited bonding oxides and/or before bonding preparation existing oxides, between the donor wafer transferred layer and the acceptor wafer topmost metal layer, may include thicknesses of less than 1 um, less than 500 nm, less than 400 nm, less than 300 nm, less than 200 nm, or less than 100 nm.

As illustrated in FIG. 4C, the donor wafer 400 with wafer sized layers 402 and layer transfer demarcation plane 499 may be flipped over, aligned, and bonded to the acceptor wafer 410. The donor wafer 400 with wafer sized layers 402 may have alignment marks (not shown). Various topside defect anneals may be utilized. For this illustration, an optical beam such as the laser annealing previously described is used. Optical anneal beams may be optimized to focus light absorption and heat generation at or near the layer transfer demarcation plane (shown as dashed line) 499 to provide a hydrogen bubble cleave with exemplary cleave ray 451. The laser assisted hydrogen bubble cleave with the absorbed heat generated by exemplary cleave ray 451 may also include a pre-heat of the bonded stack to, for example, about 100° C. to about 400° C., and/or a thermal rapid spike to temperatures above about 200° C. to about 600° C. The laser assisted ion-cut cleave may provide a smoother cleave surface upon which better quality transistors may be manufactured. Reflected ray 453 may be reflected and/or absorbed by shield/heat sink layer 488 regions thus blocking the optical absorption of ray blocked metal interconnect 481 and potentially enhancing the efficiency of optical energy absorption of the wafer sized layers 402. Additionally, shield/heat sink layer 488 may laterally spread and conduct the heat generated by the topside defect anneal, and in conjunction with the dielectric materials (low heat conductivity) above and below shield/heat sink layer 488, keep the interconnect metals and low-k dielectrics of the acceptor wafer interconnect layers cooler than a damage temperature, such as, for example, 400° C. Annealing of dopants or annealing of damage, such as from the H cleave implant damage, may be accomplished by optical annealing rays, such as repair ray 455. A small portion of the optical energy, such as unblocked ray 457, may hit and heat, or be reflected, by (a few rays as the area of the heat shield openings, such as 424, is small compared to the die or device area) such as metal connect pads or strips 480. Heat generated by absorbed photons from, for example, cleave ray 451, reflected ray 453, and/or repair ray 455 may also be absorbed by shield/heat sink layer 488 regions and dissipated laterally and may keep the temperature of underlying metal layers, such as ray blocked metal interconnect 481, and other metal layers below it, cooler and prevent damage. Shield/heat sink layer 488 may act as a heat spreader. A second layer of shield/heat sink layer 488 (not shown) may have been constructed (during the acceptor wafer 410 formation) with a low heat conductive material sandwiched between the two heat sink layers, such as silicon oxide or carbon doped low-k' silicon oxides, for improved thermal protection of the acceptor wafer interconnect layers, metal and dielectrics. Electrically conductive materials may be used for the two layers of shield/heat sink layer 488 and thus may provide, for example, a Vss and a Vdd plane for power delivery that may be connected to the donor layer transistors above, as well may be connected to the acceptor wafer transistors below. Shield/heat sink layer 488 may include materials with a high thermal conductivity greater than 10 W/m-K, for example, copper (about 400 W/m-K), aluminum (about 237 W/m-K), Tungsten (about 173 W/m-K), Plasma Enhanced Chemical Vapor Deposited Diamond Like Carbon-PECVD DLC (about 1000 W/m-K), and Chemical Vapor Deposited (CVD) graphene (about 5000 W/m-K). Shield/heat sink layer 488 may be sandwiched and/or substantially enclosed by materials with a low thermal conductivity less than 10 W/m-K, for example, silicon dioxide (about 1.4 W/m-K). The sandwiching of high and low thermal conductivity materials in layers, such as shield/heat sink layer 488 and under & overlying dielectric layers, spreads the localized heat/light energy of the topside anneal laterally and protect the underlying layers of interconnect metallization & dielectrics, such as in the acceptor wafer, from harmful temperatures or damage. Further, absorber layers or regions, for example, including amorphous carbon, amorphous silicon, and phase changing materials (see U.S. Pat. Nos. 6,635,588 and 6,479,821 to Hawryluk et al. for example), may be utilized to increase the efficiency of the optical energy capture in conversion to heat for the desired annealing or activation processes. For example, pre-processed layers 402 may include a layer or region of optical absorbers such as transferred absorber region 475, acceptor wafer 410 may include a layer or region of optical absorbers such as acceptor absorber region 473, and second device layer 405 may include a layer or region of optical absorbers such as post transfer absorber regions 477 (shown in FIG. 4E). Transferred absorber region 475, acceptor absorber region 473, and/or post transfer absorber regions 477 may be permanent (could be found within the device when manufacturing is complete) or temporary so is removed during the manufacturing process.

As illustrated in FIG. 4D, the donor wafer 400 may be cleaved at or thinned to (or past, not shown) the layer transfer demarcation plane 499, leaving donor wafer portion 403 and the pre-processed layers 402 bonded to the acceptor wafer 410, by methods such as, for example, ion-cut or other layer transfer methods. The layer transfer demarcation plane 499 may instead be placed in the pre-processed layers 402. Optical anneal beams, in conjunction with reflecting layers and regions and absorbing enhancement layers and regions, may be optimized to focus light absorption and heat generation within or at the surface of donor wafer portion 403 and provide surface smoothing and/or defect annealing (defects may be from the cleave and/or the ion-cut implantation), and/or post ion-implant dopant activation with exemplary smoothing/annealing ray 466. The laser assisted smoothing/annealing with the absorbed heat generated by exemplary smoothing/annealing ray 466 may also include a pre-heat of the bonded stack to, for example, about 100° C. to about 400° C., and/or a thermal rapid spike to temperatures above about 200° C. to about 600° C. Moreover, multiple pulses of the laser may be utilized to improve the anneal, activation, and yield of the process. Reflected ray 463 may be reflected and/or absorbed by shield/heat sink layer 488 regions thus blocking the optical absorption of ray blocked metal interconnect 481. Annealing of dopants or annealing of damage, such as from the H cleave implant damage, may be also accomplished by a set of rays such as repair ray 465. A small portion of the optical energy, such as unblocked ray 467, may hit and heat, or be reflected, by a few rays (as the area of the heat shield openings, such as 424, is small) such as metal connect pads or strips 480. Heat generated by absorbed photons from, for example, smoothing/annealing ray 466, reflected ray 463, and/or repair ray 465 may also be absorbed by shield/heat sink layer 488 regions and dissipated laterally and may keep the temperature of underlying metal layers, such as ray blocked metal interconnect 481, and other metal layers below it, cooler and prevent damage. A second layer of shield/heat sink layer 488 may be constructed with a low heat conductive material sandwiched between the two heat sink layers, such as silicon oxide or carbon doped low-k' silicon oxides, for improved thermal protection of the acceptor wafer interconnect layers, metal and dielectrics. Shield/heat sink layer 488 may act as a heat spreader. When there may be more than one shield/heat sink layer 488 in the device, the heat conducting layer closest to the second crystalline layer may be constructed with a different material, for example a high melting point material, for example a refractory metal such as tungsten, than the other heat conducting layer or layers, which may be constructed with, for example, a lower melting point material such as aluminum or copper. Electrically conductive materials may be used for the two layers of shield/heat sink layer 488 and thus may provide, for example, a Vss and a Vdd plane that may be connected to the donor layer transistors above, as well may be connected to the acceptor wafer transistors below. Furthermore, some or all of the layers utilized as shield/heat sink layer 488, which may include shapes of material such as the strips or fingers as illustrated in FIG. 4G, may be driven by a portion of the second layer transistors and circuits (within the transferred donor wafer layer or layers) or the acceptor wafer transistors and circuits, to provide a programmable back-bias to at least a portion of the second layer transistors. The programmable back bias may utilize a circuit to do so, for example, such as shown in FIG. 17B of U.S. Pat. No. 8,273,610, the contents incorporated herein by reference; wherein the 'Primary' layer may be the second layer of transistors for which the back-bias is being provided, the 'Foundation' layer could be either the second layer transistors (donor) or first layer transistors (acceptor), and the routing metal lines connections 1723 and 1724 may include portions of the shield/heat sink layer 488 layer or layers. Moreover, some or all of the layers utilized as shield/heat sink layer 488, which may include strips or fingers as illustrated in FIG. 4G, may be driven by a portion of the second layer transistors and circuits (within the transferred donor wafer layer or layers) or the acceptor wafer transistors and circuits to provide a programmable power supply to at least a portion of the second layer transistors. The programmable power supply may utilize a circuit to do so, for example, such as shown in FIG. 17C of U.S. Pat. No. 8,273,610, the contents incorporated herein by reference; wherein the 'Primary' layer may be the second layer of transistors for which the programmable power supplies are being provided to, the 'Foundation' layer could be either the second layer transistors (donor) or first layer transistors (acceptor), and the routing metal line connections from Vout to the various second layer transistors may include portions of the shield/heat sink layer 488 layer or layers. The Vsupply on line 17C12 and the control signals on control line 17C16 may be controlled by and/or generated in the second layer transistors (donor, for example donor wafer device structures 450) or first layer transistors (acceptor, for example acceptor wafer transistors and devices 493), or off chip circuits. Furthermore, some or all of the layers utilized as shield/heat sink layer 488, which may include strips or fingers as illustrated in FIG. 4G or other shapes such as those in FIG. 4B, may be utilized to distribute independent power supplies to various portions of the second layer transistors (donor, for example donor wafer device structures 450) or first layer transistors (acceptor, for example acceptor wafer transistors and devices 493) and circuits; for example, one power supply and/or voltage may be routed to the sequential logic circuits of the second layer and a different power supply and/or voltage routed to the combinatorial logic circuits of the second layer. Patterning of shield/heat sink layer 488 or layers can impact their heat-shielding capacity. This impact may be mitigated, for example, by enhancing the top shield/heat sink layer 488 areal density, creating more of the secondary shield/heat sink layers 488, or attending to special CAD rules regarding their metal density, similar to CAD rules that are required to accommodate Chemical-Mechanical Planarization (CMP). These constraints would be integrated into a design and layout EDA tool.

As illustrated in FIG. 4E, the remaining donor wafer portion 403 may be removed by polishing or etching and the transferred layers 402 may be further processed to create second device layer 405 which may include donor wafer device structures 450 and metal interconnect layers (such as second device layer metal interconnect 461) that may be precisely aligned to the acceptor wafer alignment marks 490. Donor wafer device structures 450 may include, for example, CMOS transistors such as N type and P type transistors, or at least any of the other transistor or device types discussed herein this document or referenced patent documents. The details of CMOS in one transferred layer and the orthogonal connect strip methodology may be found as illustrated in at least FIGS. 30-4, 73-80, and 94 and related specification sections of U.S. Pat. No. 8,273,610. As discussed above and herein this document and referenced patent documents, annealing of dopants or annealing of damage, such as from the dopant application such as ion-implantation, or from etch processes during the formation of the transferred layer transistor and device structures, may be accomplished by optical annealing. Donor wafer device structures 450 may include transistors and/or semiconductor regions wherein the dopant concentration of the regions in the horizontal plane, such as shown as exemplary dopant plane 449, may have regions that differ substantially in dopant concentration, for example, 10× greater, and/or may have a different dopant type, such as, for example p-type or n-type dopant. Additionally, the annealing of deposited dielectrics and etch damage, for example, oxide depositions and silicon etches utilized in the transferred layer isolation processing, for example, STI (Shallow Trench Isolation) processing or strained source and drain processing, may be accomplished by optical annealing. Second device layer metal interconnect 461 may include electrically conductive materials such as copper, aluminum, conductive forms of carbon, and tungsten. Donor wafer device structures 450 may utilize second device layer metal interconnect 461 and thru layer vias (TLVs) 460 to electrically couple (connection paths) the donor wafer device structures 450 to the acceptor wafer metal connect pads or strips 480, and thus couple donor wafer device structures (the second layer transistors) with acceptor wafer device structures (first layer transistors). Thermal TLVs 462 may be constructed of thermally conductive but not electrically conductive materials, for example, DLC (Diamond Like Carbon), and may connect donor wafer device structures 450 thermally to shield/heat sink layer 488. TLVs 460 may be constructed out of electrically and thermally conductive materials, such as Tungsten, Copper, or aluminum, and may provide a thermal and electrical connection path from donor wafer device structures 450 to shield/heat sink layer 488, which may be a ground or Vdd plane in the design/layout. TLVs 460 and thermal TLVs 462 may be also constructed in the device scribelanes (pre-designed in base layers or potential dicelines) to provide thermal conduction to the heat sink, and may be sawed/diced off when the wafer is diced for packaging. Shield/heat sink layer 488 may be configured to act as an emf (electro-motive force) shield to prevent direct layer to layer cross-talk between transistors in the donor wafer layer and transistors in the acceptor wafer. In addition to static ground or Vdd biasing, shield/heat sink layer 488 may be actively biased with an anti-interference signal from circuitry residing on, for example, a layer of the 3D-IC or off chip. TLVs 460 may be formed through the transferred layers 402. As the transferred layers 402 may be thin, on the order of about 200 nm or less in thickness, the TLVs may be easily manufactured as a typical metal to metal via may be, and said TLV may have state of the art diameters such as nanometers or tens to a few hundreds of nanometers, such as, for example about 150 nm or about 100 nm or about 50 nm. The thinner the transferred layers 402, the smaller the thru layer via diameter obtainable, which may result from maintaining manufacturable via aspect ratios. Thus, the transferred layers 402 (and hence, TLVs 460) may be, for example, less than about 2 microns thick, less than about 1 micron thick, less than about 0.4 microns thick, less than about 200 nm thick, less than about 150 nm thick, less than about 100 nm thick, less than about 50 nm thick, less than about 20 nm thick, or less than about 5 nm thick. The thickness of the layer or layers transferred according to some embodiments of the invention may be designed as such to match and enable the most suitable obtainable lithographic resolution (and enable the use of conventional state of the art lithographic tools), such as, for example, less than about 10 nm, 14 nm, 22 nm or 28 nm linewidth resolution and alignment capability, such as, for example, less than about 5 nm, 10 nm, 20 nm, or 40 nm alignment accuracy/precision/error, of the manufacturing process employed to create the thru layer vias or any other structures on the transferred layer or layers. The above TLV dimensions and alignment capability and transferred layer thicknesses may be also applied to any of the discussed TLVs or transferred layers described elsewhere herein. Transferred layers 402 may be considered to be overlying the metal layer or layers of acceptor wafer 410. Alignment marks in acceptor wafer 410 and/or in transferred layers 402 may be utilized to enable reliable contact to transistors and circuitry in transferred layers 402 and donor wafer device structures 450 and electrically couple them to the transistors and circuitry in the acceptor wafer 410. The donor wafer 400 may now also be processed, such as smoothing and annealing, and reused for additional layer transfers. The transferred layers 402 and other additional regions created in the transferred layers during transistor processing are thin and small, having small volumes on the order of $2 \times 10^{-16}$ cm$^3$ ($2 \times 10^5$ nm$^3$ for a 100 nm by 100 nm×20 nm thick device). As a result, the amount of energy to manufacture with known in the art transistor and device formation processing, for example, annealing of ion-cut created defects or activation of dopants and annealing of doping or etching damages, is very small and may lead to only a small amount of shield layer or layers or regions or none to effectively shield the underlying interconnect metallization and dielectrics from the manufacturing processing generated heat. The energy may be supplied by, for example, pulsed and short wavelength optical annealing techniques described herein and incorporated references, and may include the use of optical absorbers and reflectors and optical/thermal shielding and heat spreaders, some of which are described herein and incorporated references.

As illustrated in FIG. 4F, a thermal conduction path may be constructed from the devices in the upper layer, the transferred donor layer and formed transistors, to the acceptor wafer substrate and associated heat sink. The thermal conduction path from the donor wafer device structures 450 to the acceptor wafer heat sink 497 may include second device layer metal interconnect 461, TLVs 460, shield path connect 485, shield path via 483, metal connect pads or strips 480, first (acceptor) layer metal interconnect 491, acceptor wafer transistors and devices 493, and acceptor substrate 495. The elements of the thermal conduction path may include materials that have a thermal conductivity greater than 10 W/m-K, for example, copper (about 400 W/m-K), aluminum (about 237 W/m-K), and Tungsten (about 173 W/m-K), and may include material with thermal conductivity lower than 10 W/m-K but have a high heat transfer capacity due to the wide area available for heat transfer and thickness of the structure (Fourier's Law), such as, for example, acceptor substrate 495. The elements of the thermal conduction path may include materials that are thermally conductive but may not be substantially electrically conductive, for example, Plasma Enhanced Chemical Vapor Deposited Diamond Like Carbon-PECVD DLC (about 1000 W/m-K), and Chemical Vapor Deposited (CVD) graphene (about 5000 W/m-K). The acceptor wafer interconnects may be substantially surrounded by BEOL dielectric 496. In general, within the active device or devices (that are generating the heat that is desired to be conducted away thru at least the thermal conduction path), it would be advantageous to have an effective conduction path to reduce the overall space and area that a designer would allocate for heat transfer out of the active circuitry space and area. A designer may select to use only materials with a high thermal conductivity (such as greater than 10 W/m-K), much higher for example than that for monocrystalline silicon, for the desired thermal conduction path. However, there may need to be lower than desired thermal conductivity materials in the heat conduction path due to requirements such as, for example, the mechanical strength of a thick silicon substrate, or another heat spreader material in the stack. The area and volume allocated to that structure, such as the silicon substrate, is far larger than the active circuit area and volume. Accordingly, since a copper wire of 1 um$^2$ profile is about the same as a 286 um$^2$ profile of a column of silicon, and the thermal conduction path may include both a copper wire/TLV/via and the bulk silicon substrate, a proper design may take into account and strive to align the different elements of the conductive path to achieve effective heat transfer and removal, for example, may attempt to provide about 286 times the silicon substrate area for each Cu thermal via utilized in the thermal conduction path. The heat removal apparatus, which may include acceptor wafer heat sink 497, may include an external surface from which heat transfer may take place by methods such as air cooling, liquid cooling, or attachment to another heat sink or heat spreader structure.

Formation of CMOS in one transferred layer and the orthogonal connect strip methodology may be found as illustrated in at least FIGS. 30-33, 73-80, and 94 and related specification sections of U.S. Pat. No. 8,273,610, and may be applied to at least the FIG. 4 formation techniques.

A planar fully depleted n-channel MOSFET (FD-MOSFET) with an optional integrated heat shield/spreader suitable for a monolithic 3D IC may be constructed as follows. The FD-MOSFET may provide an improved transistor variability control and conduction channel electrostatic control, as well as the ability to utilize an updoped channel, thereby improving carrier mobility. In addition, the FD-MOSFET does not demand doping or pocket implants in the channel to control the electrostatic characteristics and tune the threshold voltages. Sub-threshold slope, DIBL, and other short channel effects are greatly improved due to the firm gate electrostatic control over the channel. Moreover, a heat spreading, heat conducting and/or optically reflecting material layer or layers may be incorporated between the sensitive metal interconnect layers and the layer or regions being optically irradiated and annealed to repair defects in the crystalline 3D-IC layers and regions and to activate semiconductor dopants in the crystalline layers or regions of a 3D-IC without harm to the sensitive metal interconnect and associated dielectrics. FIG. 5A-5H illustrates an exemplary n-channel FD-MOSFET which may be constructed in a 3D stacked layer using procedures outlined below and in U.S. Pat. Nos. 8,273,610 and 8,557,632 and 8,581,349. The contents of the foregoing applications are incorporated herein by reference.

As illustrated in FIG. 5A, a P-substrate donor wafer 500 may be processed to include a wafer sized layer of doping across the wafer. The channel layer 502 may be formed by ion implantation and thermal anneal. P-substrate donor wafer 500 may include a crystalline material, for example, mono-crystalline (single crystal) silicon. P-substrate donor wafer 500 may be very lightly doped (less than 1e15 atoms/cm$^3$) or nominally un-doped (less than 1e14 atoms/cm$^3$). Channel layer 502 may have additional ion implantation and anneal processing to provide a different dopant level than P-substrate donor wafer 500 and may have graded or various layers of doping concentration. The layer stack may alternatively be formed by epitaxially deposited doped or undoped silicon layers, or by a combination of epitaxy and implantation, or by layer transfer. Annealing of implants and doping may include, for example, conductive/inductive thermal, optical annealing techniques or types of Rapid Thermal Anneal (RTA or spike). The preferred crystalline channel layer 502 will be undoped to eventually create an FD-MOSFET transistor with an updoped conduction channel.

As illustrated in FIG. 5B, the top surface of the P-substrate donor wafer 500 layer stack may be prepared for oxide wafer bonding with a deposition of an oxide or by thermal oxidation of channel layer 502 to form oxide layer 580. A layer transfer demarcation plane (shown as dashed line) 599 may be formed by hydrogen implantation or other methods as described in the incorporated references. The P-substrate donor wafer 500, such as surface 582, and acceptor wafer 510 may be prepared for wafer bonding as previously described and low temperature (less than approximately 400° C.) bonded. Acceptor wafer 510, as described in the incorporated references, may include, for example, transistors, circuitry, and metal, such as, for example, aluminum or copper, interconnect wiring, a metal shield/heat sink layer or layers, and thru layer via metal interconnect strips or pads. Acceptor wafer 510 may be substantially comprised of a crystalline material, for example mono-crystalline silicon or germanium, or may be an engineered substrate/wafer such as, for example, an SOI (Silicon on Insulator) wafer or GeOI (Germanium on Insulator) substrate. Acceptor wafer 510 may include transistors such as, for example, MOSFETS, FD-MOSFETS, FinFets, FD-RCATs, BJTs, HEMTs, and/or HBTs. The portion of the channel layer 502 and the P-substrate donor wafer 500 that may be above (when the layer stack is flipped over and bonded to the acceptor wafer 510) the layer transfer demarcation plane 599 may be removed by cleaving or other low temperature processes as described in the incorporated references, such as, for example, ion-cut with mechanical or thermal cleave or other layer transfer methods, thus forming remaining channel layer 503. Damage/defects to crystalline structure of channel layer 502 may be annealed by some of the annealing methods described, for example the short wavelength pulsed laser techniques, wherein the channel layer 502 or portions of channel layer 502 may be heated to defect annealing temperatures, but the layer transfer demarcation plane 599 may be kept below the temperate for cleaving and/or significant hydrogen diffusion. The optical energy may be deposited in the upper layer of the stack, for example near surface 582, and annealing of a portion of channel layer 502 may take place via heat diffusion.

Figure 5C:
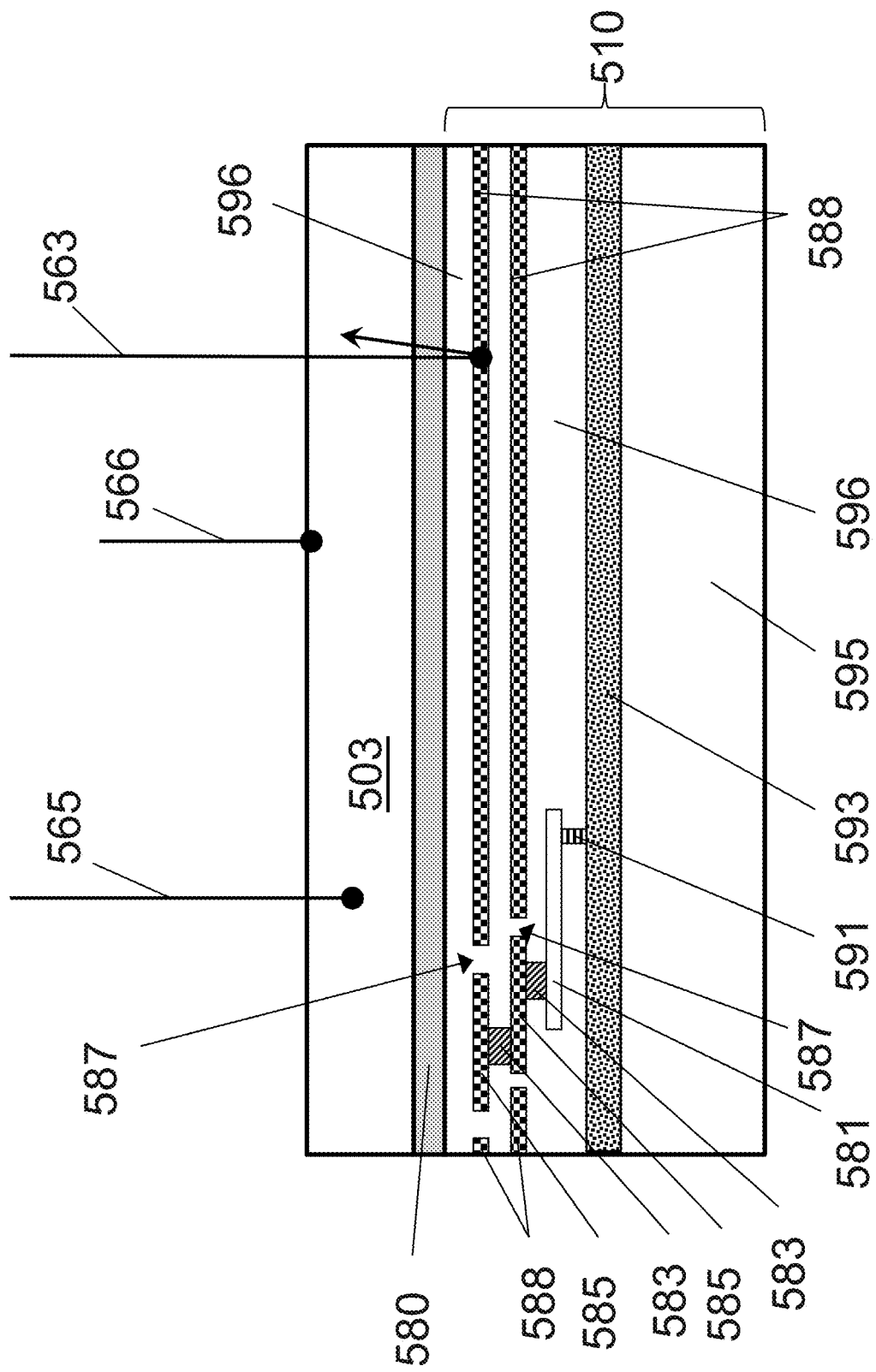

As illustrated in FIG. 5C, oxide layer 580 and remaining channel layer 503 have been layer transferred to acceptor wafer 510. The top surface of remaining channel layer 503 may be chemically or mechanically polished, and/or may be thinned by low temperature oxidation and strip processes, such as the TEL SPA tool radical oxidation and HF:H$_2$O solutions as described herein and in referenced patents and patent applications. Thru the processing, the wafer sized layer remaining channel layer 503 could be thinned from its original total thickness, and its final total thickness could be in the range of about 5 nm to about 20 nm, for example, 5 nm, 7 nm, 10 nm, 12 nm, 15 nm, or 20 nm. Remaining channel layer 503 may have a thickness and doping that may allow fully-depleted channel operation when the FD-MOSFET transistor is substantially completely formed. Acceptor wafer 510 may include one or more (two are shown in this example) shield/heat sink layers 588, which may include materials such as, for example, Aluminum, Tungsten (a refractory metal), Copper, silicon or cobalt based silicides, or forms of carbon such as carbon nanotubes. Each shield/heat sink layer 588 may have a thickness range of about 50 nm to about 1 mm, for example, 50 nm, 100 nm, 200 nm, 300 nm, 500 nm, 0.1 um, 1 um, 2 um, and 10 um. Shield/heat sink layer 588 may include isolation openings 587, and alignment mark openings (not shown), which may be utilized for short wavelength alignment of top layer (donor) processing to the acceptor wafer alignment marks (not shown). Shield/heat sink layer 588 may include one or more shield path connects 585 and shield path vias 583. Shield path via 583 may thermally and/or electrically couple and connect shield path connect 585 to acceptor wafer 510 interconnect metallization layers such as, for example, exemplary acceptor metal interconnect 581 (shown). Shield path connect 585 may also thermally and/or electrically couple and connect each shield/heat sink layer 588 to the other and to acceptor wafer 510 interconnect metallization layers such as, for example, acceptor metal interconnect 581, thereby creating a heat conduction path from the shield/heat sink layer 588 to the acceptor substrate 595, and a heat sink (shown in FIG. 5G.). Isolation openings 587 may include dielectric materials, similar to those of BEOL isolation 596. Acceptor wafer 510 may include first (acceptor) layer metal interconnect 591, acceptor wafer transistors and devices 593, and acceptor substrate 595. Various topside defect anneals may be utilized. For this illustration, an optical beam such as the laser annealing previously described is used. Optical anneal beams may be optimized to focus light absorption and heat generation within or at the surface of remaining channel layer 503 and provide surface smoothing and/or defect annealing (defects may be from the cleave and/or the ion-cut implantation) with exemplary smoothing/annealing ray 566. The laser assisted smoothing/annealing with the absorbed heat generated by exemplary smoothing/annealing ray 566 may also include a pre-heat of the bonded stack to, for example, about 100° C. to about 400° C., and/or a rapid thermal spike to temperatures above about 200° C. to about 600° C. Additionally, absorber layers or regions, for example, including amorphous carbon, amorphous silicon, and phase changing materials (see U.S. Pat. Nos. 6,635,588 and 6,479,821 to Hawryluk et al. for example), may be utilized to increase the efficiency of the optical energy capture in conversion to heat for the desired annealing or activation processes. Moreover, multiple pulses of the laser may be utilized to improve the anneal, activation, and yield of the process. Reflected ray 563 may be reflected and/or absorbed by shield/heat sink layer 588 regions thus blocking the optical absorption of ray blocked metal interconnect 581. Annealing of dopants or annealing of damage, such as from the H cleave implant damage, may be also accomplished by a set of rays such as repair ray 565. Heat generated by absorbed photons from, for example, smoothing/annealing ray 566, reflected ray 563, and/or repair ray 565 may also be absorbed by shield/heat sink layer 588 regions and dissipated laterally and may keep the temperature of underlying metal layers, such as metal interconnect 581, and other metal layers below it, cooler and prevent damage. Shield/heat sink layer 588 and associated dielectrics may laterally spread and conduct the heat generated by the topside defect anneal, and in conjunction with the dielectric materials (low heat conductivity) above and below shield/heat sink layer 588, keep the interconnect metals and low-k dielectrics of the acceptor wafer interconnect layers cooler than a damage temperature, such as, for example, 400° C. A second layer of shield/heat sink layer 588 may be constructed (shown) with a low heat conductive material sandwiched between the two heat sink layers, such as silicon oxide or carbon doped 'low-k' silicon oxides, for improved thermal protection of the acceptor wafer interconnect layers, metal and dielectrics. Shield/heat sink layer 588 may act as a heat spreader. Electrically conductive materials may be used for the two layers of shield/heat sink layer 588 and thus may provide, for example, a Vss and a Vdd plane that may be connected to the donor layer transistors above, as well may be connected to the acceptor wafer transistors below, and/or may provide below transferred layer device interconnection. Shield/heat sink layer 588 may include materials with a high thermal conductivity greater than 10 W/m-K, for example, copper (about 400 W/m-K), aluminum (about 237 W/m-K), Tungsten (about 173 W/m-K), Plasma Enhanced Chemical Vapor Deposited Diamond Like Carbon-PECVD DLC (about 1000 W/m-K), and Chemical Vapor Deposited (CVD) graphene (about 5000 W/m-K). Shield/heat sink layer 588 may be sandwiched and/or substantially enclosed by materials with a low thermal conductivity (less than 10 W/m-K), for example, silicon dioxide (about 1.4 W/m-K). The sandwiching of high and low thermal conductivity materials in layers, such as shield/heat sink layer 588 and under & overlying dielectric layers, spreads the localized heat/light energy of the topside anneal laterally and protects the underlying layers of interconnect metallization & dielectrics, such as in the acceptor wafer 510, from harmful temperatures or damage. When there may be more than one shield/heat sink layer 588 in the device, the heat conducting layer closest to the second crystalline layer or oxide layer 580 may be constructed with a different material, for example a high melting point material, for example a refractory metal such as tungsten, than the other heat conducting layer or layers, which may be constructed with, for example, a lower melting point material, for example, such as aluminum or copper. Now transistors may be formed with low effective temperature (less than approximately 400° C. exposure to the acceptor wafer 510 sensitive layers, such as interconnect and device layers) processing, and may be aligned to the acceptor wafer alignment marks (not shown) as described in the incorporated references. This may include further optical defect annealing or dopant activation steps. The donor wafer 500 may now also be processed, such as smoothing and annealing, and reused for additional layer transfers. The insulator layer, such as deposited bonding oxides (for example oxide layer 580) and/or before bonding preparation existing oxides (for example the BEOL isolation 596 on top of the topmost metal layer of shield/heat sink layer 588), between the donor wafer transferred monocrystalline layer and the acceptor wafer topmost metal layer, may include thicknesses of less than 1 m, less than 500 nm, less than 400 nm, less than 300 nm, less than 200 nm, or less than 100 nm.

Figure 5D:
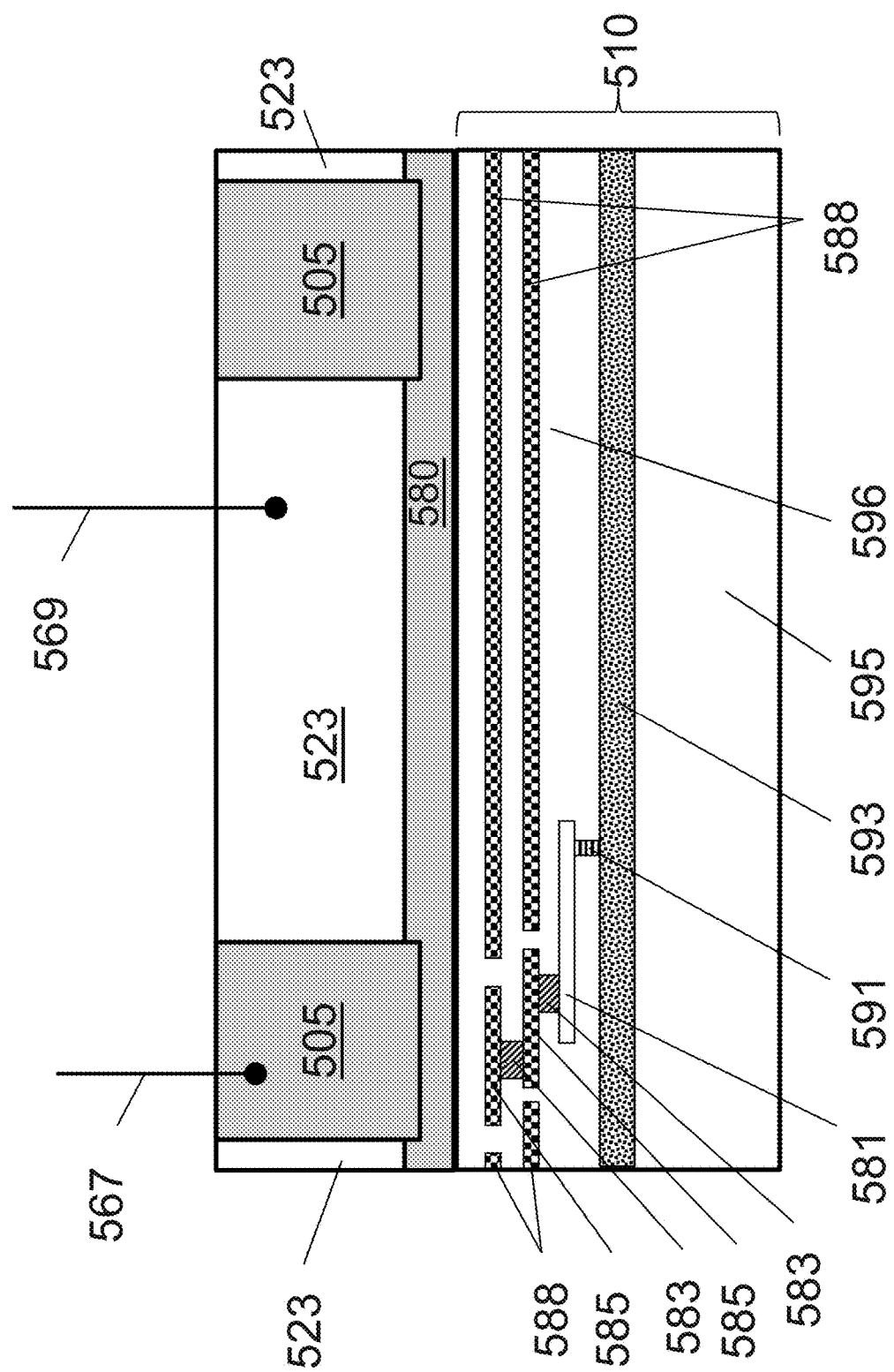

As illustrated in FIG. 5D, transistor isolation regions 505 may be formed by mask defining and plasma/RIE etching remaining channel layer 503 substantially to the top of oxide layer 580 (not shown), substantially into oxide layer 580, or into a portion of the upper oxide layer of acceptor wafer 510 (not shown). Thus channel region 523 may be formed, which may substantially form the transistor body. A low-temperature gap fill dielectric, such as SACVD oxide, may be deposited and chemically mechanically polished, the oxide remaining in isolation regions 505. An optical step, such as illustrated by exemplary STI ray 567, may be performed to anneal etch damage and densify the STI oxide in isolation regions 505. The doping concentration of the channel region 523 may include gradients of concentration or layers of differing doping concentrations. Any additional doping, such as ion-implanted channel implants, may be activated and annealed with optical annealing, such as illustrated by exemplary implant ray 569, as described herein. The optical anneal, such as exemplary STI ray 567, and/or exemplary implant ray 569 may be performed at separate times and processing parameters (such as laser energy, frequency, etc.) or may be done in combination or as one optical anneal. Optical absorber and or reflective layers or regions may be employed to enhance the anneal and/or protect the underlying sensitive structures. Moreover, multiple pulses of the laser may be utilized to improve the anneal, activation, and yield of the process.

Figure 5E:
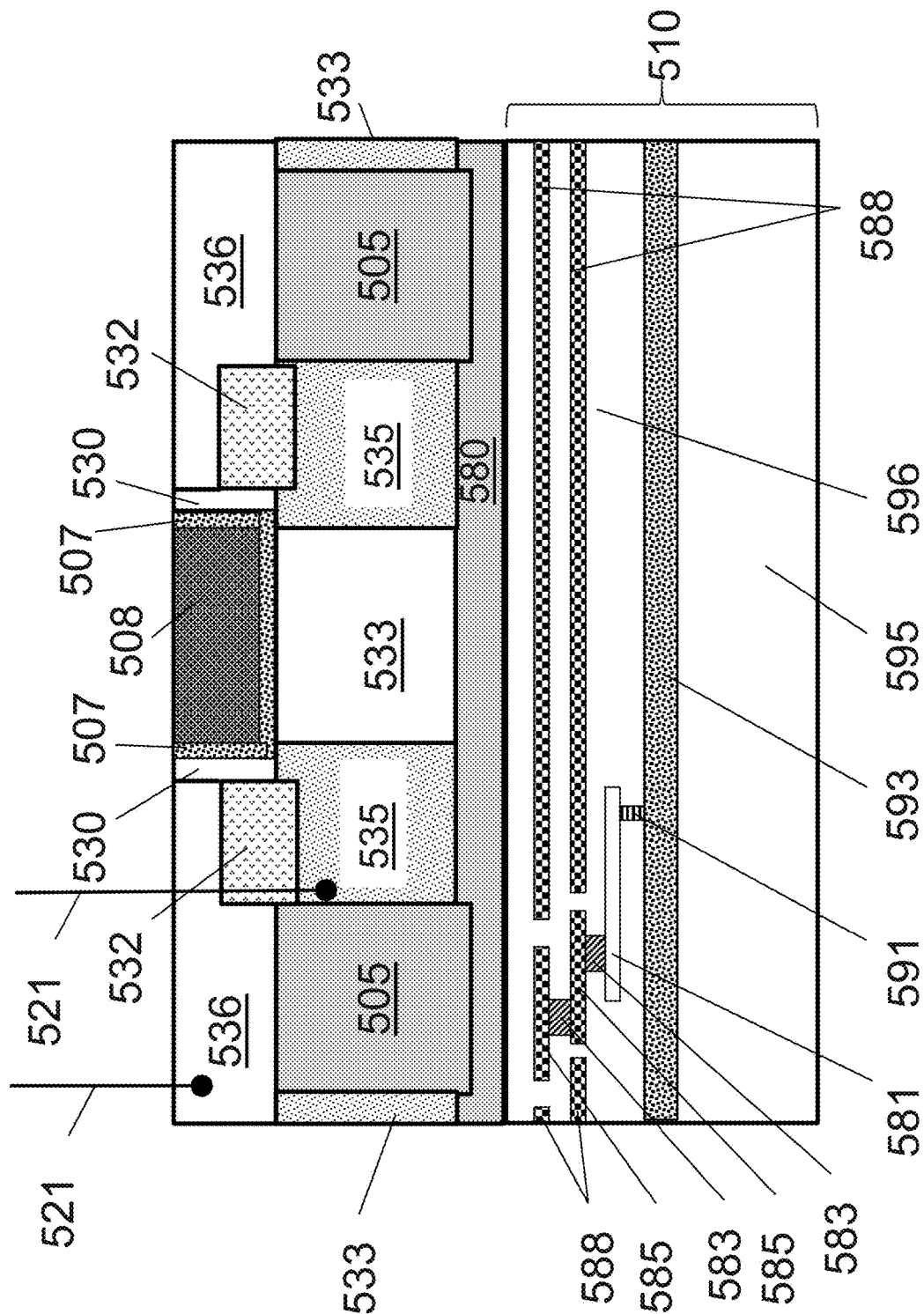

As illustrated in FIG. 5E, a transistor forming process, such as a conventional HKMG with raised source and drains (S/D), may be performed. For example, a dummy gate stack (not shown), utilizing oxide and polysilicon, may be formed, gate spacers 530 may be formed, raised S/D regions 532 and channel stressors may be formed by etch and epitaxial deposition, for example, of SiGe and/or SiC depending on P or N channel, LDD and S/D ion-implantations may be performed, and first ILD 536 may be deposited and CMP'd to expose the tops of the dummy gates. Thus transistor channel 533 and S/D & LDD regions 535 may be formed. The dummy gate stack may be removed and a gate dielectric 507 may be formed and a gate metal material gate electrode 508, including a layer of proper work function metal ($Ti_xAl_y$, $N_z$ for example) and a conductive fill, such as aluminum, and may be deposited and CMP'd. The gate dielectric 507 may be an atomic layer deposited (ALD) gate dielectric that may be paired with a work function specific gate metal in the industry standard high k metal gate process schemes, for example, as described in the incorporated references. Alternatively, the gate dielectric 507 may be formed with a low temperature processes including, for example, LPCVD $SiO_2$ oxide deposition (see Ahn, J., et al., "High-quality MOSFET's with ultrathin LPCVD gate SiO2," IEEE Electron Device Lett., vol. 13, no. 4, pp. 186-188, April 1992) or low temperature microwave plasma oxidation of the silicon surfaces (see Kim, J. Y., et al., "The excellent scalability of the RCAT (recess-channel-array-transistor) technology for sub-70 nm DRAM feature size and beyond," 2005 IEEE VLSI-TSA International Symposium, pp. 4-5, 25-27 April 2005) and a gate material with proper work function and less than approximately 400° C. deposition temperature such as, for example, tungsten or aluminum may be deposited. An optical step, such as represented by exemplary anneal ray 521, may be performed to densify and/or remove defects from gate dielectric 507, anneal defects and activate dopants such as LDD and S/D implants, densify the first ILD 536, and/or form contact and S/D silicides (not shown). The optical anneal may be performed at each sub-step as desired, or may be done at prior to the HKMG deposition, or various combinations. Moreover, multiple pulses of the laser may be utilized to improve the anneal, activation, and yield of the process.

Figure 5F:
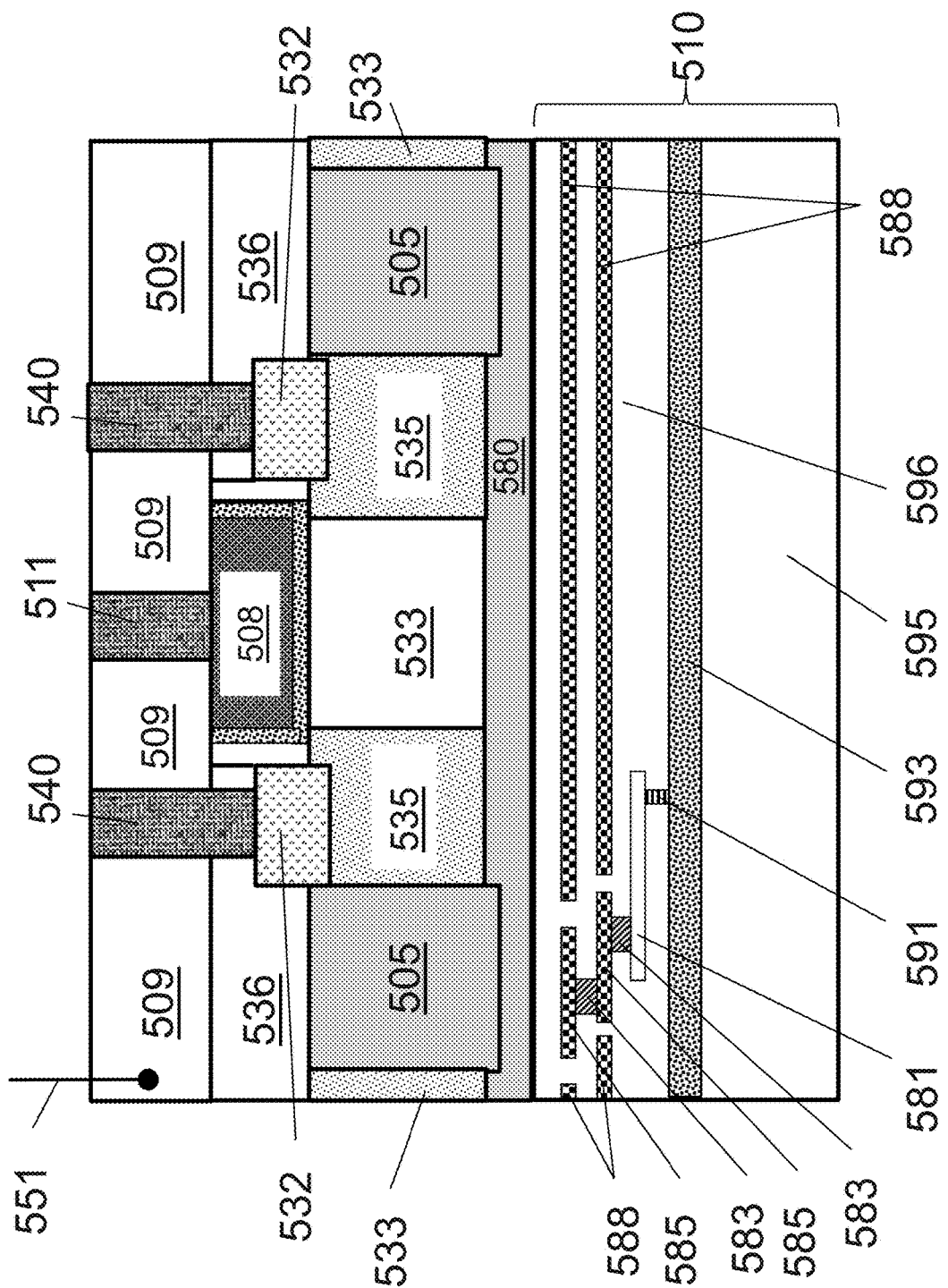

As illustrated in FIG. 5F, a low temperature thick oxide 509 may be deposited and planarized Source, gate, and drain contacts openings may be masked and etched preparing the transistors to be connected via metallization. Thus gate contact 511 connects to gate electrode 508, and source & drain contacts 540 connect to raised S/D regions 532. An optical step, such as illustrated by exemplary ILD anneal ray 551, may be performed to anneal contact etch damage and densify the thick oxide 509.

Figure 5G:
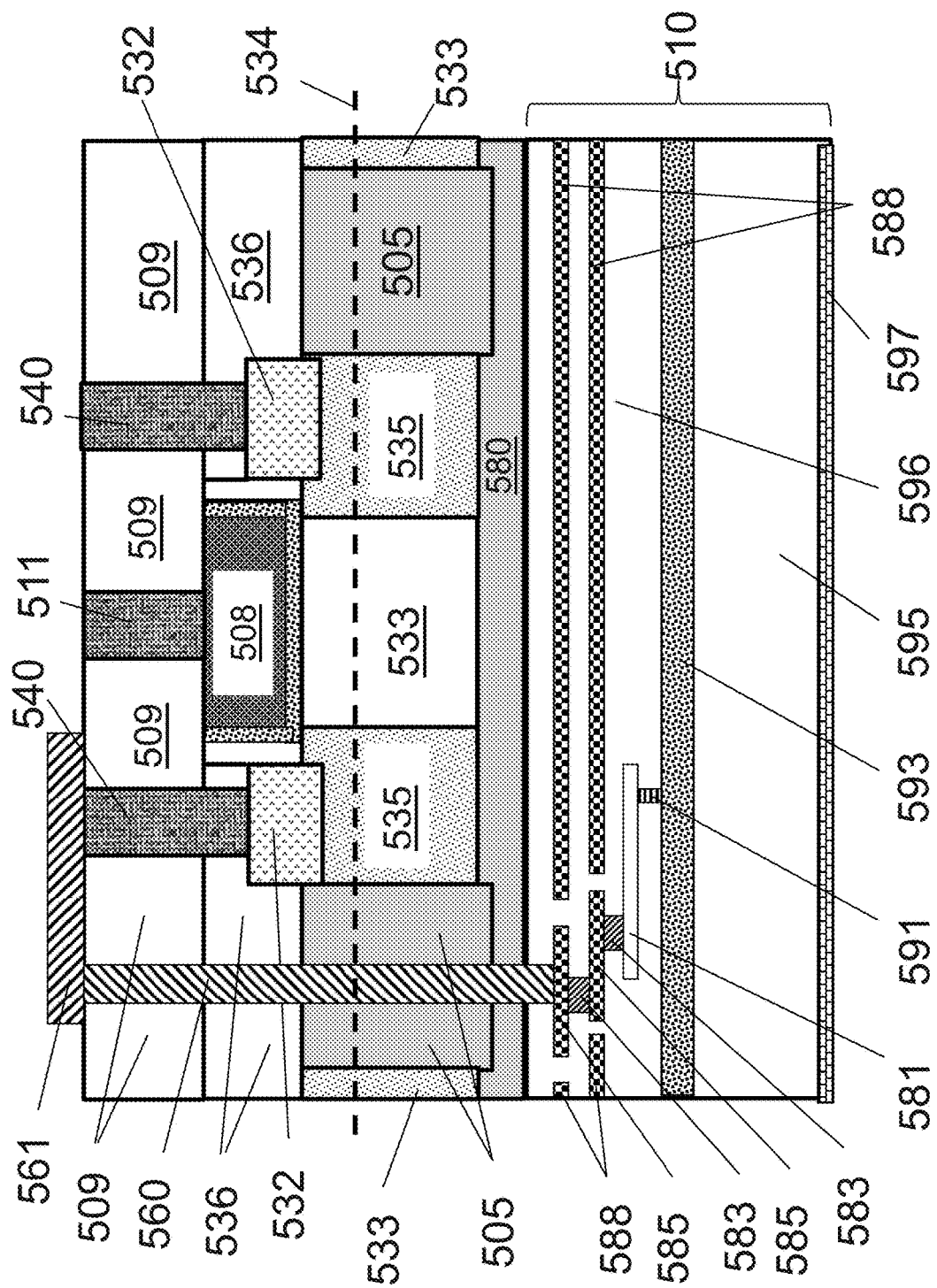

As illustrated in FIG. 5G, thru layer vias (TLVs) 560 may be formed by etching thick oxide 509, first ILD 536, isolation regions 505, oxide layer 580, into a portion of the upper oxide layer BEOL isolation 596 of acceptor wafer 510 BEOL, and filling with an electrically and thermally conducting material (such as tungsten or cooper) or an electrically non-conducting but thermally conducting material (such as described elsewhere within). Second device layer metal interconnect 561 may be formed by conventional processing. TLVs 560 may be constructed of thermally conductive but not electrically conductive materials, for example, DLC (Diamond Like Carbon), and may connect the FD-MOSFET transistor device and other devices on the top (second) crystalline layer thermally to shield/heat sink layer 588. TLVs 560 may be constructed out of electrically and thermally conductive materials, such as Tungsten, Copper, or aluminum, and may provide a thermal and electrical connection path from the FD-MOSFET transistor device and other devices on the top (second) crystalline layer to shield/heat sink layer 588, which may be a ground or Vdd plane in the design/layout. TLVs 560 may be also constructed in the device scribelanes (pre-designed in base layers or potential dicelines) to provide thermal conduction to the heat sink, and may be sawed/diced off when the wafer is diced for packaging not shown). Shield/heat sink layer 588 may be configured to act (or adapted to act) as an emf (electromotive force) shield to prevent direct layer to layer crosstalk between transistors in the donor wafer layer and transistors in the acceptor wafer. In addition to static ground or Vdd biasing, shield/heat sink layer 588 may be actively biased with an anti-interference signal from circuitry residing on, for example, a layer of the 3D-IC or off chip. The formed FD-MOSFET transistor device may include semiconductor regions wherein the dopant concentration of neighboring regions of the transistor in the horizontal plane, such as traversed by exemplary dopant plane 534, may have regions, for example, transistor channel 533 and S/D & LDD regions 535, that differ substantially in dopant concentration, for example, a 10 times greater doping concentration in S/D & LDD regions 535 than in transistor channel 533, and/or may have a different dopant type, such as, for example p-type or n-type dopant, and/or may be doped and substantially undoped in the neighboring regions. For example, transistor channel 533 may be very lightly doped (less than 1e15 atoms/cm$^3$) or nominally un-doped (less than 1e14 atoms/cm$^3$) and S/D & LDD regions 535 may be doped at greater than 1e15 atoms/cm$^3$ or greater than 1e16 atoms/cm$^3$. For example, transistor channel 533 may be doped with p-type dopant and S/D & LDD regions 535 may be doped with n-type dopant.

A thermal conduction path may be constructed from the devices in the upper layer, the transferred donor layer and formed transistors, to the acceptor wafer substrate and associated heat sink. The thermal conduction path from the FD-MOSFET transistor device and other devices on the top (second) crystalline layer, for example, raised S/D regions 532, to the acceptor wafer heat sink 597 may include source & drain contacts 540, second device layer metal interconnect 561, TLV 560, shield path connect 585 (shown as twice), shield path via 583 (shown as twice), metal interconnect 581, first (acceptor) layer metal interconnect 591, acceptor wafer transistors and devices 593, and acceptor substrate 595. The elements of the thermal conduction path may include materials that have a thermal conductivity greater than 10 W/m-K, for example, copper (about 400 W/m-K), aluminum (about 237 W/m-K), and Tungsten (about 173 W/m-K), and may include material with thermal conductivity lower than 10 W/m-K but have a high heat transfer capacity due to the wide area available for heat transfer and thickness of the structure (Fourier's Law), such as, for example, acceptor substrate 595. The elements of the thermal conduction path may include materials that are thermally conductive but may not be substantially electrically conductive, for example, Plasma Enhanced Chemical Vapor Deposited Diamond Like Carbon-PECVD DLC (about 1000 W/m-K), and Chemical Vapor Deposited (CVD) graphene (about 5000 W/m-K). The acceptor wafer interconnects may be substantially surrounded by BEOL isolation 596 dielectric. The heat removal apparatus, which may include acceptor wafer heat sink 597, may include an external surface from which heat transfer may take place by methods such as air cooling, liquid cooling, or attachment to another heat sink or heat spreader structure.

Furthermore, some or all of the layers utilized as shield/heat sink layer 588, which may include shapes of material such as the strips or fingers as illustrated in FIG. 4G, may be driven by a portion of the second layer transistors and circuits (within the transferred donor wafer layer or layers) or the acceptor wafer transistors and circuits, to provide a programmable back-bias to at least a portion of the second layer transistors. The programmable back bias may utilize a circuit to do so, for example, such as shown in FIG. 17B of U.S. Pat. No. 8,273,610, the contents incorporated herein by reference; wherein the 'Primary' layer may be the second layer of transistors for which the back-bias is being provided, the 'Foundation' layer could be either the second layer transistors (donor) or first layer transistors (acceptor), and the routing metal lines connections 1723 and 1724 may include portions of the shield/heat sink layer 588 layer or layers. Moreover, some or all of the layers utilized as shield/heat sink layer 588, which may include strips or fingers as illustrated in FIG. 4G, may be driven by a portion of the second layer transistors and circuits (within the transferred donor wafer layer or layers) or the acceptor wafer transistors and circuits to provide a programmable power supply to at least a portion of the second layer transistors. The programmable power supply may utilize a circuit to do so, for example, such as shown in FIG. 17C of U.S. Pat. No. 8,273,610, the contents incorporated herein by reference; wherein the 'Primary' layer may be the second layer of transistors for which the programmable power supplies are being provided to, the 'Foundation' layer could be either the second layer transistors (donor) or first layer transistors (acceptor), and the routing metal line connections from Vout to the various second layer transistors may include portions of the shield/heat sink layer 588 layer or layers. The Vsupply on line 17C12 and the control signals on control line 17C16 may be controlled by and/or generated in the second layer transistors (for example donor wafer device structures such as the FD-MOSFETs formed as described in relation to FIG. 5) or first layer transistors (acceptor, for example acceptor wafer transistors and devices 593), or off chip circuits. Furthermore, some or all of the layers utilized as shield/heat sink layer 588, which may include strips or fingers as illustrated in FIG. 4G or other shapes such as those in FIG. 4B, may be utilized to distribute independent power supplies to various portions of the second layer transistors (for example donor wafer device structures such as the FD-MOSFETs formed as described in relation to FIG. 5) or first layer transistors (acceptor, for example acceptor wafer transistors and devices 593) and circuits; for example, one power supply and/or voltage may be routed to the sequential logic circuits of the second layer and a different power supply and/or voltage routed to the combinatorial logic circuits of the second layer. Patterning of shield/heat sink layer 588 or layers can impact their heat-shielding capacity. This impact may be mitigated, for example, by enhancing the top shield/heat sink layer 588 areal density, creating more of the secondary shield/heat sink layers 588, or attending to special CAD rules regarding their metal density, similar to CAD rules that are required to accommodate Chemical-Mechanical Planarization (CMP). These constraints would be integrated into a design and layout EDA tool.

TLVs 560 may be formed through the transferred layers. As the transferred layers may be thin, on the order of about 200 nm or less in thickness, the TLVs may be easily manufactured as a typical metal to metal via may be, and said TLV may have state of the art diameters such as nanometers or tens to a few hundreds of nanometers, such as, for example about 150 nm or about 100 nm or about 50 nm. The thinner the transferred layers, the smaller the thru layer via diameter obtainable, which may result from maintaining manufacturable via aspect ratios. The thickness of the layer or layers transferred according to some embodiments of the invention may be designed as such to match and enable the most suitable obtainable lithographic resolution (and enable the use of conventional state of the art lithographic tools), such as, for example, less than about 10 nm, 14 nm, 22 nm or 28 nm linewidth resolution and alignment capability, such as, for example, less than about 5 nm, 10 nm, 20 nm, or 40 nm alignment accuracy/precision/error, of the manufacturing process employed to create the thru layer vias or any other structures on the transferred layer or layers.

Figure 5H:
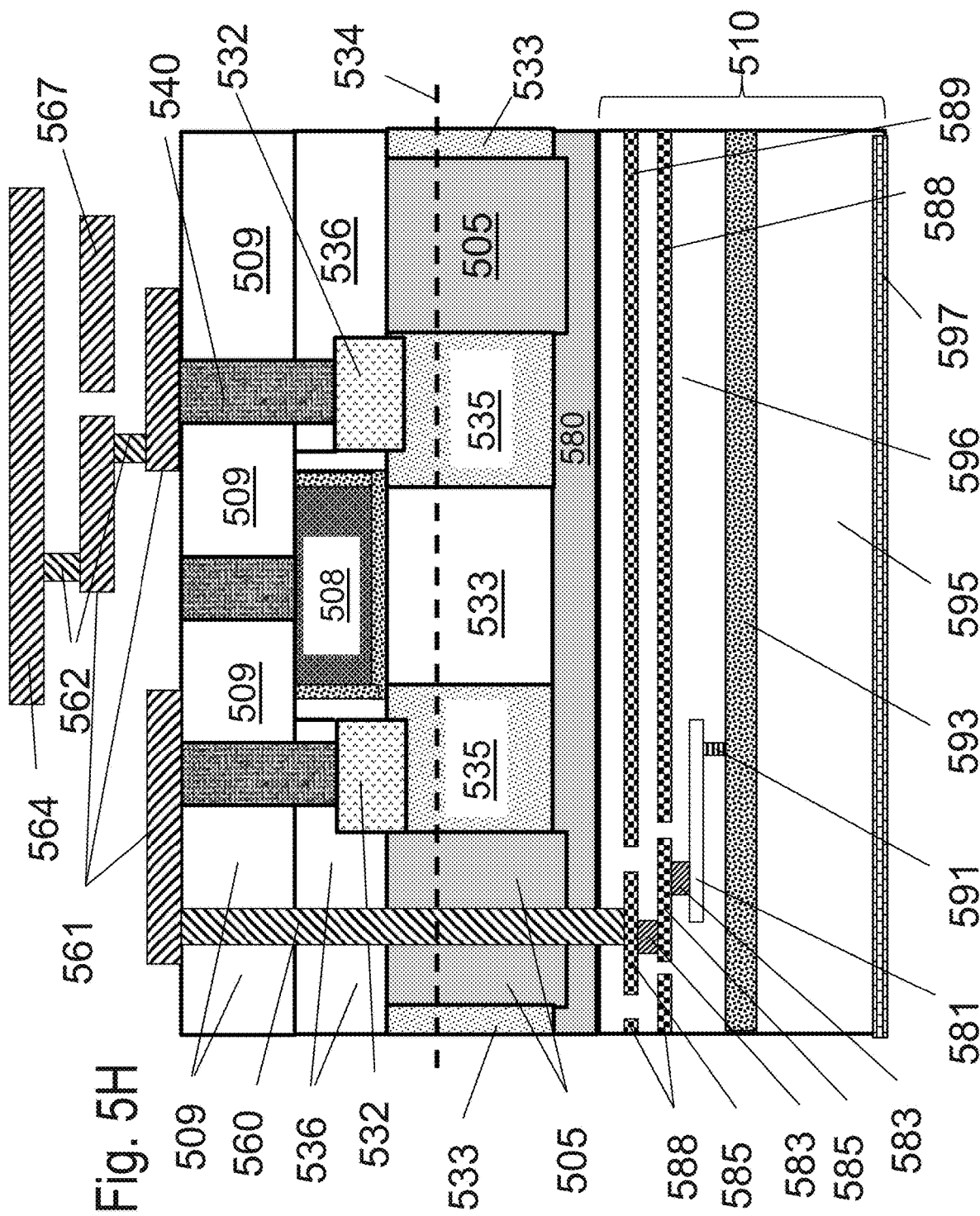

As illustrated in FIG. 5H, at least one conductive bond pad 564 for interfacing electrically (and may thermally) to external devices may be formed on top of the completed device and may include at least one metal layer of second device layer metal interconnect 561. Bond pad 564 may overlay second device layer metal interconnect 561 or a portion of (some of the metal and insulator layers of) second device layer metal interconnect 561. Bond pad 564 may be directly aligned to the acceptor wafer alignment marks (not shown) and the I/O driver circuitry may be formed by the second layer (donor) transistors, for example, donor wafer device structures such as the FD-MOSFETs formed as described in relation to FIG. 5. Bond pad 564 may be connected to the second layer transistors thru the second device layer metal interconnect 561 which may include vias 562. The I/O driver circuitry may be formed by transistors from the acceptor wafer transistors and devices 593, or from transistors in other strata if the 3DIC device has more than two layers of transistors. I/O pad control metal segment 567 may be formed directly underneath bond pad 564 and may influence the noise and ESD (Electro Static Discharge) characteristics of bond pad 564. The emf influence of I/O pad control metal segment 567 may be controlled by circuitry formed from a portion of the second layer transistors. I/O pad control metal segment 567 may be formed with second device layer metal interconnect 561. Furthermore, metal segment 589 of the topmost shield/heat sink layer 588 may be used to influence the FD-MOSFET transistor or transistors above it by emf, and influence the noise and ESD (Electro Static Discharge) characteristics of bond pad 564. Metal segment 589 may be controlled by second layer (donor) transistors, for example, donor wafer device structures such as the FD-MOSFETs formed as described in relation to FIG. 5 and/or by transistors from the acceptor wafer transistors and devices 593, or from transistors in other strata if the 3DIC device has more than two layers of transistors.

Formation of CMOS in one transferred layer and the orthogonal connect strip methodology may be found as illustrated in at least FIGS. 30-33, 73-80, and 94 and related specification sections of U.S. Pat. No. 8,273,610, and may be applied to at least the FIG. 5 formation techniques herein.

Persons of ordinary skill in the art will appreciate that the illustrations in FIGS. 5A through 5H are exemplary only and are not drawn to scale. Such skilled persons will further appreciate that many variations are possible such as, for example, a p-channel FD-MOSFET may be formed with changing the types of dopings appropriately. Moreover, the P-substrate donor wafer 500 may be n type or un-doped. Furthermore, isolation regions 505 may be formed by a hard mask defined process flow, wherein a hard mask stack, such as, for example, silicon oxide and silicon nitride layers, or silicon oxide and amorphous carbon layers, may be utilized. Moreover, CMOS FD MOSFET s may be constructed with n-MOSFETs in a first mono-crystalline silicon layer and p-MOSFET s in a second mono-crystalline layer, which may include different crystalline orientations of the mono-crystalline silicon layers, such as for example, <100>, <111> or <551>, and may include different contact silicides for optimum contact resistance to p or n type source, drains, and gates. Further, dopant segregation techniques (DST) may be utilized to efficiently modulate the source and drain Schottky barrier height for both p and n type junctions formed. Furthermore, raised source and drain contact structures, such as etch and epi SiGe and SiC, may be utilized for strain and contact resistance improvements and the damage from the processes may be optically annealed. Many other modifications within the scope of the invention will suggest themselves to such skilled persons after reading this specification. Thus the invention is to be limited only by the appended claims.

In many applications it is desired to use a combination of N type transistors and P type transistors. While using two overlaid layers, at least one layer of P type transistors on top of at least one layer of N type transistors, has been previously described herein and n referenced patent applications, it might be desired to have those transistors connected by the same overlaying interconnection layers coupling to one transistor layer. In U.S. Pat. No. 8,273,610, the contents of which are incorporated herein by reference, there are at least two flows to provide such. The flows could be adapted to vertical transistors just as well. The first flow suggests using repeating rows of N type and P type and is detailed in at least FIGS. 20-35 and FIGS. 73-79 of U.S. Pat. No. 8,273,610. An alternative flow suggests using layers within the strata in a vertical manner, and is described in at least FIG. 95 of U.S. Pat. No. 8,273,610.

While concepts in this document have been described with respect to 3D-ICs with two stacked device layers, those of ordinary skill in the art will appreciate that it can be valid for 3D-ICs with more than two stacked device layers. Additionally, some of the concepts may be applied to 2D ICs.

An additional embodiment of the invention is to utilize the underlying interconnection layer or layers to provide connections and connection paths (electrical and/or thermal) for the overlying transistors. While the common practice in the IC industry is that interconnection layers are overlaying the transistors that they connect, the 3D IC technology may include the possibility of constructing connections underneath (below) the transistors as well. For example, some of the connections to, from, and in-between transistors in a layer of transistors may be provided by the interconnection layer or layers above the transistor layer; and some of the connections to, from, and in-between the transistors may be provided by the interconnection layer or layers below the transistor layer or layers. In general there is an advantage to have the interconnect closer to the transistors that they are connecting and using both sides of the transistors—both above and below—provides enhanced "closeness" to the transistors. In addition, there may be less interconnect routing congestion that would impede the efficient or possible connection of a transistor to transistors in other layers and to other transistors in the same layer.

The connection layers may, for example, include power delivery, heat removal, macro-cell connectivity, and routing between macro-cells.

One method to solve the issue of high-temperature source-drain junction processing is to make transistors without junctions i.e. Junction-Less Transistors (JLTs). An embodiment of this invention uses JLTs as a building block for 3D stacked semiconductor circuits and chips.

FIG. 6 shows a schematic of a junction-less transistor (JLT) also referred to as a gated resistor or nano-wire. A heavily doped silicon layer (typically above $1\times10^{19}/cm^3$, but can be lower as well) forms source 0604, drain 0602 as well as channel region of a JLT. A gate electrode 0606 and a gate dielectric 0608 are present over the channel region of the JLT. The JLT has a very small channel area (typically less than 20 nm on one side), so the gate can deplete the channel of charge carriers at 0V and turn it off. I-V curves of n channel (0612) and p channel (0610) junction-less transistors are shown in FIG. 6 as well. These indicate that the JLT can show comparable performance to a tri-gate transistor that is commonly researched by transistor developers. Further details of the JLT can be found in "Junctionless multigate field-effect transistor," Appl. Phys. Lett., vol. 94, pp. 053511 2009 by C.-W. Lee, A. Afzalian, N. Dehdashti Akhavan, R. Yan, I. Ferain and J. P. Colinge ("C-W. Lee"). Contents of this publication are incorporated herein by reference.

FIGS. 7A-M describe an alternative process flow to construct a horizontally-oriented monolithic 3D DRAM. This monolithic 3D DRAM utilizes the floating body effect and double-gate transistors. One mask is utilized on a "per-memory-layer" basis for the monolithic 3D DRAM concept shown in FIG. 7A-M, while other masks are shared between different layers. The process flow may include several steps that occur in the following sequence.

Figure 7A:
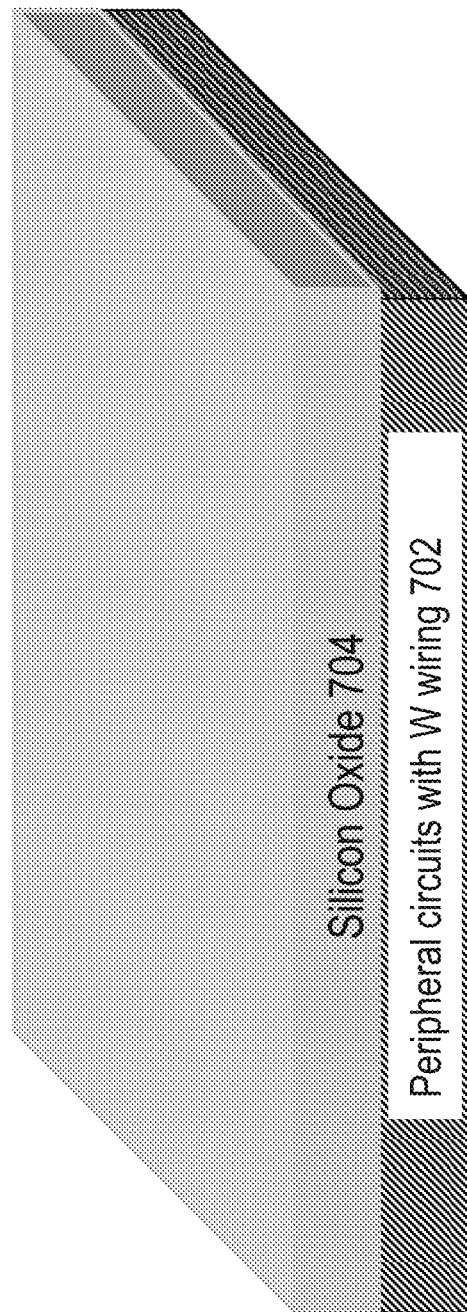

Step (A): Peripheral circuits 702 with tungsten wiring are first constructed and above this oxide layer 704 is deposited. FIG. 7A illustrates the structure after Step (A).

Figure 7B:
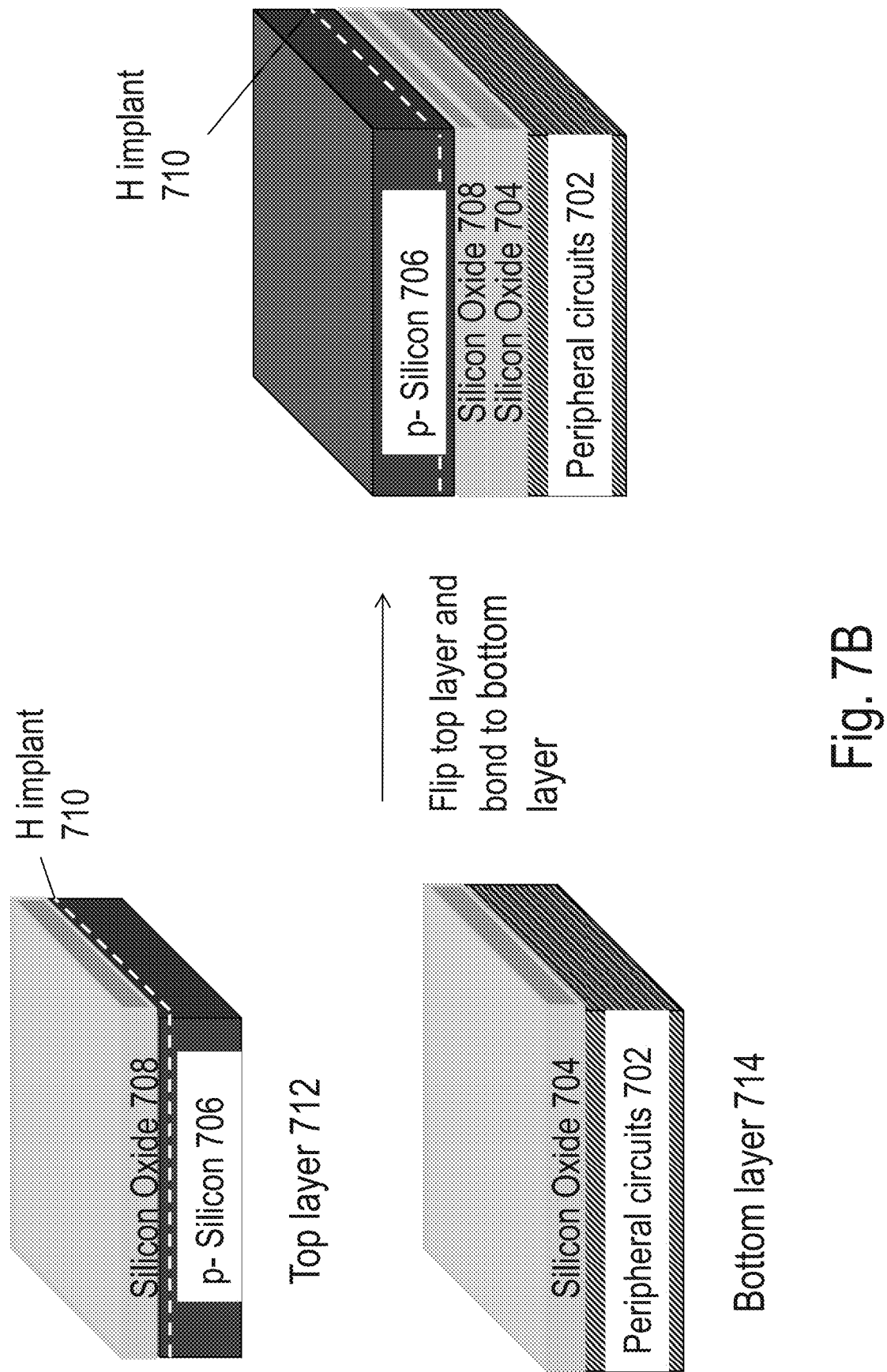

Step (B): FIG. 7B shows a drawing illustration after Step (B). A p− Silicon wafer 706 has an oxide layer 708 grown or deposited above it. Following this, hydrogen is implanted into the p− Silicon wafer at a certain depth indicated by 710. Alternatively, some other atomic species such as Helium could be (co-)implanted. This hydrogen implanted p− Silicon wafer 706 forms the top layer 712. The bottom layer 714 may include the peripheral circuits 702 with oxide layer 704. The top layer 712 is flipped and bonded to the bottom layer 714 using oxide-to-oxide bonding.

Figure 7C:
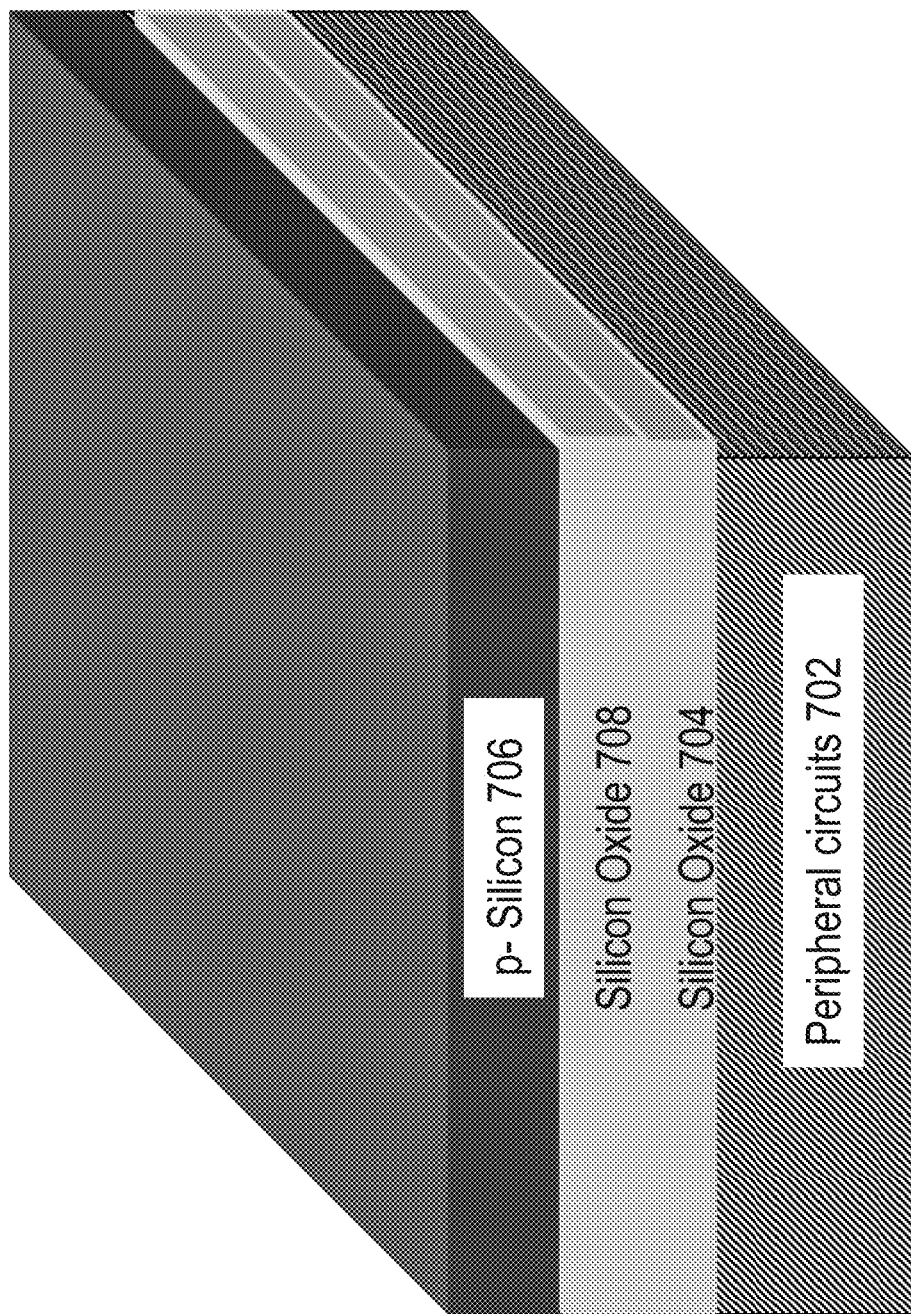

Step (C): FIG. 7C illustrates the structure after Step (C). The stack of top and bottom wafers after Step (B) is cleaved at the hydrogen plane 710 using either a anneal or a sideways mechanical force or other means. A CMP process is then conducted. At the end of this step, a single-crystal p− Si layer exists atop the peripheral circuits, and this has been achieved using layer-transfer techniques.

Figure 7D:
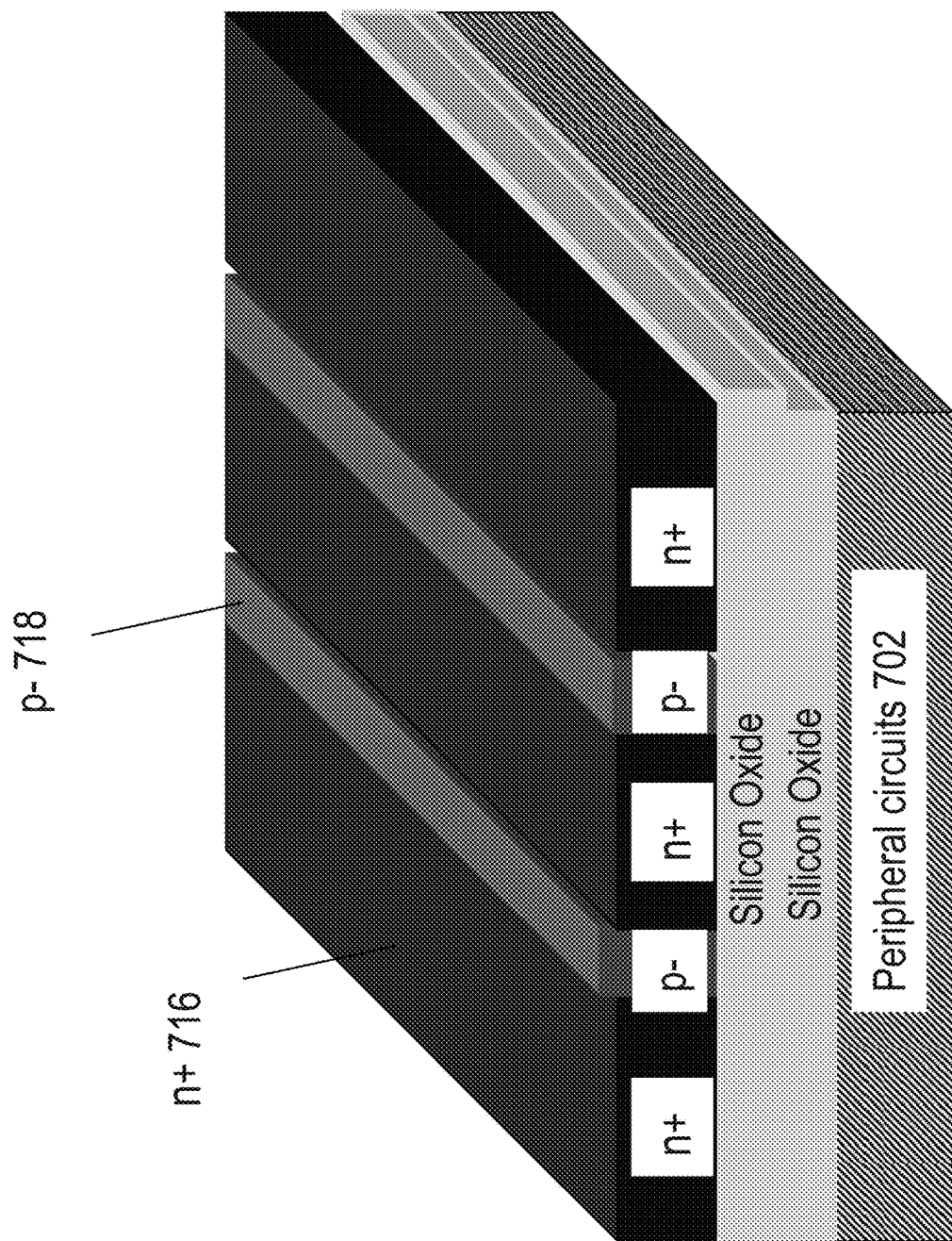

Step (D): FIG. 7D illustrates the structure after Step (D). Using lithography and then implantation, n+ regions 716 and p-regions 718 are formed on the transferred layer of p− Si after Step (C).

Figure 7E:
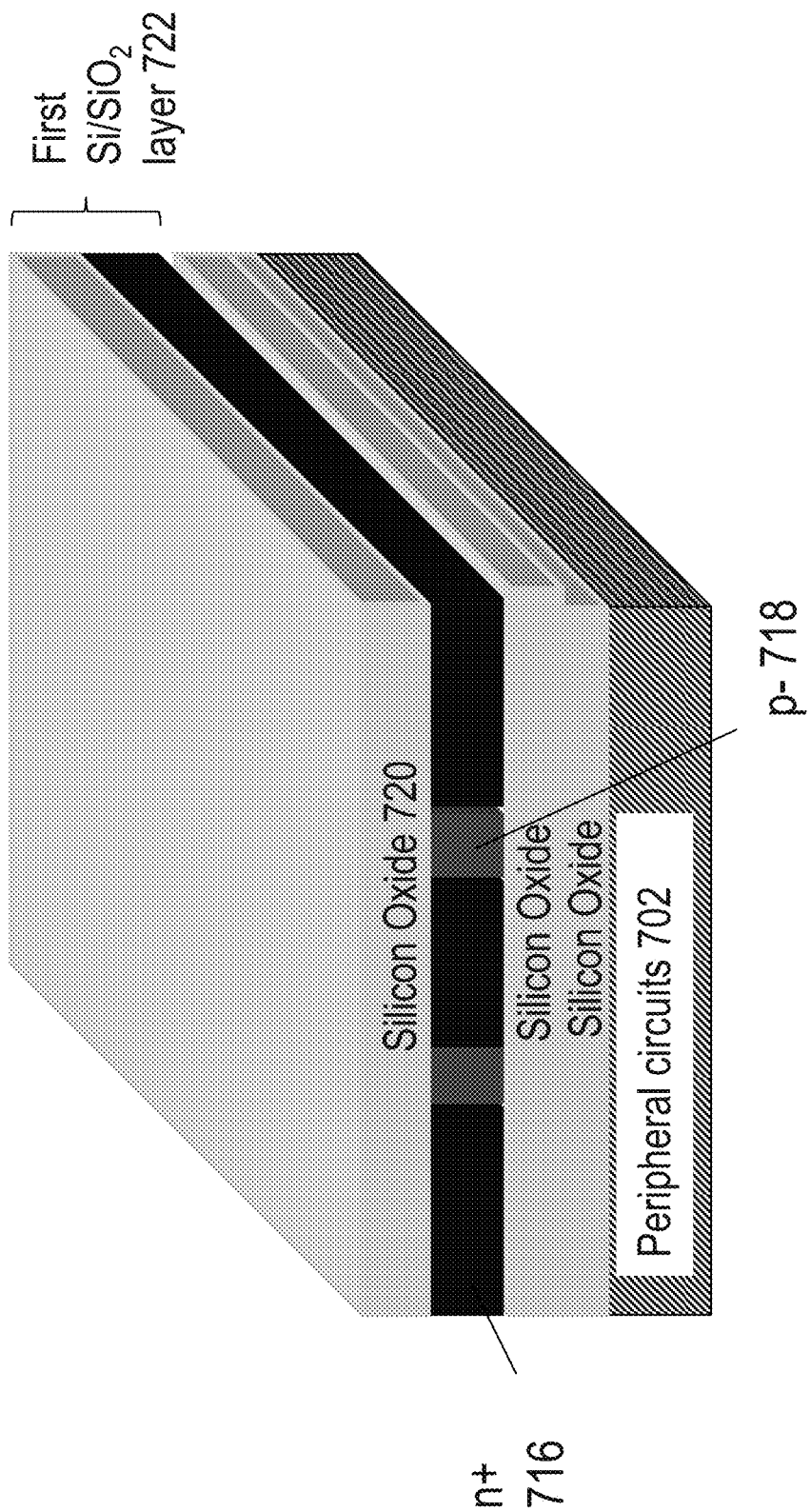

Step (E): FIG. 7E illustrates the structure after Step (E). An oxide layer 720 is deposited atop the structure obtained after Step (D). A first layer of Si/SiO$_2$ 722 is therefore formed atop the peripheral circuits 702.

Step (F): FIG. 7F illustrates the structure after Step (F). Using procedures similar to Steps (B)-(E), additional Si/SiO$_2$ layers 724 and 726 are formed atop Si/SiO$_2$ layer 722. A rapid thermal anneal (RTA) or spike anneal or flash anneal or laser anneal is then done to activate all implanted layers 722, 724 and 726 (and possibly also the peripheral circuits 702). Alternatively, the layers 722, 724 and 726 are annealed layer-by-layer as soon as their implantations are done using a laser anneal system.

Figure 7G:
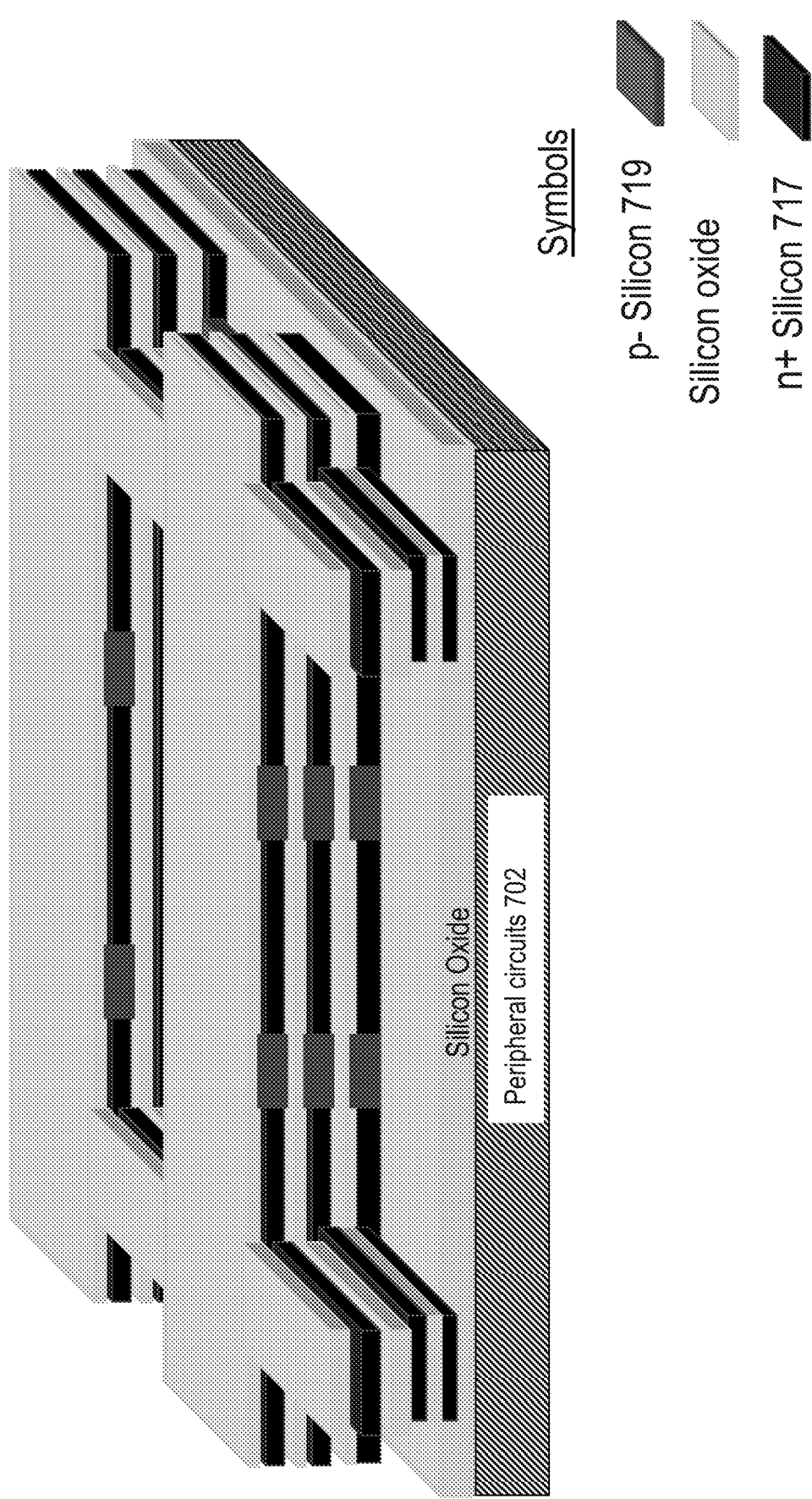

Step (G): FIG. 7G illustrates the structure after Step (G). Lithography and etch processes are then utilized to make a structure as shown in the figure.

Figure 7H:
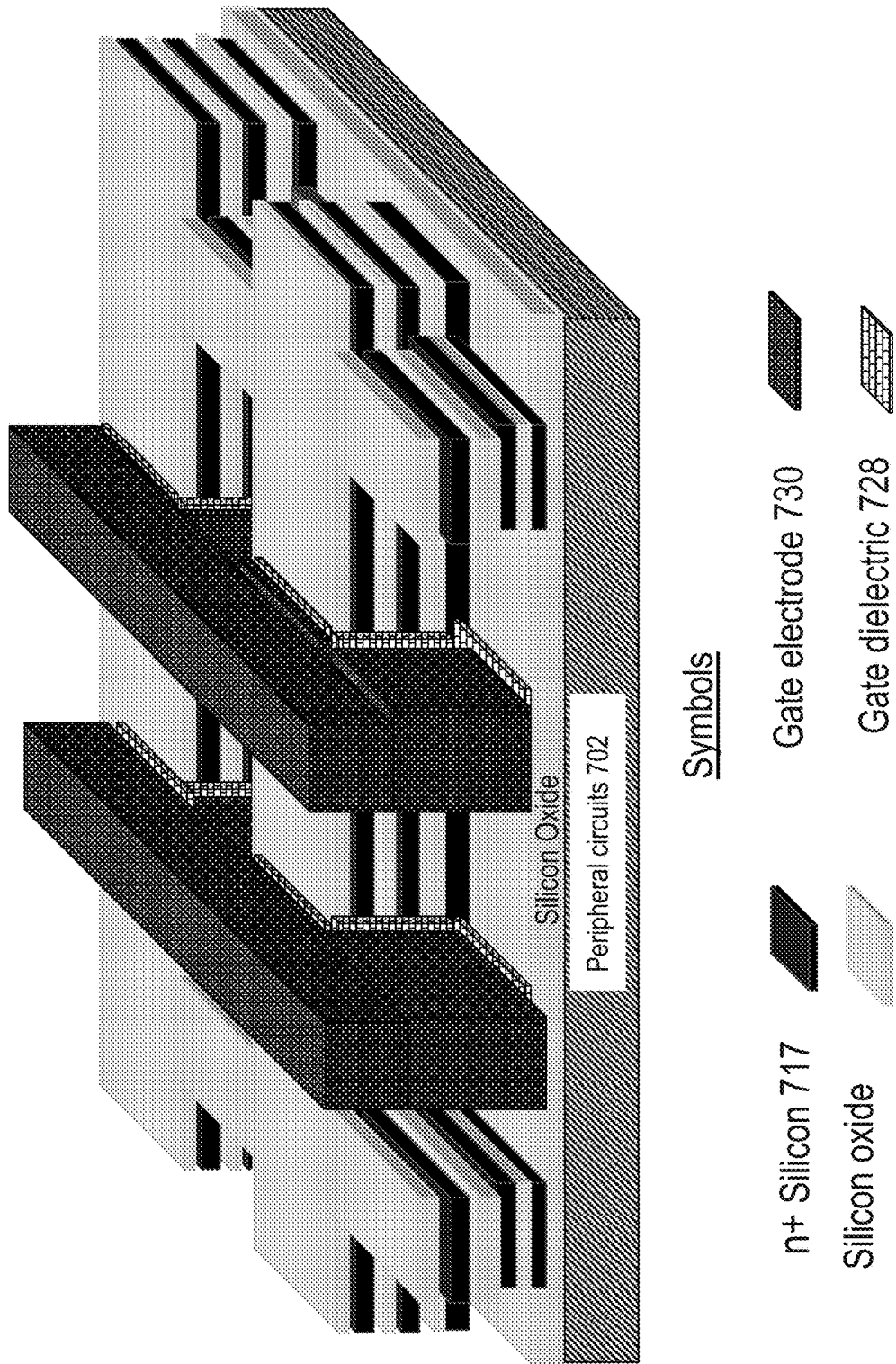

Step (H): FIG. 7H illustrates the structure after Step (H). Gate dielectric 728 and gate electrode 730 are then deposited following which a CMP is done to planarize the gate electrode 730 regions. Lithography and etch are utilized to define gate regions over the p− silicon regions (eg. p− Si region after Step (D)). Note that gate width could be slightly larger than p− region width to compensate for overlay errors in lithography.

Figure 7I:
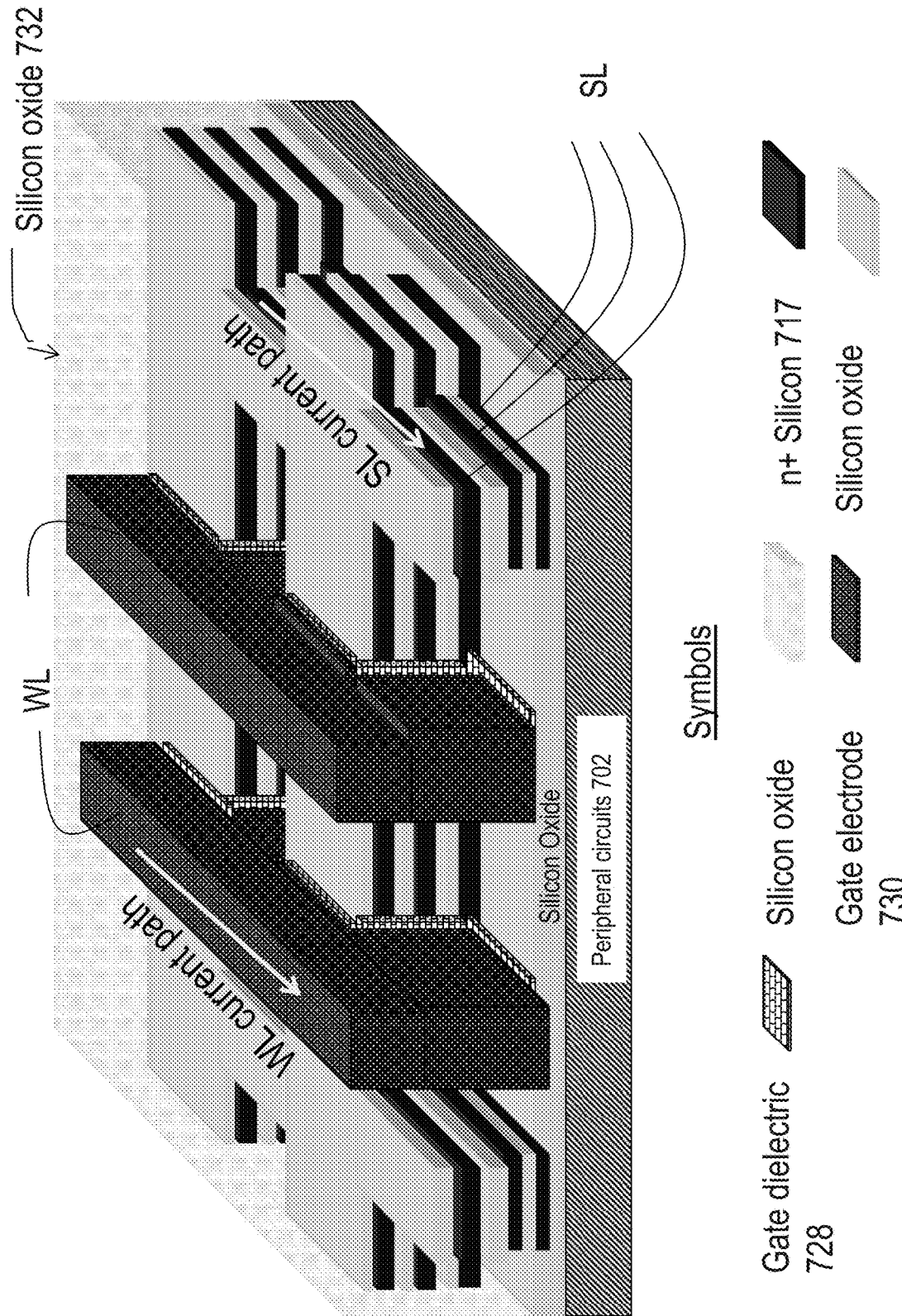

Step (I): FIG. 7I illustrates the structure after Step (I). A silicon oxide layer 732 is then deposited and planarized. For clarity, the silicon oxide layer is shown transparent in the figure, along with word-line (WL) and source-line (SL) regions.

Figure 7J:
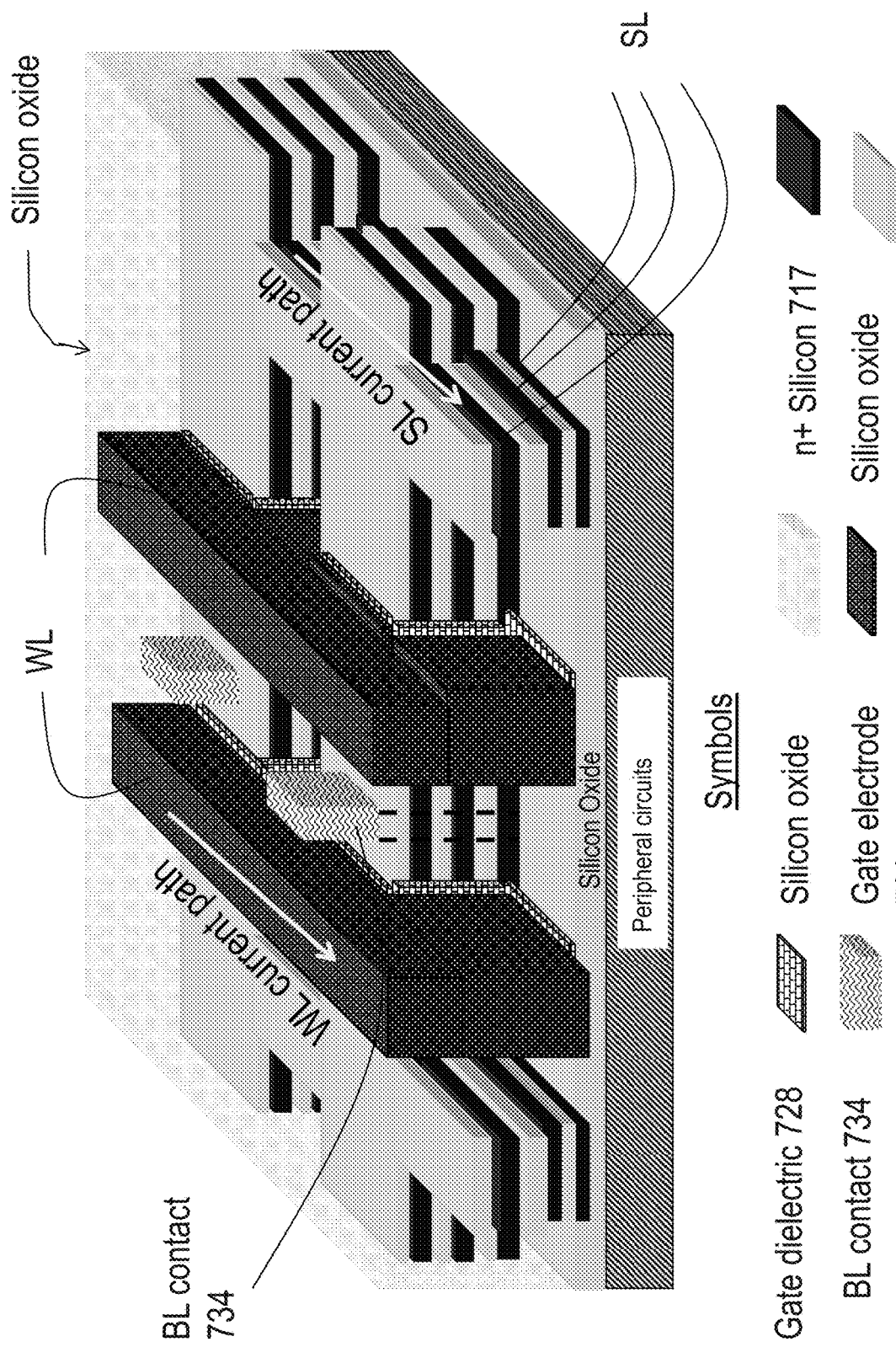

Step (J): FIG. 7J illustrates the structure after Step (J). Bit-line (BL) contacts 734 are formed by etching and deposition. These BL contacts are shared among all layers of memory.

Figure 7K:
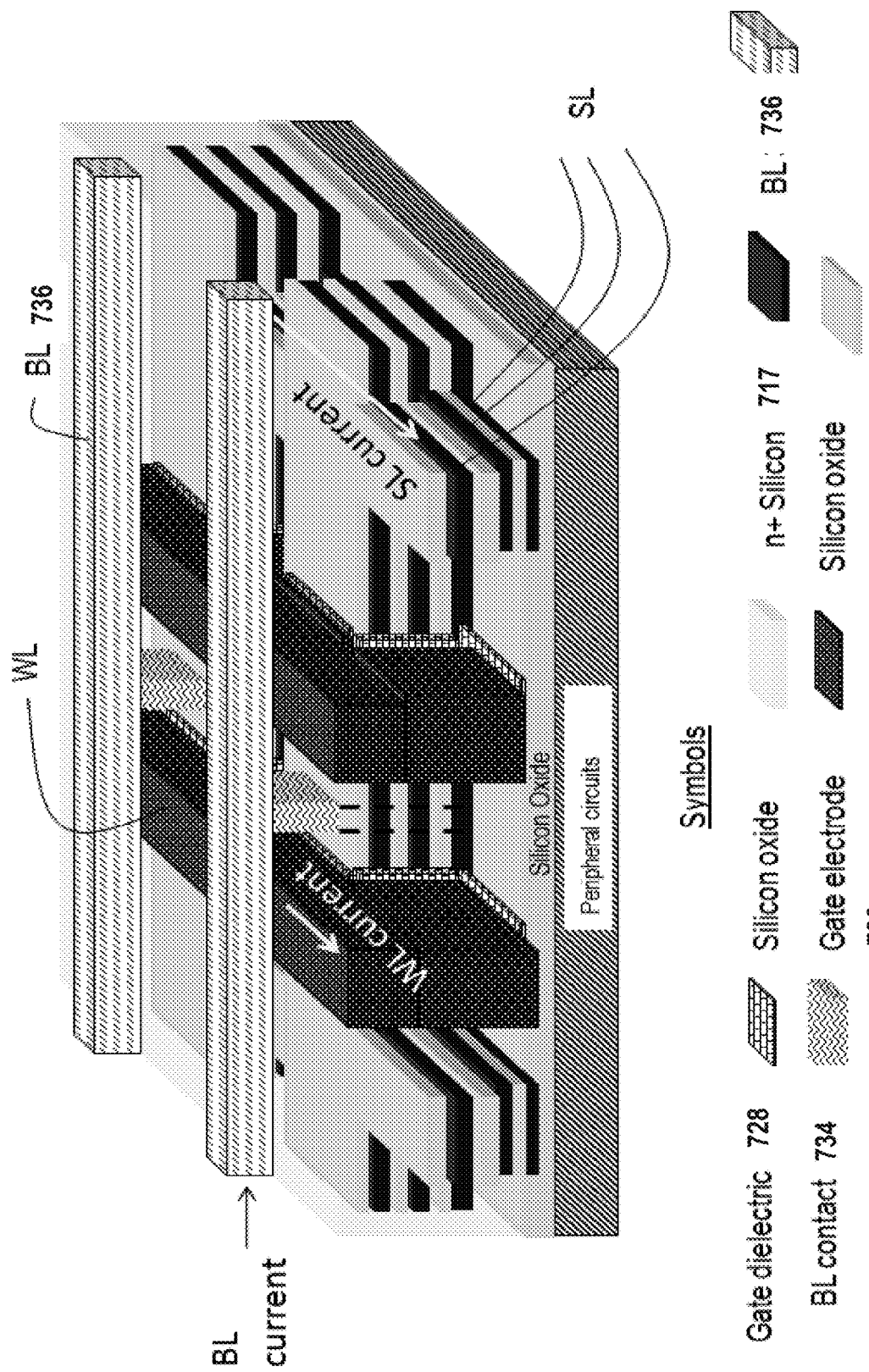

Step (K): FIG. 7K illustrates the structure after Step (K). BLs 736 are then constructed. Contacts are made to BLs, WLs and SLs of the memory array at its edges. SL contacts can be made into stair-like structures using techniques described in "Bit Cost Scalable Technology with Punch and Plug Process for Ultra High Density Flash Memory," *VLSI Technology*, 2007 *IEEE Symposium on*, vol., no., pp. 14-15, 12-14 Jun. 2007 by Tanaka, H; Kido, M.; Yahashi, K.; Oomura, M.; et al., following which contacts can be constructed to them. Formation of stair-like structures for SLs could be done in steps prior to Step (K) as well.

Figure 7M:
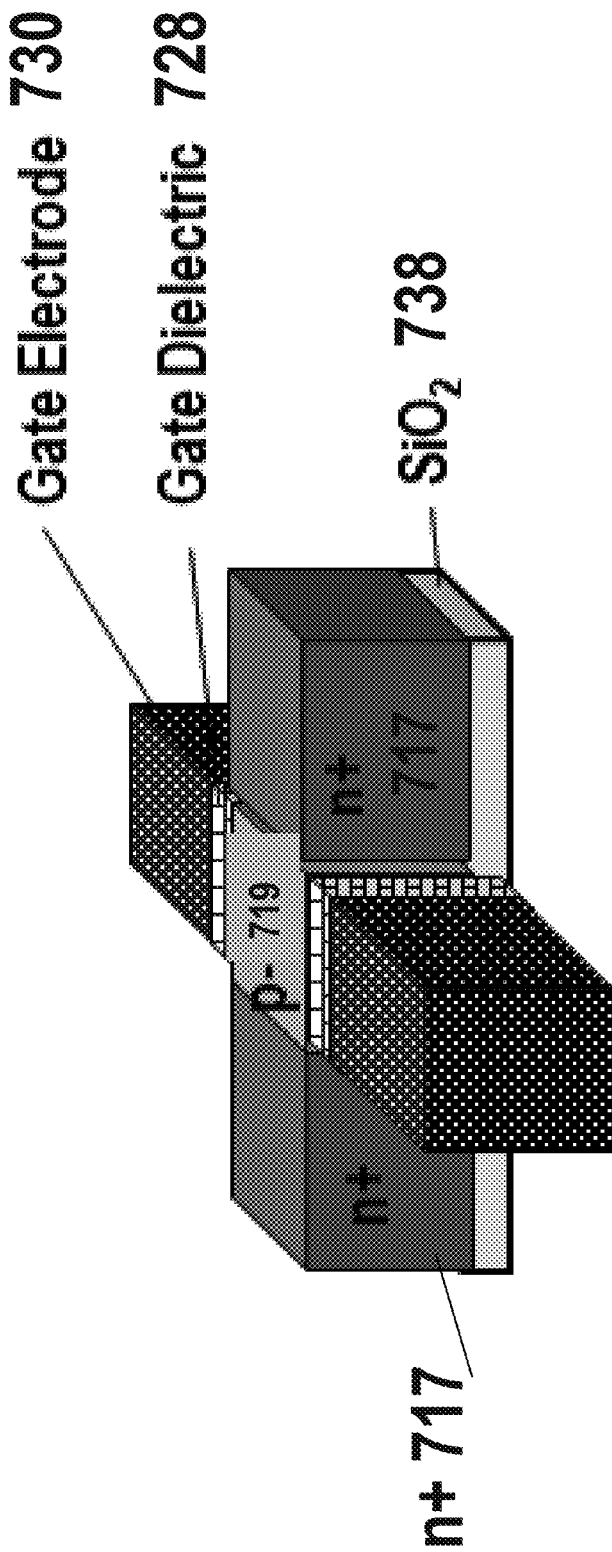

FIG. 7L shows cross-sectional views of the array for clarity. The double-gated transistors in FIG. 7 L can be utilized along with the floating body effect for storing information. FIG. 7M shows a memory cell of the floating body RAM array with two gates on either side of the p− Si layer 719.

A floating-body DRAM has thus been constructed, with (1) horizontally-oriented transistors—i.e., current flowing in substantially the horizontal direction in transistor channels, (2) some of the memory cell control lines, e.g., source-lines SL, constructed of heavily doped silicon and embedded in the memory cell layer, (3) side gates simultaneously deposited over multiple memory layers, and (4) monocrystalline (or single-crystal) silicon layers obtained by layer transfer techniques such as ion-cut.

While many of today's memory technologies rely on charge storage, several companies are developing non-volatile memory technologies based on resistance of a material changing. Examples of these resistance-based memories include phase change memory, Metal Oxide memory, resistive RAM (RRAM), memristors, solid-electrolyte memory, ferroelectric RAM, conductive bridge RAM, and MRAM. Background information on these resistive-memory types is given in "Overview of candidate device technologies for storage-class memory," *IBM Journal of Research and Development*, vol.52, no.4.5, pp. 449-464, July 2008 by Burr, G. W.; Kurdi, B. N.; Scott, J. C.; Lam, C. H.; Gopalakrishnan, K; Shenoy, R. S.

FIG. 8A-J describe a novel memory architecture for resistance-based memories, and a procedure for its construction. The memory architecture utilizes junction-less transistors and has a resistance-based memory element in series with a transistor selector. No mask is utilized on a "per-memory-layer" basis for the monolithic 3D resistance change memory (or resistive memory) concept shown in FIG. 8A-J, and all other masks are shared between different layers. The process flow may include several steps that occur in the following sequence.

Figure 8A:
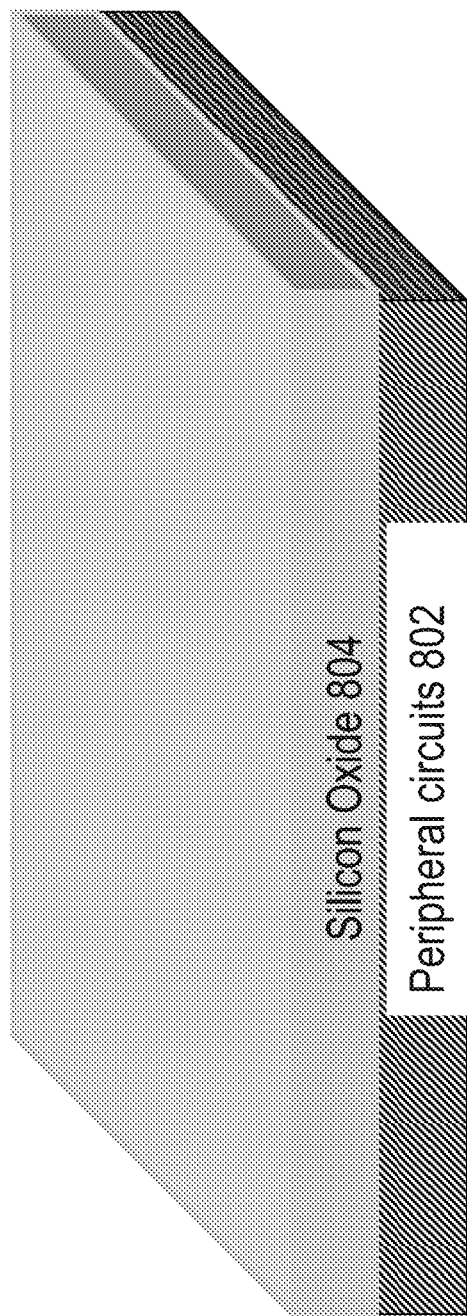

Step (A): Peripheral circuits 802 are first constructed and above this oxide layer 804 is deposited. FIG. 8A shows a drawing illustration after Step (A).

Figure 8B:
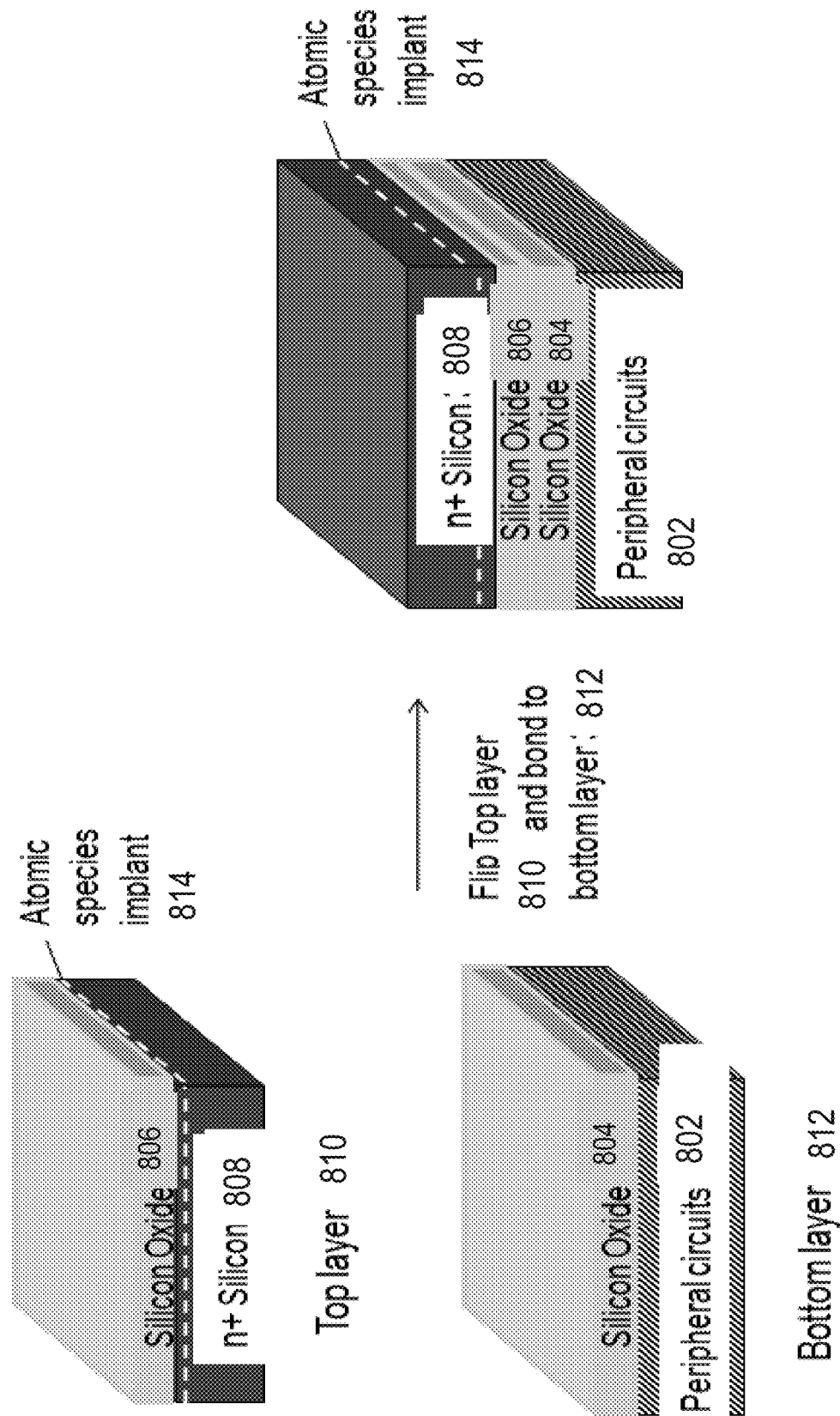

Step (B): FIG. 8B illustrates the structure after Step (B). N+ Silicon wafer 808 has an oxide layer 806 grown or deposited above it. Following this, hydrogen is implanted into the n+ Silicon wafer at a certain depth indicated by 814. Alternatively, some other atomic species such as Helium could be (co-)implanted. This hydrogen implanted n+ Silicon wafer 808 forms the top layer 810. The bottom layer 812 may include the peripheral circuits 802 with oxide layer 804. The top layer 810 is flipped and bonded to the bottom layer 812 using oxide-to-oxide bonding.

Figure 8C:
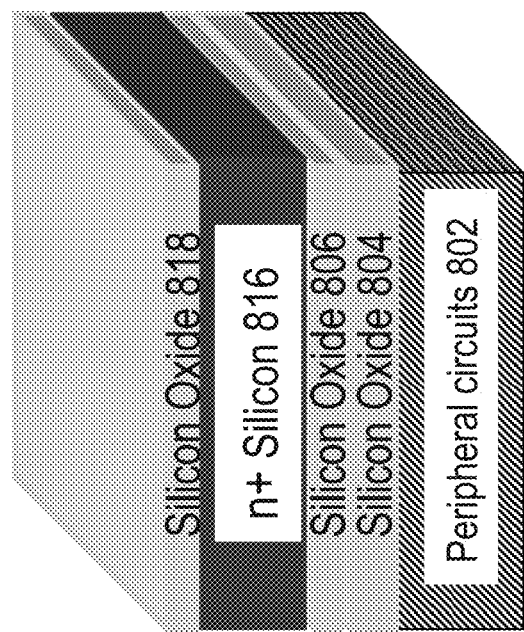

Step (C): FIG. 8C illustrates the structure after Step (C). The stack of top and bottom wafers after Step (B) is cleaved at the hydrogen plane 814 using either a anneal or a sideways mechanical force or other means. A CMP process is then conducted. A layer of silicon oxide 818 is then deposited atop the n+ Silicon layer 816. At the end of this step, a single-crystal n+ Si layer 816 exists atop the peripheral circuits, and this has been achieved using layer-transfer techniques.

Figure 8D:
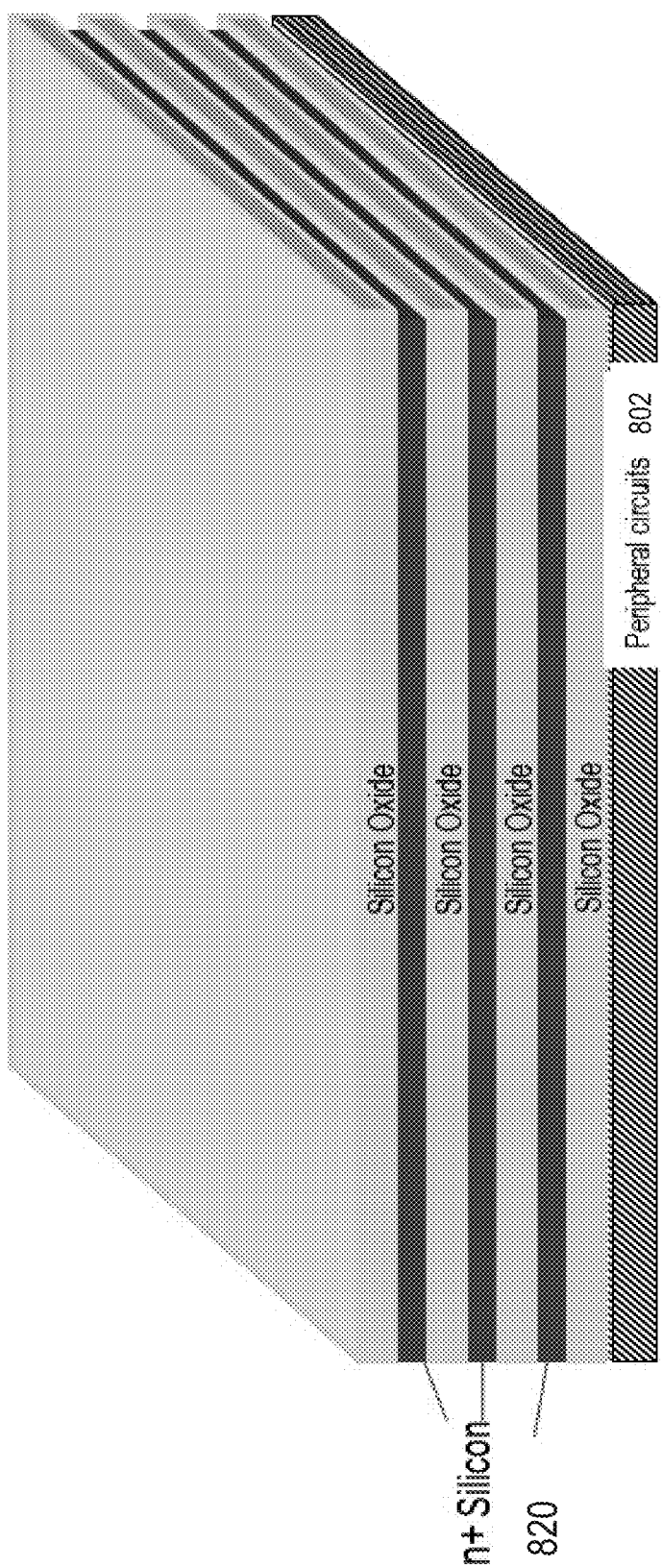

Step (D): FIG. 8D illustrates the structure after Step (D). Using methods similar to Step (B) and (C), multiple n+ silicon layers 820 are formed with silicon oxide layers in between.

Figure 8E:
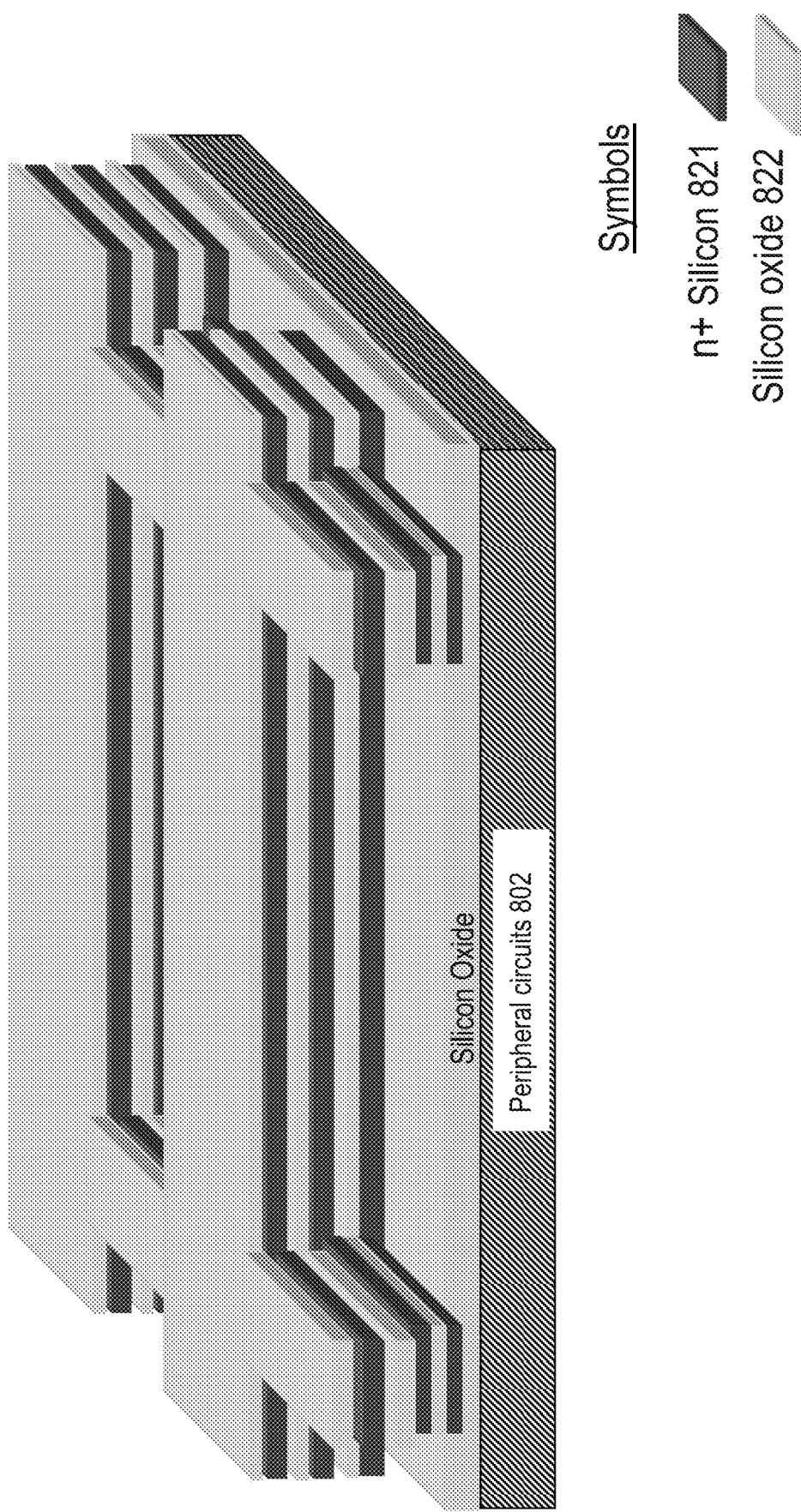

Step (E): FIG. 8E illustrates the structure after Step (E). Lithography and etch processes are then utilized to make a structure as shown in the figure.

Figure 8F:
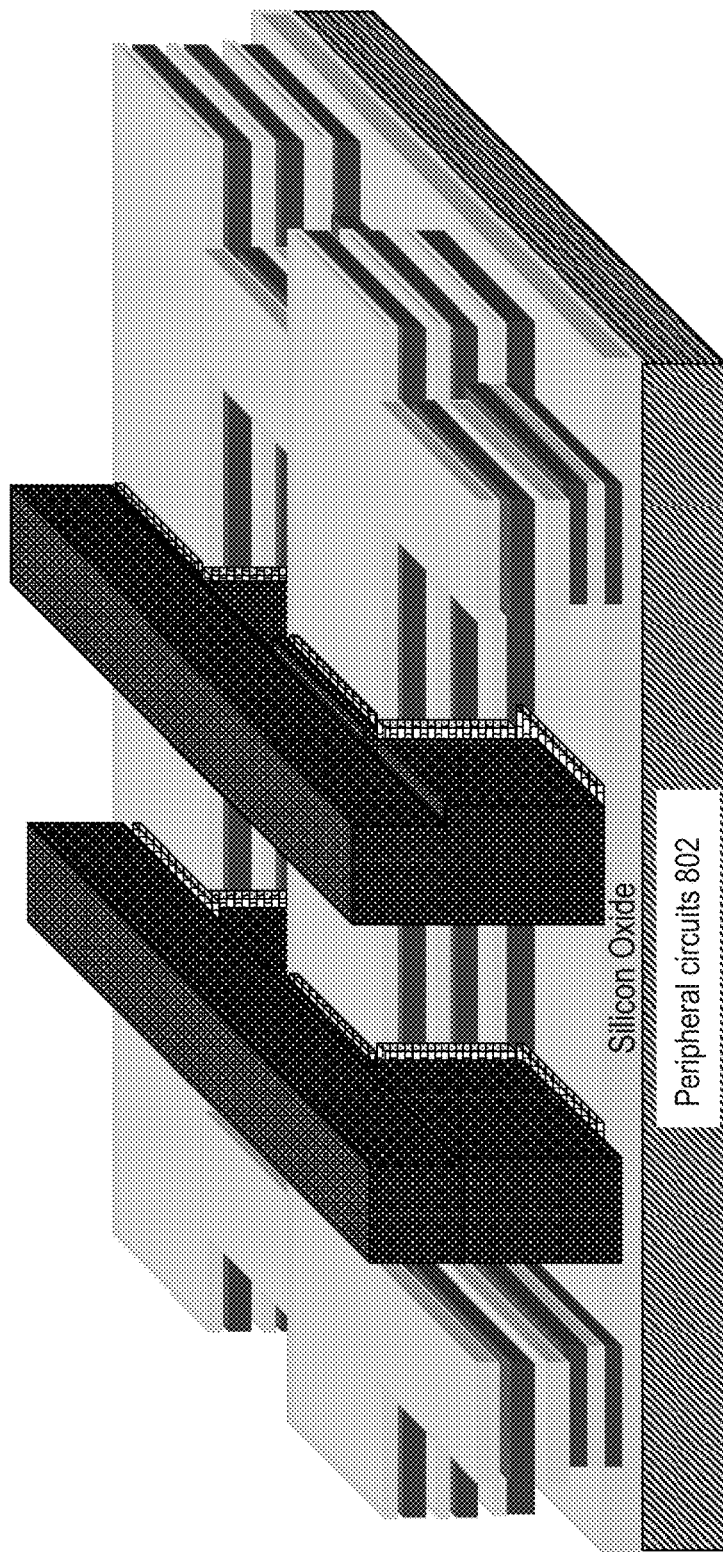

Step (F): FIG. 8F illustrates the structure after Step (F). Gate dielectric 826 and gate electrode 824 are then deposited following which a CMP is performed to planarize the gate electrode 824 regions. Lithography and etch are utilized to define gate regions.

Figure 8G:
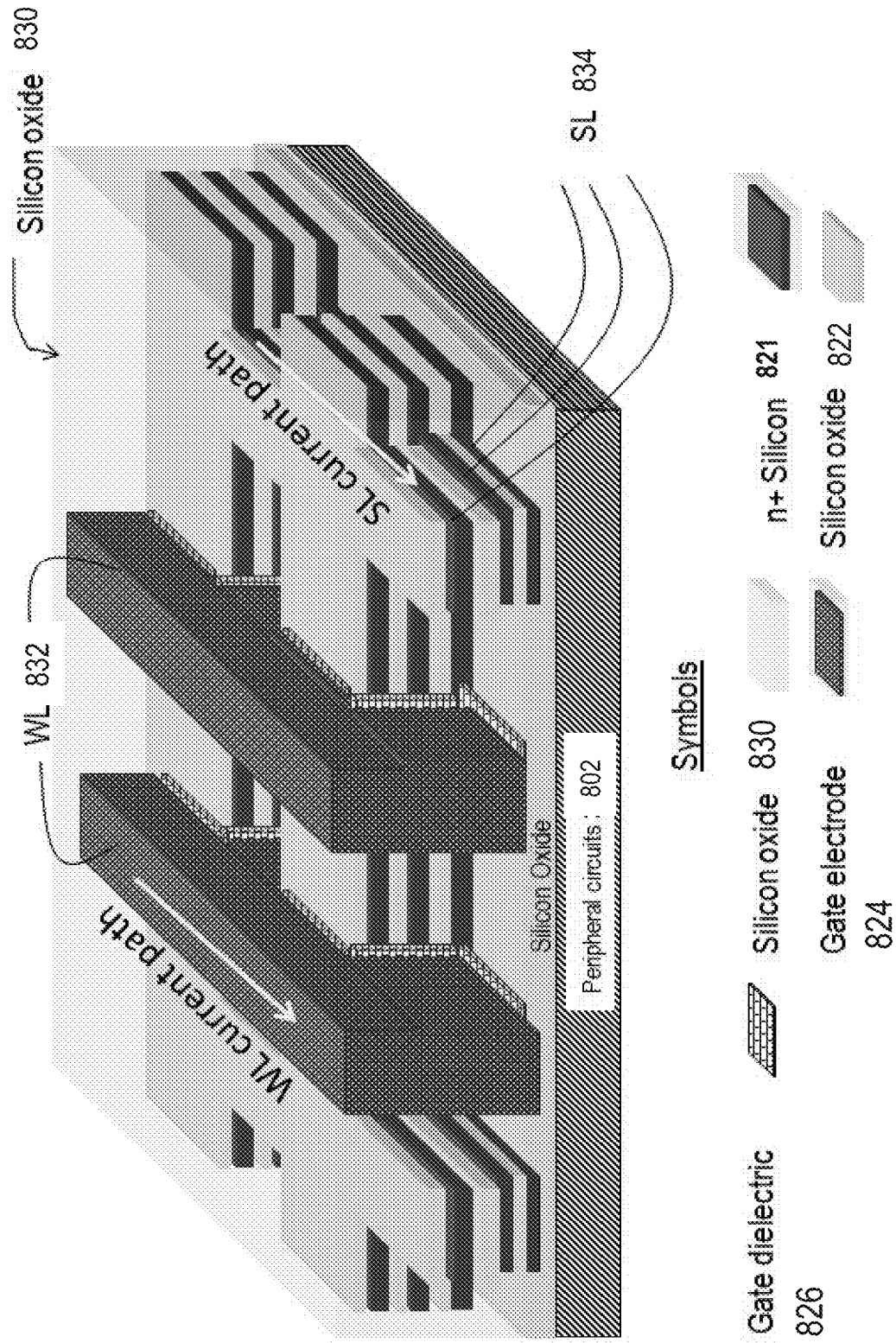

Step (G): FIG. 8G illustrates the structure after Step (G). A silicon oxide layer 830 is then deposited and planarized. The silicon oxide layer is shown transparent in the figure for clarity, along with word-line (WL) 832 and source-line (SL) 834 regions.

Figure 8H:
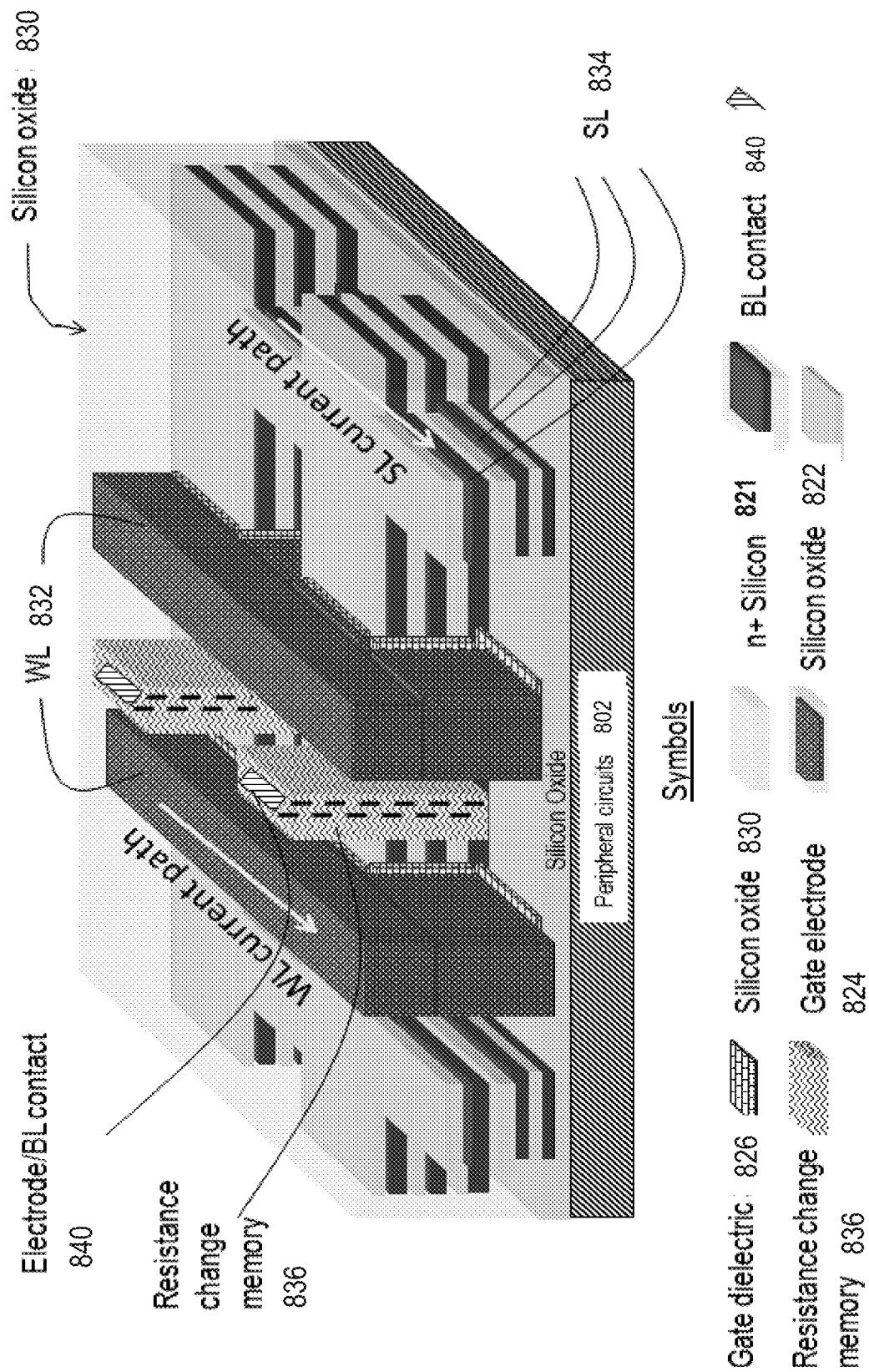

Step (H): FIG. 8H illustrates the structure after Step (H). Vias are etched through multiple layers of silicon and silicon dioxide as shown in the figure. A resistance change memory material 836 is then deposited (preferably with atomic layer deposition (ALD)). Examples of such a material include hafnium oxide, well known to change resistance by applying voltage. An electrode for the resistance change memory element is then deposited (preferably using ALD) and is shown as electrode/BL contact 840. A CMP process is then conducted to planarize the surface. It can be observed that multiple resistance change memory elements in series with junction-less transistors are created after this step.

Figure 8I:
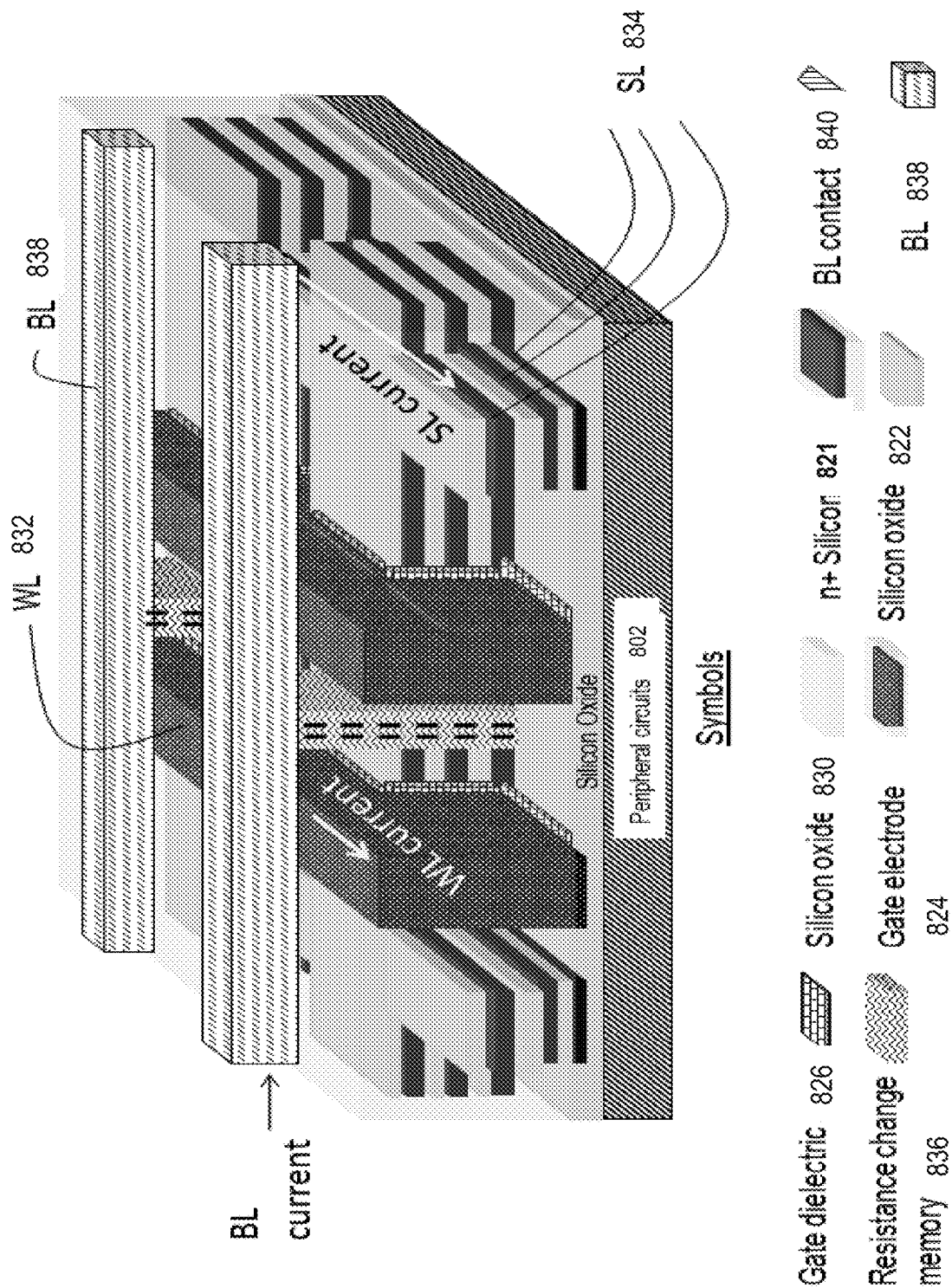

Step (I): FIG. 8I illustrates the structure after Step (I). BLs 838 are then constructed. Contacts are made to BLs, WLs and SLs of the memory array at its edges. SL contacts can be made into stair-like structures using techniques described in in "Bit Cost Scalable Technology with Punch and Plug Process for Ultra High Density Flash Memory," *VLSI Technology, 2007 IEEE Symposium on*, vol., no., pp. 14-15, 12-14 Jun. 2007 by Tanaka, H; Kido, M.; Yahashi, K; Oomura, M.; et al., following which contacts can be constructed to them. Formation of stair-like structures for SLs could be achieved in steps prior to Step (I) as well.

FIG. 8J shows cross-sectional views of the array for clarity. A 3D resistance change memory has thus been constructed, with (1) horizontally-oriented transistors—i.e. current flowing in substantially the horizontal direction in transistor channels, (2) some of the memory cell control lines, e.g., source-lines SL, constructed of heavily doped silicon and embedded in the memory cell layer, (3) side gates that are simultaneously deposited over multiple memory layers for transistors, and (4) monocrystalline (or single-crystal) silicon layers obtained by layer transfer techniques such as ion-cut.

While resistive memories described previously form a class of non-volatile memory, others classes of non-volatile memory exist. NAND flash memory forms one of the most common non-volatile memory types. It can be constructed of two main types of devices: floating-gate devices where charge is stored in a floating gate and charge-trap devices where charge is stored in a charge-trap layer such as Silicon Nitride. Background information on charge-trap memory can be found in "*Integrated Interconnect Technologies for 3D Nanoelectronic Systems*", Artech House, 2009 by Bakir and Meindl ("Balch") and "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. The architectures shown in FIG. 9A-G are relevant for any type of charge-trap memory.

FIG. 9A-G describes a memory architecture for single-crystal 3D charge-trap memories, and a procedure for its construction. It utilizes junction-less transistors. No mask is utilized on a "per-memory-layer" basis for the monolithic 3D charge-trap memory concept shown in FIG. 9A-G, and all other masks are shared between different layers. The process flow may include several steps as described in the following sequence.

Figure 9A:
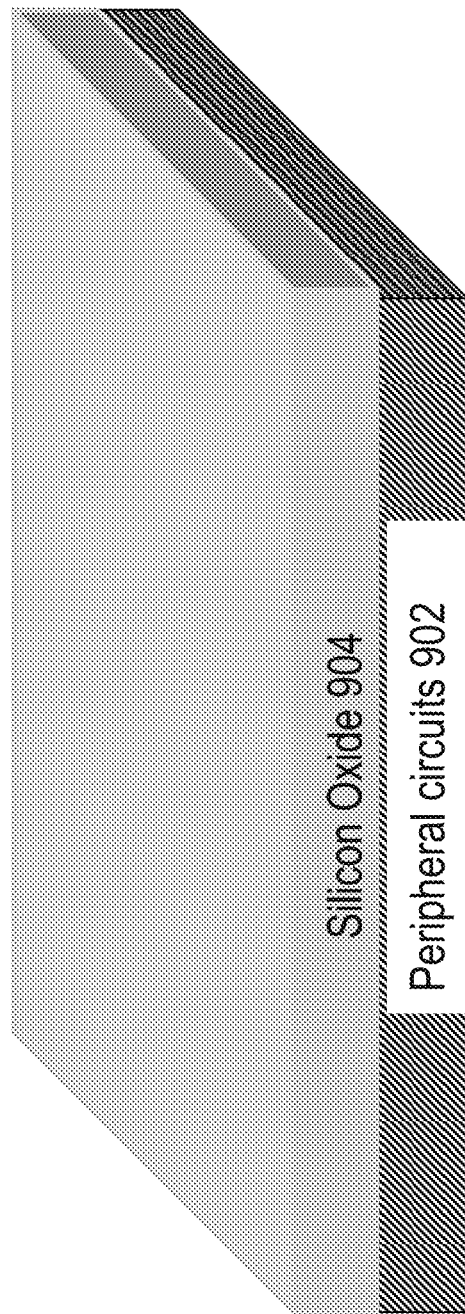
FIGS. 9A-9G show a zero-mask per layer 3D charge-trap memory.

Step (A): Peripheral circuits 902 are first constructed and above this oxide layer 904 is deposited. FIG. 9A shows a drawing illustration after Step (A).

Figure 9B:
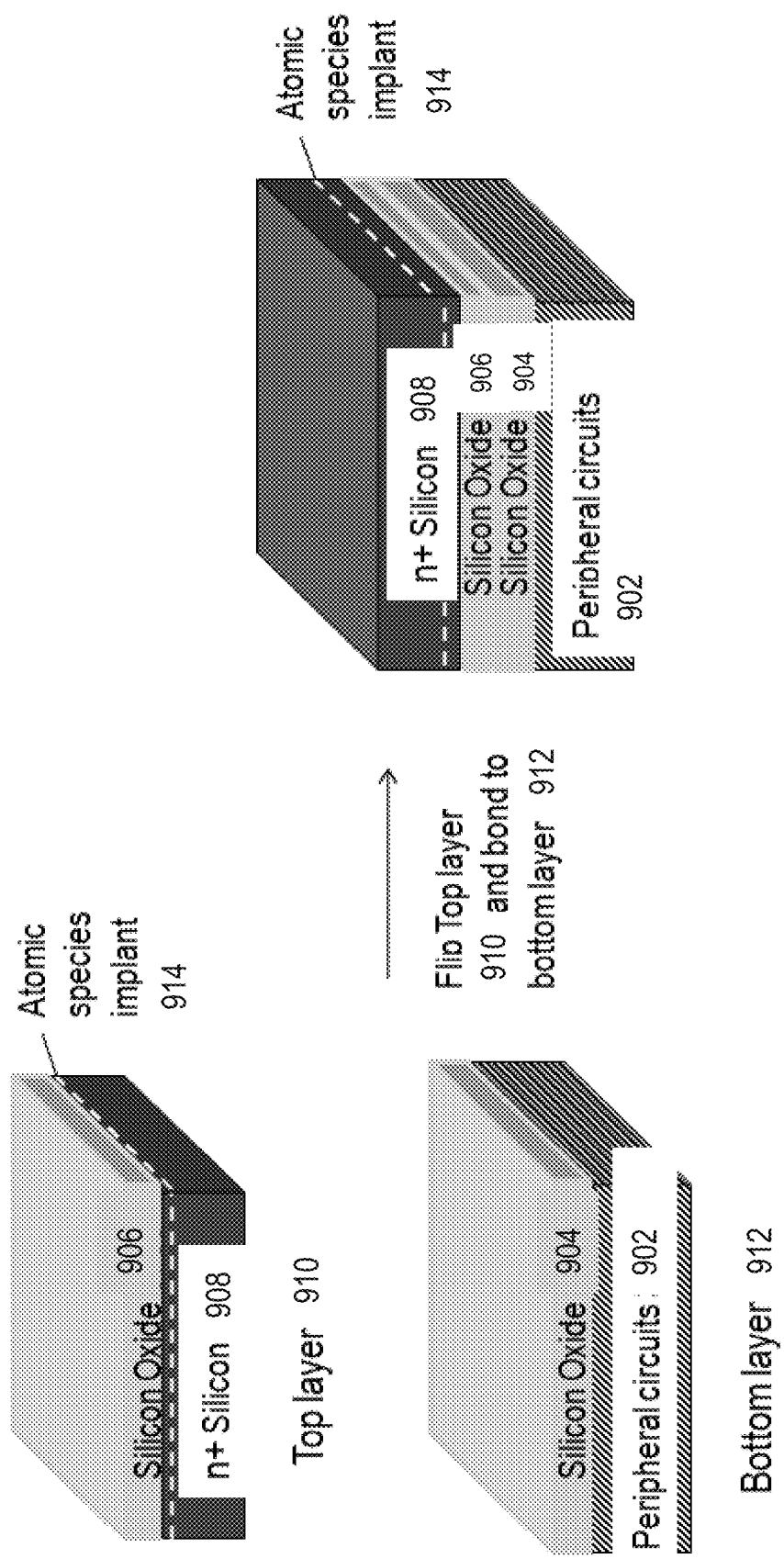

Step (B): FIG. 9B illustrates the structure after Step (B). A wafer of n+ Silicon 908 has an oxide layer 906 grown or deposited above it. Following this, hydrogen is implanted into the n+ Silicon wafer at a certain depth indicated by 914. Alternatively, some other atomic species such as Helium could be implanted. This hydrogen implanted n+ Silicon wafer 908 forms the top layer 910. The bottom layer 912 may include the peripheral circuits 902 with oxide layer 904. The top layer 910 is flipped and bonded to the bottom layer 912 using oxide-to-oxide bonding. Alternatively, n+ silicon wafer 908 may be doped differently, such as, for example, with elemental species that form a p+, or p−, or n− silicon wafer, or substantially absent of semiconductor dopants to form an undoped silicon wafer.

Figure 9C:
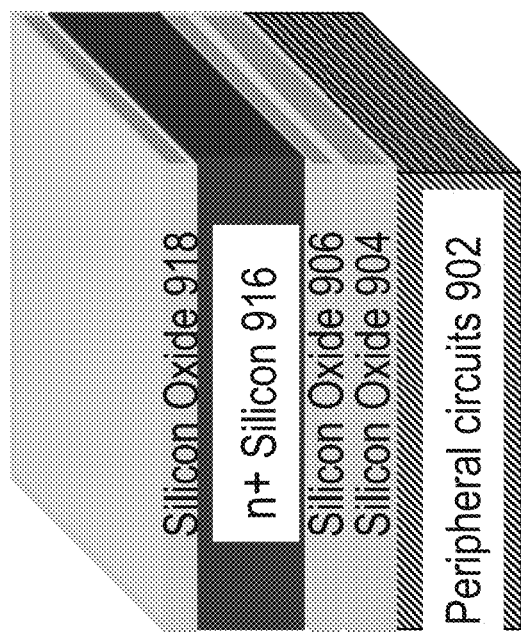

Step (C): FIG. 9C illustrates the structure after Step (C). The stack of top and bottom wafers after Step (B) is cleaved at the hydrogen plane 914 using either a anneal or a sideways mechanical force or other means. A CMP process is then conducted. A layer of silicon oxide 918 is then deposited atop the n+ Silicon layer 916. At the end of this step, a single-crystal n+ Si layer 916 exists atop the peripheral circuits, and this has been achieved using layer-transfer techniques.

Figure 9D:
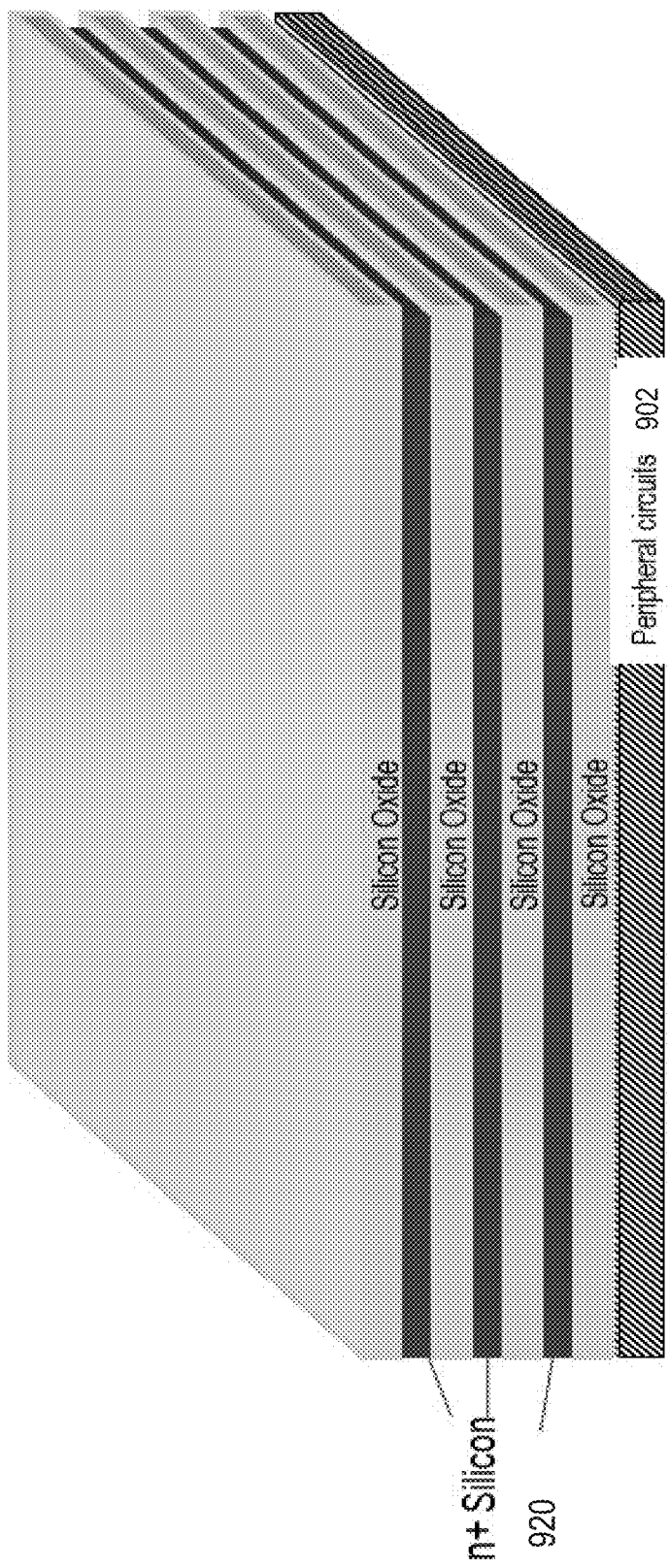

Step (D): FIG. 9D illustrates the structure after Step (D). Using methods similar to Step (B) and (C), multiple n+ silicon layers 920 are formed with silicon oxide layers in between.

Figure 9E:
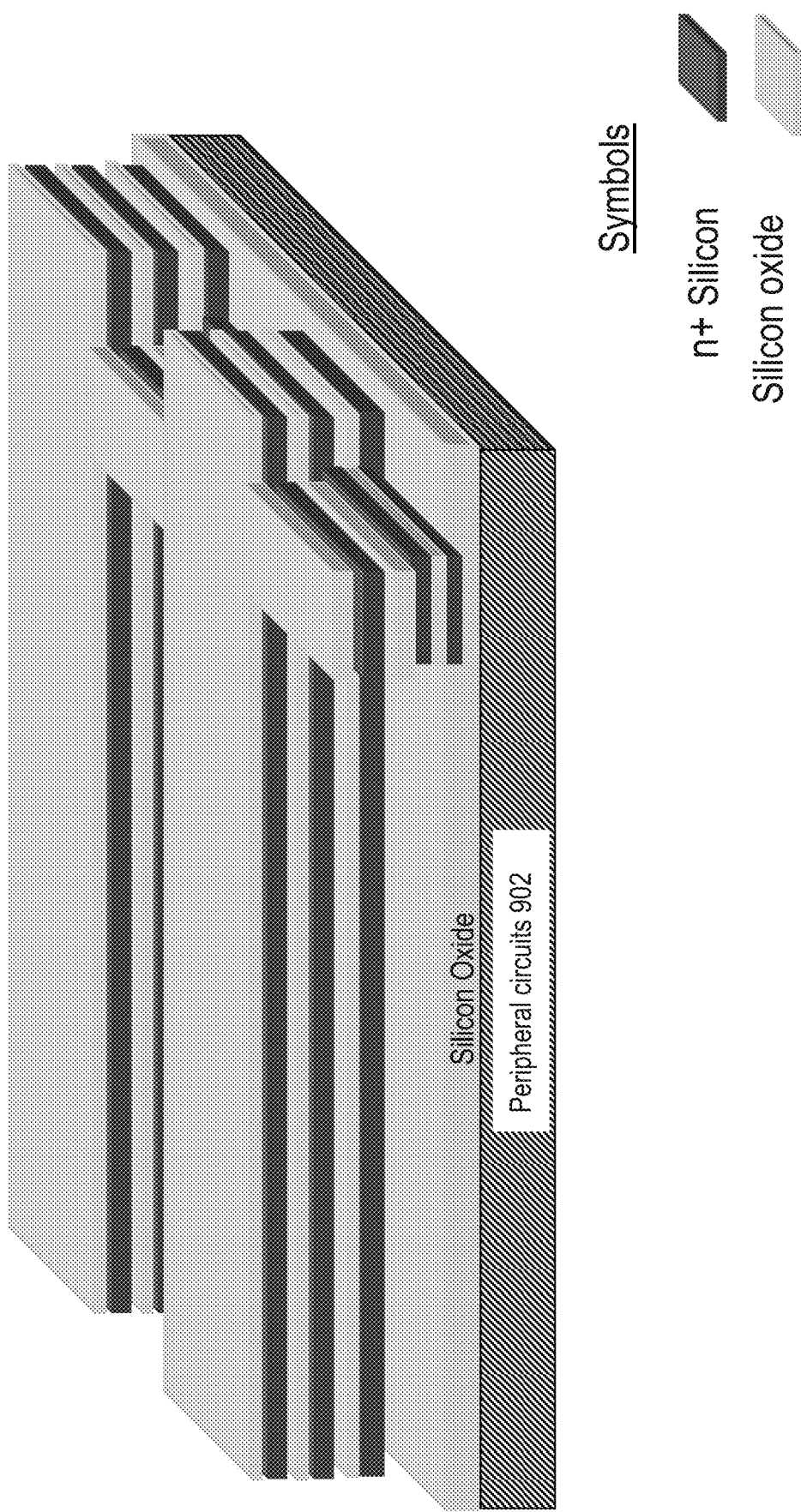

Step (E): FIG. 9E illustrates the structure after Step (E). Lithography and etch processes are then utilized to make a structure as shown in the figure.

Figure 9F:
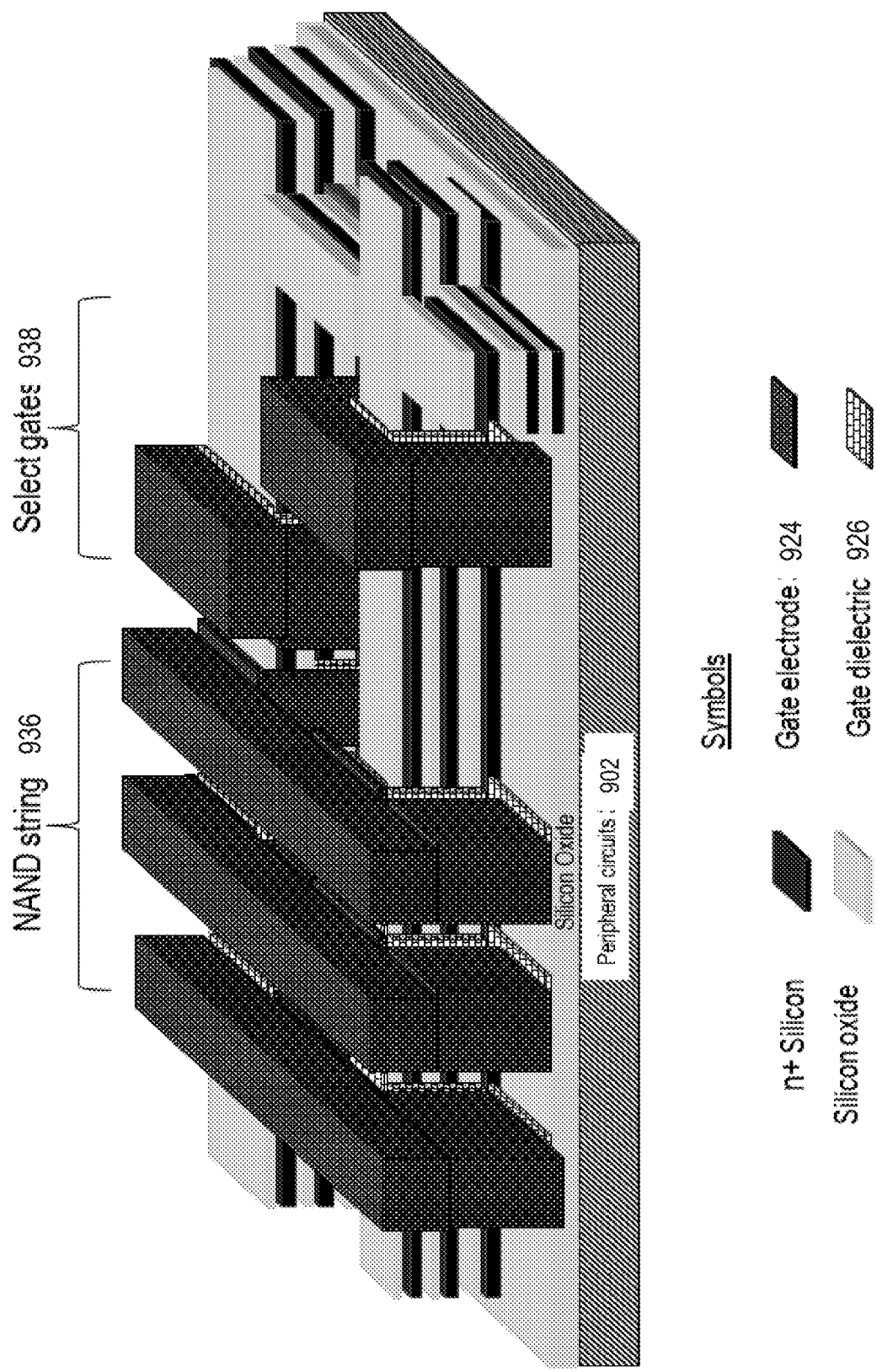

Step (F): FIG. 9F illustrates the structure after Step (F). Gate dielectric 926 and gate electrode 924 are then deposited following which a CMP is done to planarize the gate electrode 924 regions. Lithography and etch are utilized to define gate regions. Gates of the NAND string 936 as well gates of select gates of the NAND string 938 are defined.

Figure 9G:
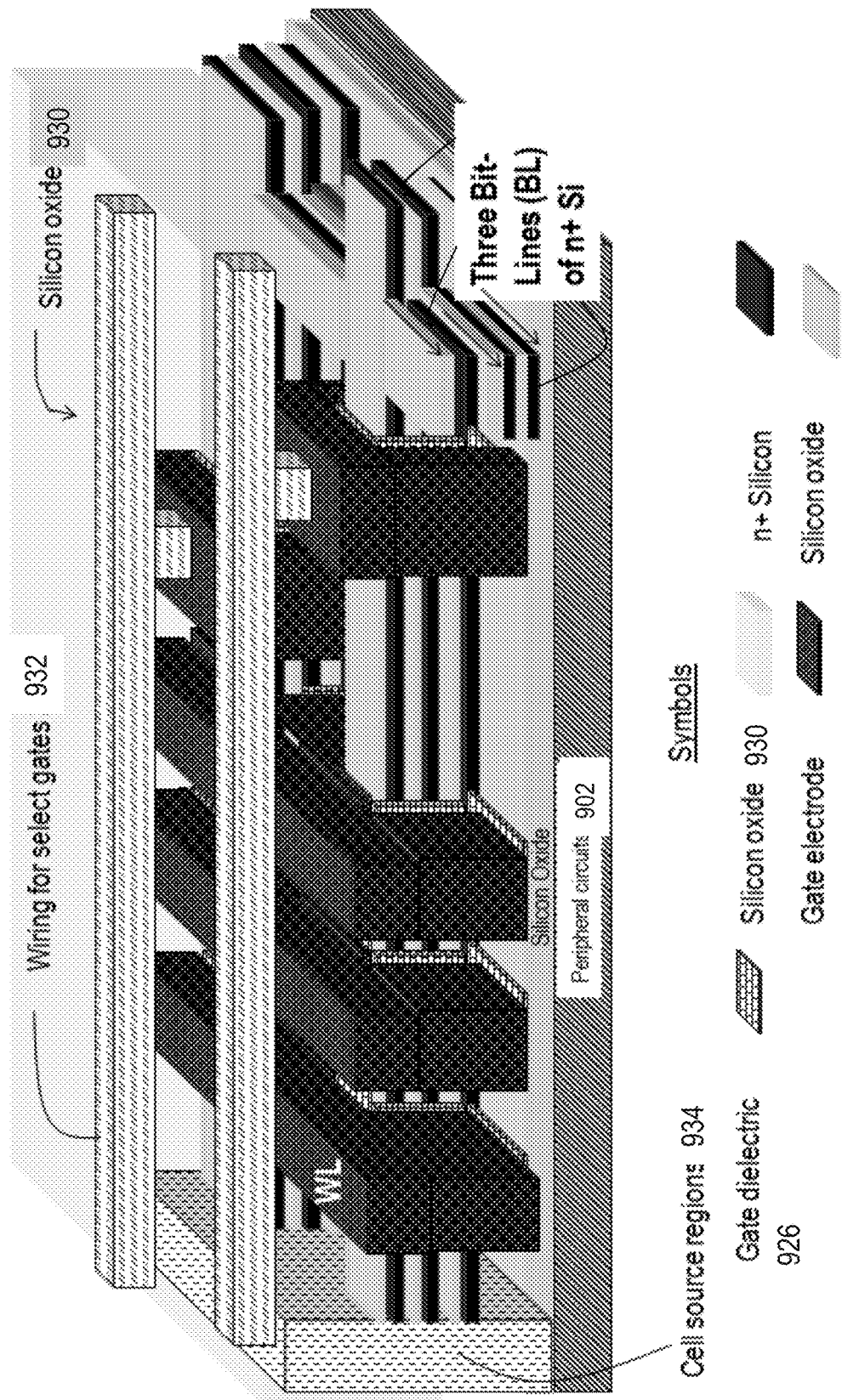

Step (G): FIG. 9G illustrates the structure after Step (G). A silicon oxide layer 930 is then deposited and planarized. It is shown transparent in the figure for clarity. Word-lines, bit-lines and source-lines are defined as shown in the figure. Contacts are formed to various regions/wires at the edges of the array as well. SL contacts can be made into stair-like structures using techniques described in "Bit Cost Scalable Technology with Punch and Plug Process for Ultra High Density Flash Memory," *VLSI Technology*, 2007 *IEEE Sym-*

*posium on*, vol., no., pp. 14-15, 12-14 Jun. 2007 by Tanaka, H.; Kido, M.; Yahashi, K; Oomura, M.; et al., following which contacts can be constructed to them. Formation of stair-like structures for SLs could be performed in steps prior to Step (G) as well.

A 3D charge-trap memory has thus been constructed, with (1) horizontally-oriented transistors—i.e. current flowing in substantially the horizontal direction in transistor channels, (2) some of the memory cell control lines—e.g., bit lines BL, constructed of heavily doped silicon and embedded in the memory cell layer, (3) side gates simultaneously deposited over multiple memory layers for transistors, and (4) monocrystalline (or single-crystal) silicon layers obtained by layer transfer techniques such as ion-cut. This use of single-crystal silicon obtained with ion-cut is a key differentiator from past work on 3D charge-trap memories such as "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. that used polysilicon.

While the 3D DRAM and 3D resistive memory implementations herein have been described with single crystal silicon constructed with ion-cut technology, other options exist. One could construct them with selective epi technology. Procedures for doing these will be clear to those skilled in the art.

FIG. 10A-B show it is not the only option for the architecture, as depicted in, for example, FIG. 28-FIG. 40A-H, and FIGS. 70-71 of U.S. Pat. No. 8,476,145, to have the peripheral transistors below the memory layers. Peripheral transistors could also be constructed above the memory layers, as shown in FIG. 10B. This periphery layer would utilize technologies described herein, and could utilize transistors including, such as, junction-less transistors or recessed channel transistors.

The monolithic 3D integration concepts described in this patent application can lead to novel embodiments of polysilicon-based memory architectures as well. Poly silicon based architectures could potentially be cheaper than single crystal silicon based architectures when a large number of memory layers need to be constructed. While the below concepts are explained by using resistive memory architectures as an example, it will be clear to one skilled in the art that similar concepts can be applied to NAND flash memory and DRAM architectures described previously in this patent application.

Figure 11A:
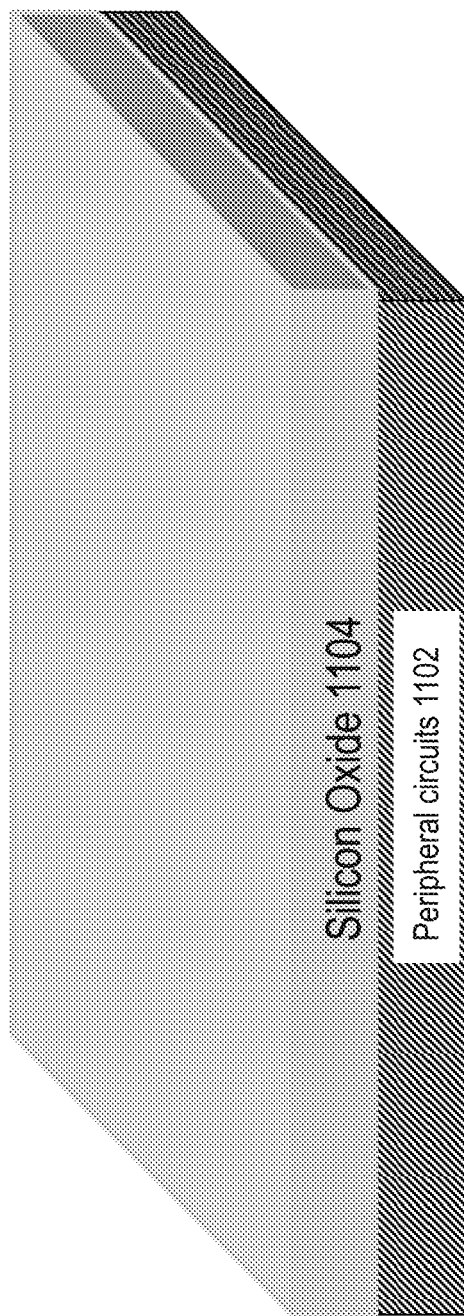
FIGS. 11A-11E show polysilicon select devices for 3D memory and peripheral circuits at the bottom according to some embodiments of the current invention.

FIG. 11A-E shows one embodiment of the current invention, where polysilicon junction-less transistors are used to form a 3D resistance-based memory. The utilized junction-less transistors can have either positive or negative threshold voltages. The process may include the following steps as described in the following sequence:

Step (A): As illustrated in FIG. 11A, peripheral circuits 1102 are constructed above which oxide layer 1104 is made.

Figure 11B:
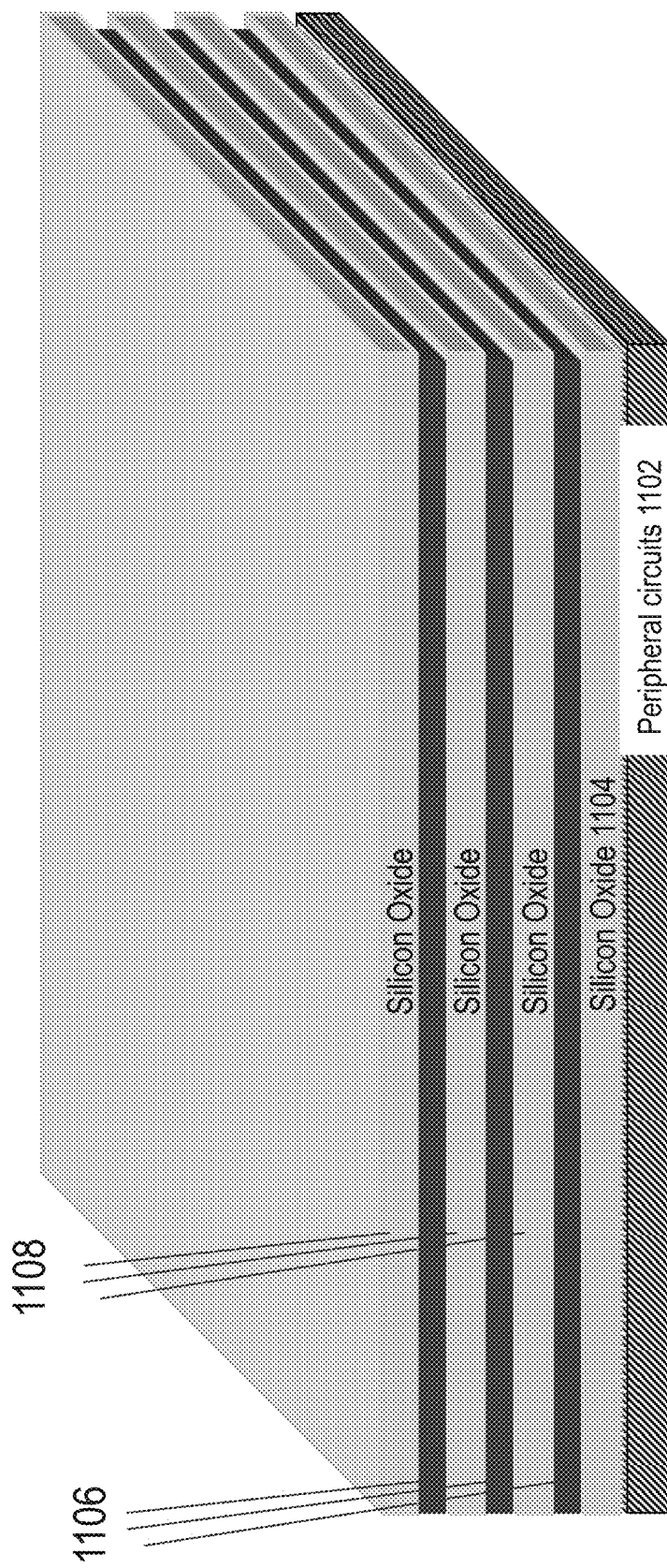

Step (B): As illustrated in FIG. 11B, multiple layers of n+ doped amorphous silicon or polysilicon 1106 are deposited with layers of silicon dioxide 1108 in between. The amorphous silicon or polysilicon layers 1106 could be deposited using a chemical vapor deposition process, such as Low Pressure Chemical Vapor Deposition (LPCVD) or Plasma Enhanced Chemical Vapor Deposition (PECVD).

Figure 11C:
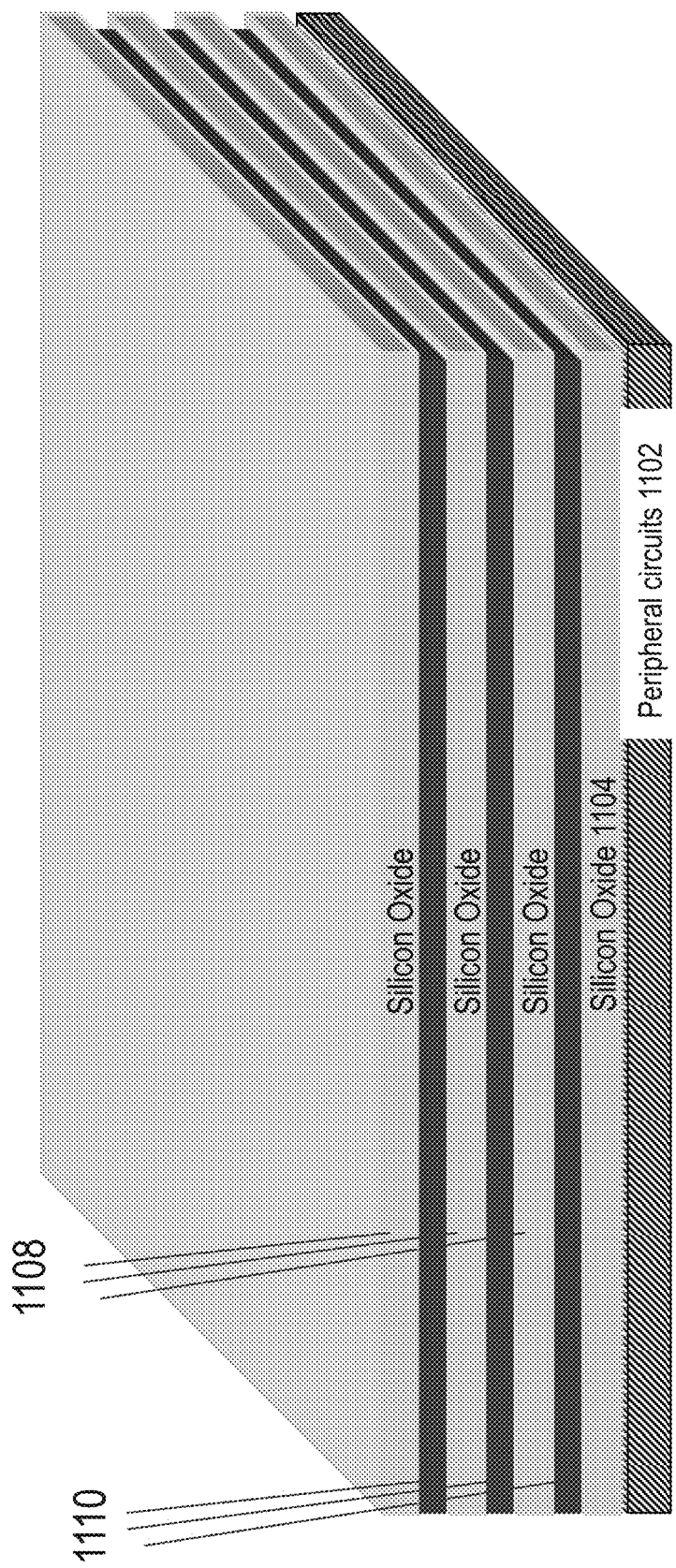

Step (C): As illustrated in FIG. 11C, a Rapid Thermal Anneal (RTA) is conducted to crystallize the layers of polysilicon or amorphous silicon deposited in Step (B). Temperatures during this RTA could be as high as 110° C. or more, and could even be as high as 800° C. The polysilicon region obtained after Step (C) is indicated as 1110. Alternatively, a laser anneal could be conducted, either for all amorphous silicon or polysilicon layers 1106 at the same time or layer by layer. The thickness of the oxide layer 1104 would need to be optimized if that process were conducted.

Figure 11D:
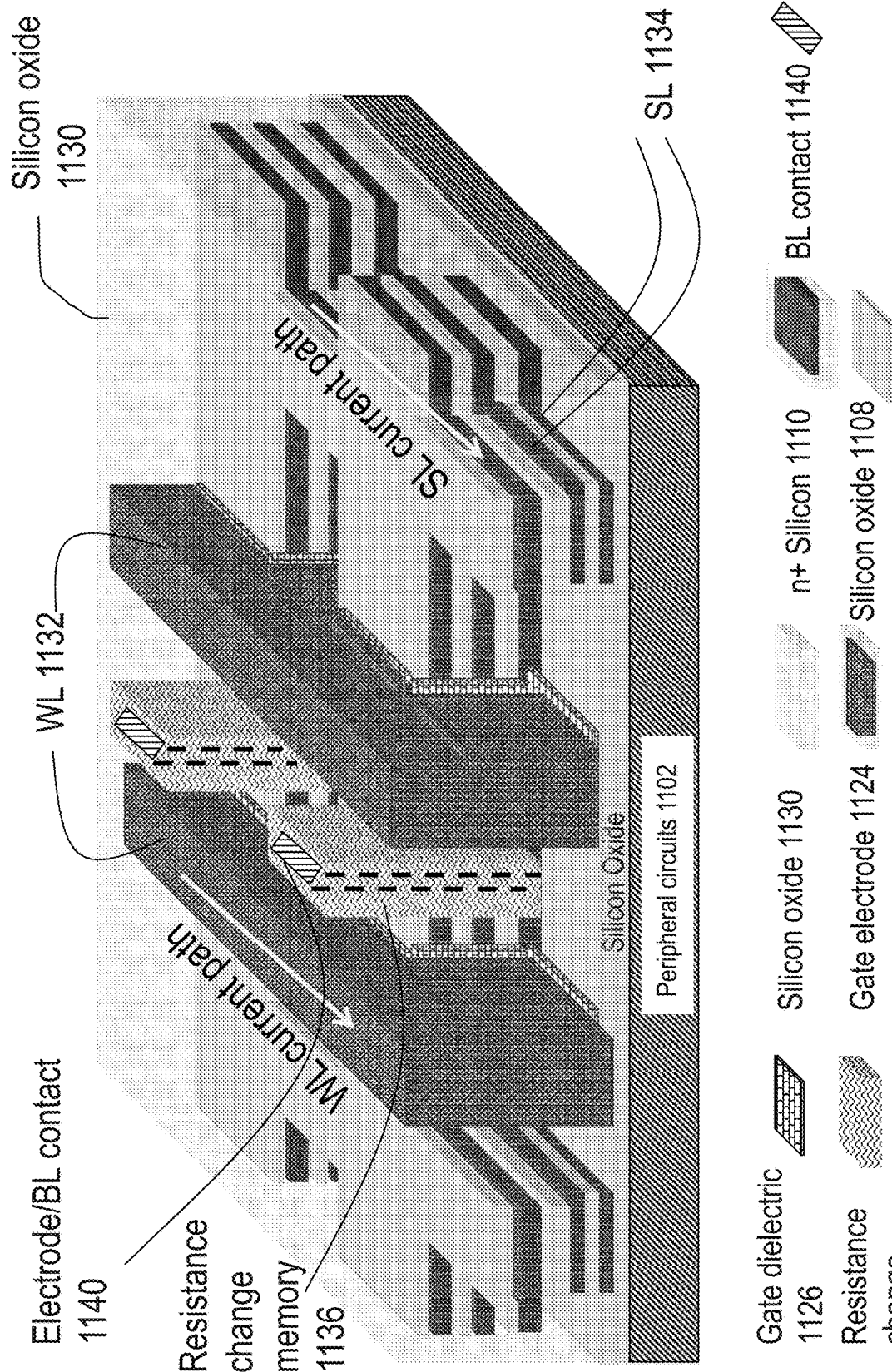

Step (D): As illustrated in FIG. 11D, procedures similar to those described in FIG. 32E-H are utilized to construct the structure shown. The structure in FIG. 11D has multiple levels of junction-less transistor selectors for resistive memory devices. The resistance change memory is indicated as 1136 while its electrode and contact to the BL is indicated as 1140. The WL is indicated as 1132, while the SL is indicated as 1134. Gate dielectric of the junction-less transistor is indicated as 1126 while the gate electrode of the junction-less transistor is indicated as 1124, this gate electrode also serves as part of the WL 1132.

Figure 11E:
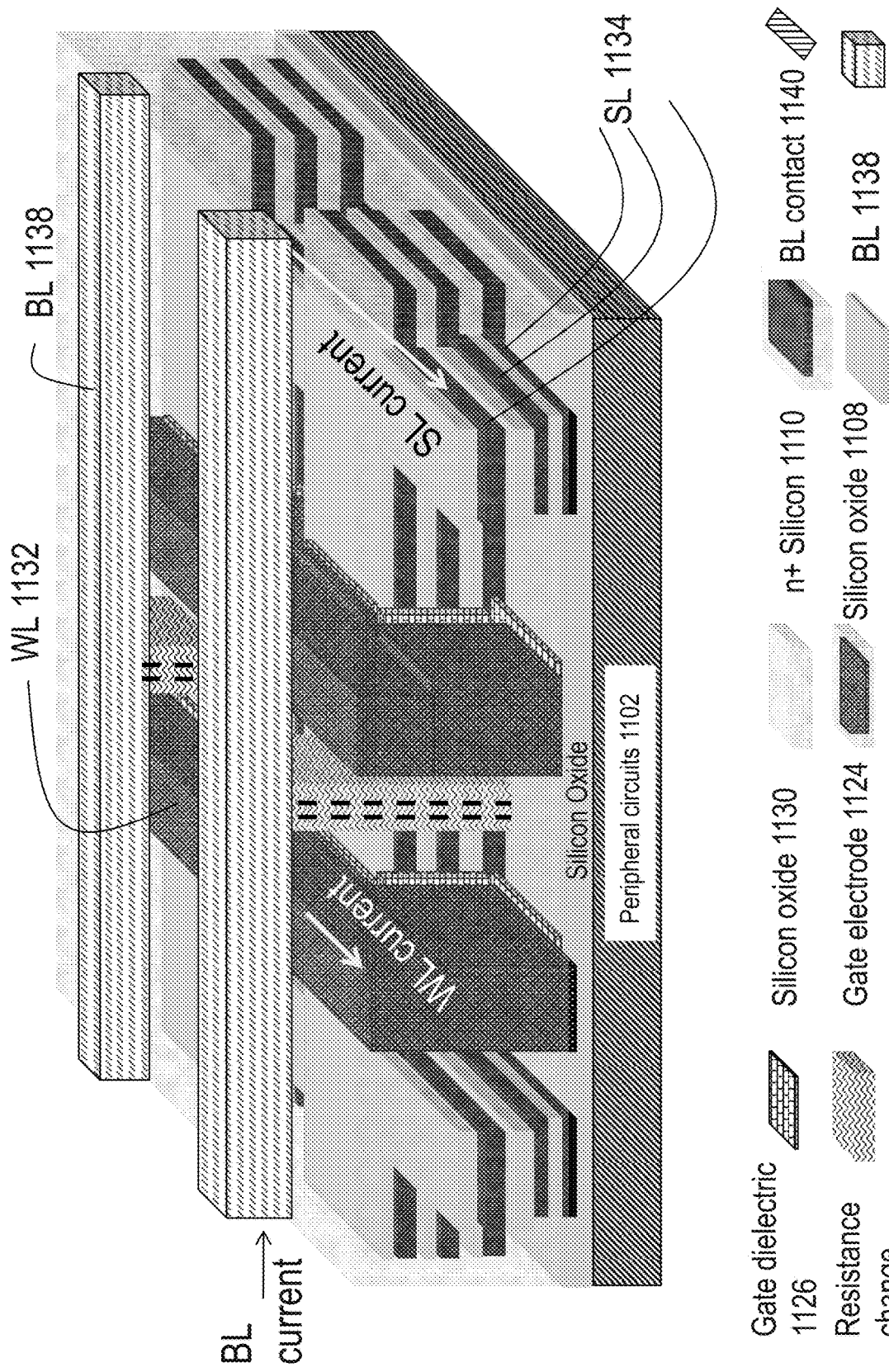

Step (E): As illustrated in FIG. 11E, bit lines (indicated as BL 1138) are constructed. Contacts are then made to peripheral circuits and various parts of the memory array as described in embodiments described previously.

Figure 12A:
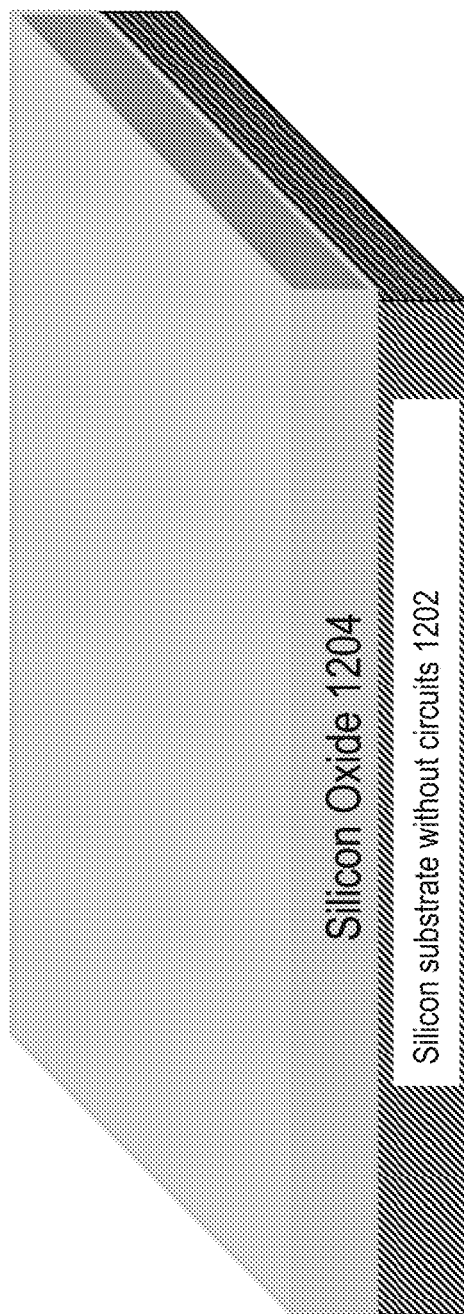
FIGS. 12A-12F show polysilicon select devices for 3D memory and peripheral circuits at the top according to some embodiments of the current invention.

FIG. 12A-F show another embodiment of the current invention, where polysilicon junction-less transistors are used to form a 3D resistance-based memory. The utilized junction-less transistors can have either positive or negative threshold voltages. The process may include the following steps occurring in sequence:

Step (A): As illustrated in FIG. 12A, a layer of silicon dioxide 1204 is deposited or grown above a silicon substrate without circuits 1202.

Figure 12B:
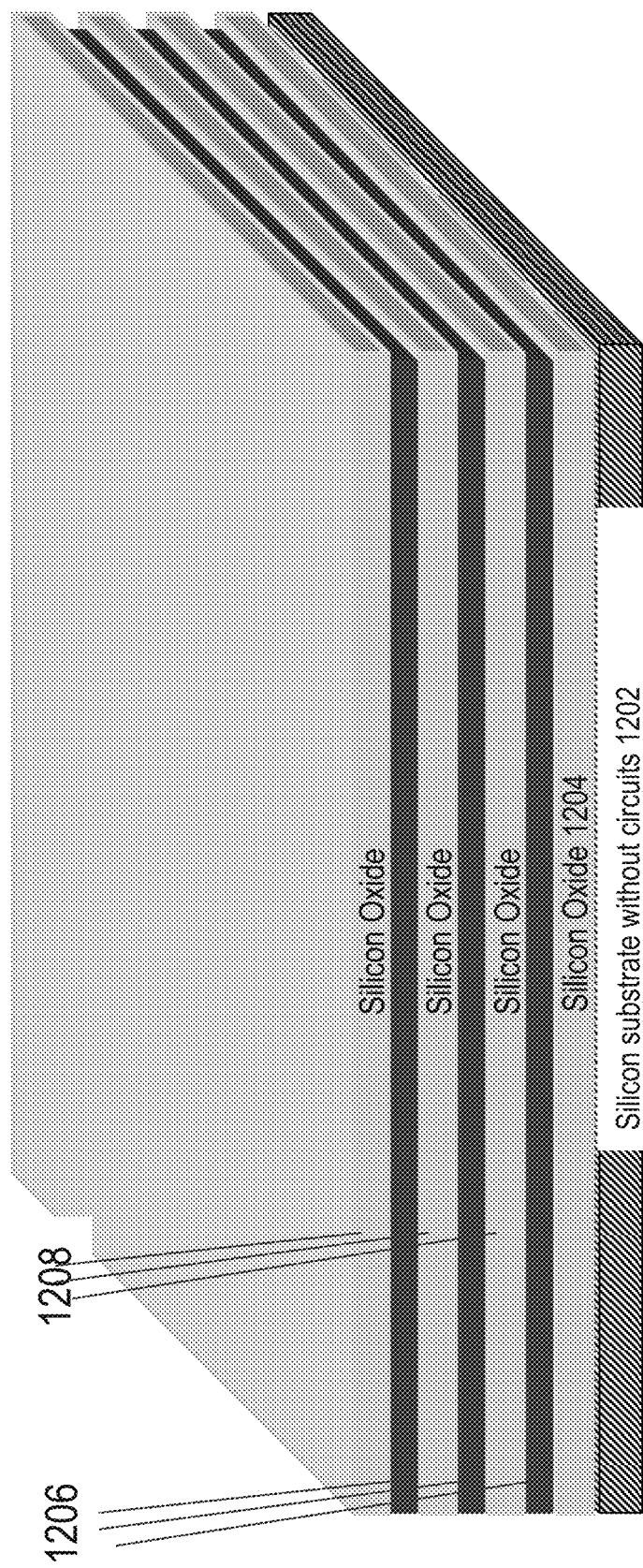

Step (B): As illustrated in FIG. 12B, multiple layers of n+ doped amorphous silicon or polysilicon 1206 are deposited with layers of silicon dioxide 1208 in between. The amorphous silicon or polysilicon layers 1206 could be deposited using a chemical vapor deposition process, such as LPCVD or PECVD.

Figure 12C:
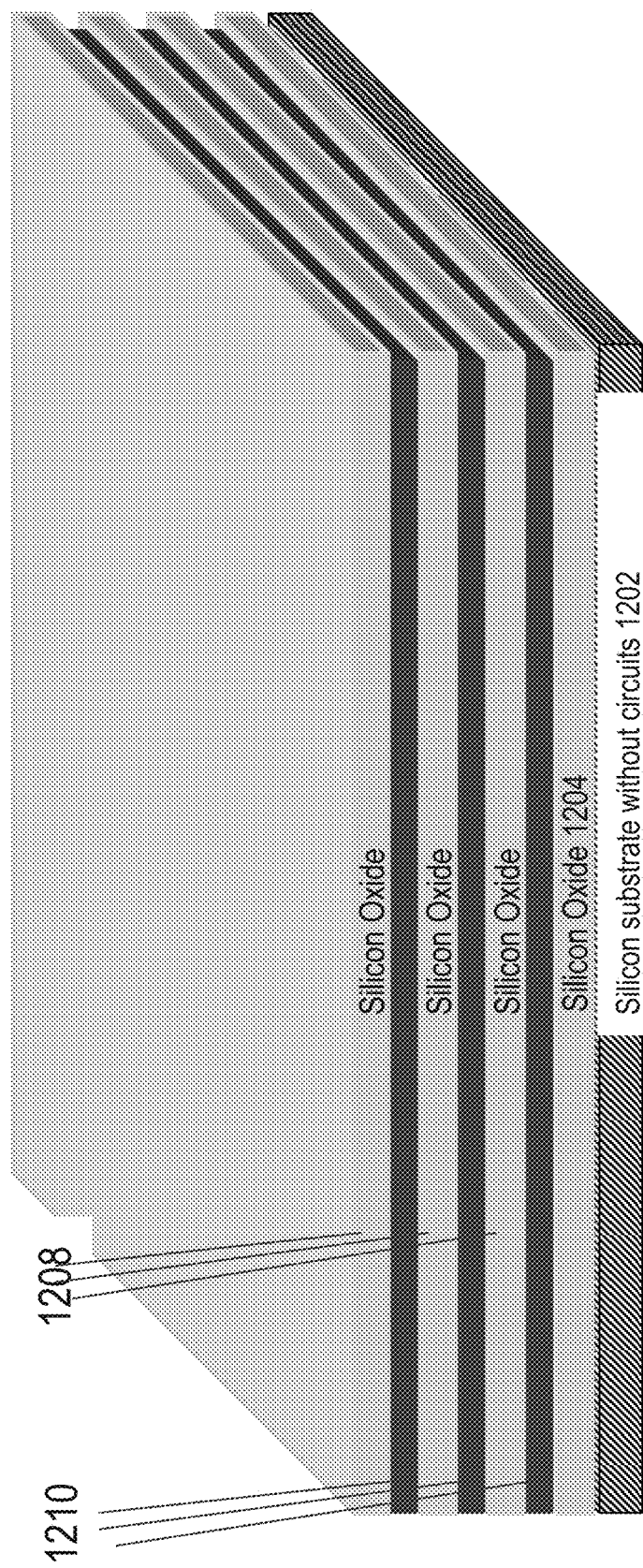

Step (C): As illustrated in FIG. 12C, a Rapid Thermal Anneal (RTA) or standard anneal is conducted to crystallize the layers of polysilicon or amorphous silicon deposited in Step (B). Temperatures during this RTA could be as high as 700° C. or more, and could even be as high as 1400° C. The polysilicon region obtained after Step (C) is indicated as 1210. Since there are no circuits under these layers of polysilicon, very high temperatures (such as, for example, 1400° C.) can be used for the anneal process, leading to very good quality polysilicon with few grain boundaries and very high mobilities approaching those of single crystal silicon. Alternatively, a laser anneal could be conducted, either for all amorphous silicon or polysilicon layers 1206 at the same time or layer by layer at different times.

Figure 12D:
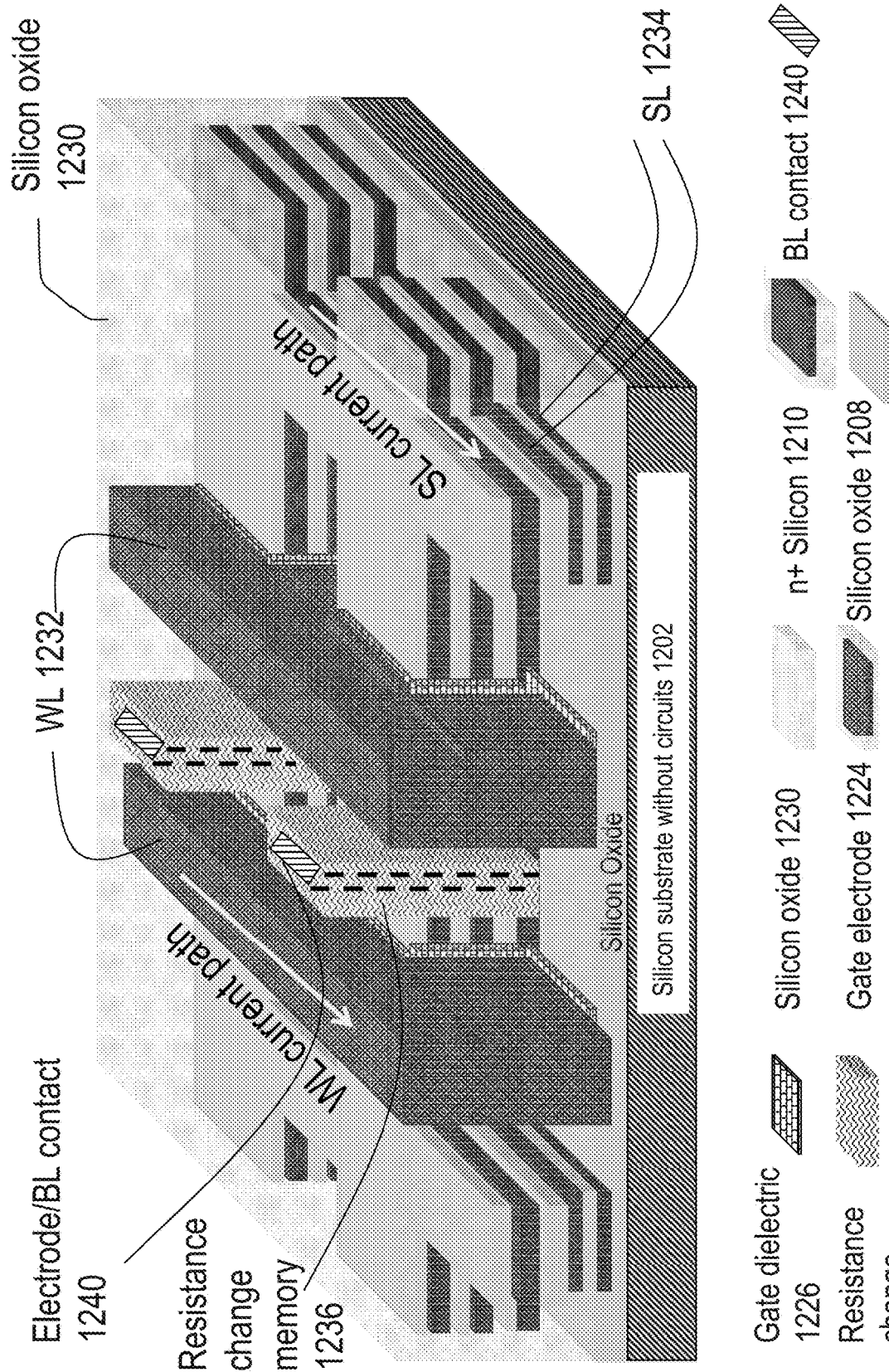

Step (D): This is illustrated in FIG. 12D. Procedures similar to those described in FIG. 32E-H are utilized to get the structure shown in FIG. 12D that has multiple levels of junction-less transistor selectors for resistive memory devices. The resistance change memory is indicated as 1236 while its electrode and contact to the BL is indicated as 1240. The WL is indicated as 1232, while the SL is indicated as 1234. Gate dielectric of the junction-less transistor is indicated as 1226 while the gate electrode of the junction-less transistor is indicated as 1224, this gate electrode also serves as part of the WL 1232.

Figure 12E:
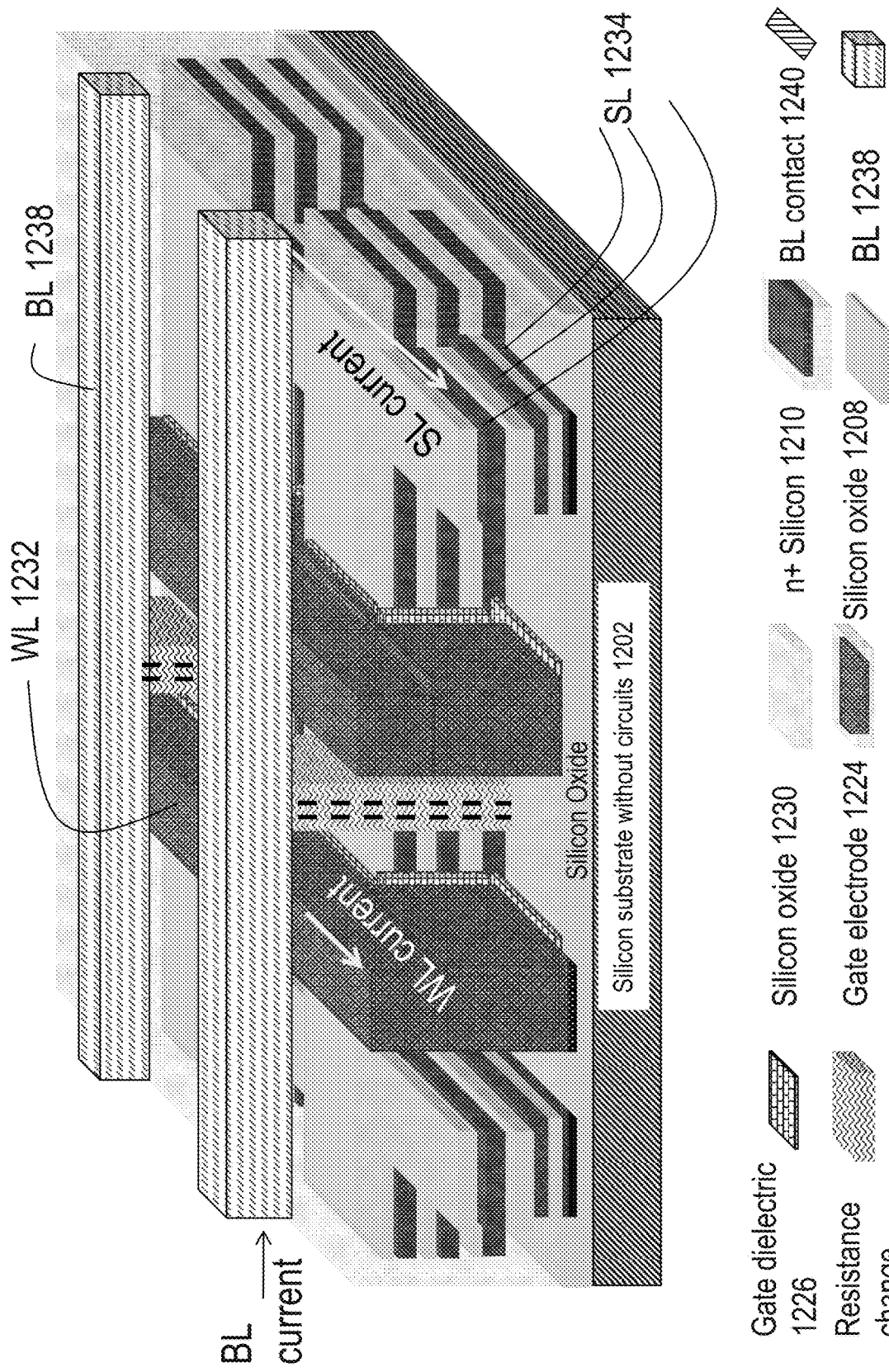
Figure 12F:
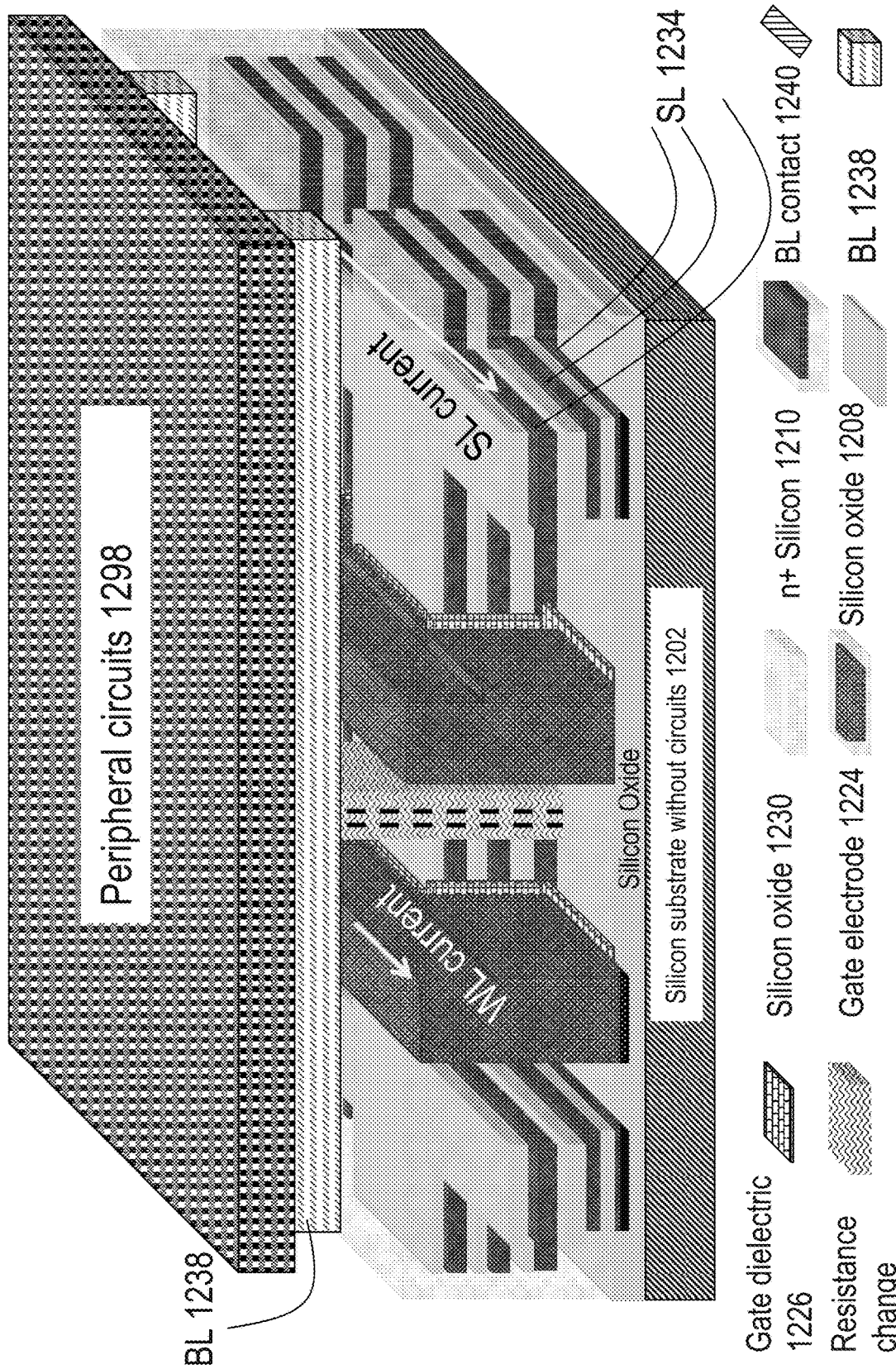

Step (E): This is illustrated in FIG. 12E. Bit lines (indicated as BL 1238) are constructed. Contacts are then made to peripheral circuits and various parts of the memory array as described in embodiments described previously.

Step (F): Using procedures described in Section 1 and Section 2 of this patent application, peripheral circuits 1298 (with transistors and wires) could be formed well aligned to the multiple memory layers shown in Step (E). For the periphery, one could use the process flow shown in Section 2 where replacement gate processing is used, or one could use sub-400° C. processed transistors such as junction-less transistors or recessed channel transistors. Alternatively, one could use laser anneals for peripheral transistors' source-drain processing. Various other procedures described in Section 1 and Section 2 could also be used. Connections can then be formed between the multiple memory layers and peripheral circuits. By proper choice of materials for memory layer transistors and memory layer wires (e.g., by using tungsten and other materials that withstand high temperature processing for wiring), even standard transistors processed at high temperatures (>1000° C.) for the periphery could be used.

Some embodiments of the invention may include alternative techniques to build IC (Integrated Circuit) devices including techniques and methods to construct 3D IC systems. Some embodiments of the invention may enable device solutions with far less power consumption than prior art. The device solutions could be very useful for the growing application of mobile electronic devices and mobile systems such as, for example, mobile phones, smart phone, and cameras, those mobile systems may also connect to the internet. For example, incorporating the 3D IC semiconductor devices according to some embodiments of the invention within the mobile electronic devices and mobile systems could provide superior mobile units that could operate much more efficiently and for a much longer time than with prior art technology.

Smart mobile systems may be greatly enhanced by complex electronics at a limited power budget. The 3D technology described in the multiple embodiments of the invention would allow the construction of low power high complexity mobile electronic systems. For example, it would be possible to integrate into a small form function a complex logic circuit with high density high speed memory utilizing some of the 3D DRAM embodiments of the invention and add some non-volatile 3D NAND charge trap or RRAM described in some embodiments of the invention. Mobile system applications of the 3DIC technology described herein may be found at least in FIG. 156 of U.S. Pat. No. 8,273,610, the contents of which are incorporated by reference.

In this document, the connection made between layers of, generally single crystal, transistors, which may be variously named for example as thermal contacts and vias, Thru Layer Via (TLV), TSV (Thru Silicon Via), may be made and include electrically and thermally conducting material or may be made and include an electrically non-conducting but thermally conducting material or materials. A device or method may include formation of both of these types of connections, or just one type. By varying the size, number, composition, placement, shape, or depth of these connection structures, the coefficient of thermal expansion exhibited by a layer or layers may be tailored to a desired value. For example, the coefficient of thermal expansion of the second layer of transistors may be tailored to substantially match the coefficient of thermal expansion of the first layer, or base layer of transistors, which may include its (first layer) interconnect layers.

Base wafers or substrates, or acceptor wafers or substrates, or target wafers substrates herein may be substantially comprised of a crystalline material, for example, mono-crystalline silicon or germanium, or may be an engineered substrate/wafer such as, for example, an SOI (Silicon on Insulator) wafer or GeOI (Germanium on Insulator) substrate.

It will also be appreciated by persons of ordinary skill in the art that the invention is not limited to what has been particularly shown and described hereinabove. For example, drawings or illustrations may not show n or p wells for clarity in illustration. Moreover, transistor channels illustrated or discussed herein may include doped semiconductors, but may instead include undoped semiconductor material. Further, any transferred layer or donor substrate or wafer preparation illustrated or discussed herein may include one or more undoped regions or layers of semiconductor material. Rather, the scope of the invention includes both combinations and sub-combinations of the various features described hereinabove as well as modifications and variations which would occur to such skilled persons upon reading the foregoing description. Thus the invention is to be limited only by the appended claims

We claim:

1. A 3D semiconductor device, the device comprising:
a first single crystal layer;
at least one first metal layer above said first single crystal layer;
a second metal layer above said first metal layer;
a plurality of first transistors atop said second metal layer;
a plurality of second transistors atop said second transistors;
a plurality of third transistors atop said second transistors;
a third metal layer above said plurality of third transistors;
a fourth metal layer above said third metal layer; and
a second single crystal layer above said fourth metal layer; and
a plurality of connecting metal paths from said fourth metal layer to said second metal layer,
wherein at least one of said plurality of third transistors is aligned to at least one of said plurality of first transistors with less than 40 nm alignment error,
wherein said fourth metal layer is providing global power distribution to said device and said fourth metal layer is at least twice as thick as said third metal layer,
wherein said second metal layer provides local power distribution to said device and said second metal layer is substantially thicker than said first metal layer and said third metal layer,
wherein at least one of said connecting metal paths comprises a through layer via,
wherein said through layer via comprises a material and a majority of said material comprises tungsten,
wherein at least one of said plurality of second transistors comprises a first source, a first channel and a first drain,
wherein said first source, said first channel and said first drain have the same dopant type,
wherein said device comprises an array of memory cells, and
wherein at least one of said memory cells comprises one of said third transistors.

2. The 3D semiconductor device according to claim 1, wherein at least one of said plurality of second transistors is self-aligned to at least one of said plurality of third transistors, being processed following the same lithography step.

3. The 3D semiconductor device according to claim 1, wherein at least one of said plurality of second transistors comprises polysilicon.

4. The 3D semiconductor device according to claim 1, wherein said second single crystal layer comprises a plurality of fourth transistors, and wherein said device comprises memory periphery circuits comprising said fourth transistors.

5. The 3D semiconductor device according to claim 1, wherein said second single crystal layer comprises a plurality of fourth transistors, and
wherein said device comprises Input/Output circuits comprising said fourth transistors.

6. The 3D semiconductor device according to claim 1, wherein at least one of said plurality of second transistors comprises a gate all around structure, and
wherein formation of said gate all around structure comprises Atomic Layer Deposition (ALD).

7. The 3D semiconductor device according to claim 1, wherein said second single crystal layer comprises a plurality of through layer vias.

8. A 3D semiconductor device, the device comprising:
a first single crystal layer comprising a plurality of first transistors;
at least one first metal layer interconnecting said plurality of first transistors,
wherein said interconnecting comprises forming a plurality of logic gates;
a second metal layer above said first metal layer;
a plurality of second transistors atop said second metal layer;
a third metal layer above said plurality of second transistors;
a plurality of third transistors atop said second transistors;
a fourth metal layer above said third metal layer; and
a plurality of connecting metal paths from said fourth metal layer to said second metal layer,
wherein at least one of said plurality of third transistors is aligned to at least one of said plurality of first transistors with less than 40 nm alignment error,
wherein said fourth metal layer is providing global power distribution to said device and said fourth metal layer is at least twice as thick as said third metal layer,
wherein said second metal layer provides local power distribution to said device and is substantially thicker than said first metal layer and said third metal layer,
wherein at least one of said connecting metal paths comprises a through layer via,
wherein said through layer via comprises a material and a majority of said material comprises tungsten,
wherein at least one of said second transistors comprises a first source, a first channel and a first drain,
wherein said first source, said first channel and said first drain have the same dopant type,
wherein said device comprises an array of memory cells, and
wherein at least one of said memory cells comprises one of said third transistors.

9. The 3D semiconductor device according to claim 8, wherein said array of memory cells comprises NAND type memory.

10. The 3D semiconductor device according to claim 8, wherein at least one of said plurality of second transistors is self-aligned to at least one of said plurality of third transistors, being processed following the same lithography step.

11. The 3D semiconductor device according to claim 8, wherein at least one of said plurality of second transistors comprises polysilicon.

12. The 3D semiconductor device according to claim 8, wherein fabrication processing of said device comprises first processing said first transistors followed by processing said second transistors and said third transistors above said first transistors, and
wherein said processing said first transistors accounts for the temperature associated with said processing said second transistors and said processing said third transistors by adjusting a process thermal budget of said first transistors accordingly.

13. The 3D semiconductor device according to claim 8, wherein said plurality of logic gates comprise memory periphery circuits, and said memory periphery circuits comprise control of said array of memory cells.

14. The 3D semiconductor device according to claim 8, further comprising:
a second single crystal layer above said fourth metal layer.

15. A 3D semiconductor device, the device comprising:
a first single crystal layer comprising a plurality of first transistors;
at least one first metal layer interconnecting said plurality of first transistors,
wherein said interconnecting comprises forming a plurality of logic gates;
a second metal layer above said first metal layer;
a plurality of second transistors atop said second metal layer;
a third metal layer above said plurality of second transistors;
a plurality of third transistors atop said second transistors;
a fourth metal layer above said third metal layer; and
a plurality of connecting metal paths from said fourth metal layer to said second metal layer,
wherein at least one of said plurality of third transistors is aligned to at least one of said plurality of first transistors with less than 40 nm alignment error,
wherein said fourth metal layer is providing global power distribution to said device and said fourth metal layer is at least twice as thick as said third metal layer,
wherein said second metal layer provides local power distribution to said device and is substantially thicker than said first metal layer and said third metal layer,
wherein at least one of said connecting metal paths comprises a through layer via, and
wherein said through layer via comprises a material and a majority of said material comprises tungsten.

16. The 3D semiconductor device according to claim 15 wherein at least one of said plurality of third transistors comprises polysilicon.

17. The 3D semiconductor device according to claim 15, wherein at least one of said plurality of third transistors comprises a source, a channel and a drain, and
wherein said source, said channel and said drain have the same dopant type.

18. The 3D semiconductor device according to claim 15, wherein said device comprises more than one NAND type memory cell, and
wherein said NAND type memory cell comprises at least one of said plurality of second transistors.

19. The 3D semiconductor device according to claim 15, wherein at least one of said plurality of second transistors is self-aligned to at least one of said plurality of third transistors, being processed following the same lithography step.

20. The 3D semiconductor device according to claim 15, further comprising:
a connecting via through said first single crystal layer.

* * * * *